(12) United States Patent
Ziemba et al.

(10) Patent No.: US 11,631,573 B2
(45) Date of Patent: Apr. 18, 2023

(54) HIGH VOLTAGE RESISTIVE OUTPUT STAGE CIRCUIT

(71) Applicant: Eagle Harbor Technologies, Inc., Seattle, WA (US)

(72) Inventors: Timothy M. Ziemba, Bainbridge Island, WA (US); Kenneth E. Miller, Seattle, WA (US); James R. Prager, Seattle, WA (US); John G. Carscadden, Seattle, WA (US); Ilia Slobodov, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 357 days.

(21) Appl. No.: 17/098,207

(22) Filed: Nov. 13, 2020

(65) Prior Publication Data

US 2021/0066042 A1 Mar. 4, 2021

Related U.S. Application Data

(63) Continuation of application No. 16/599,318, filed on Oct. 11, 2019, now Pat. No. 10,847,346, which is a
(Continued)

(51) Int. Cl.
*H01J 37/32* (2006.01)
*H03K 3/57* (2006.01)
(Continued)

(52) U.S. Cl.
CPC .. *H01J 37/32174* (2013.01); *H01J 37/32091* (2013.01); *H01J 37/32146* (2013.01);
(Continued)

(58) Field of Classification Search
None
See application file for complete search history.

(56) References Cited

U.S. PATENT DOCUMENTS

| 4,070,589 A | 1/1978 | Martinkovic |
| 4,438,331 A | 3/1984 | Davis |

(Continued)

FOREIGN PATENT DOCUMENTS

| CA | 2292526 A1 | 12/1999 |
| CN | 101534071 A | 9/2009 |

(Continued)

OTHER PUBLICATIONS

Non-Final Office Action in U.S. Appl. No. 17/163,331 dated Mar. 4, 2022, 23 pages.
(Continued)

*Primary Examiner* — Srinivas Sathiraju

(57) ABSTRACT

Some embodiments include a high voltage, high frequency switching circuit. The switching circuit may include a high voltage switching power supply that produces pulses having a voltage greater than 1 kV and with frequencies greater than 10 kHz and an output. The switching circuit may also include a resistive output stage electrically coupled in parallel with the output and between the output stage and the high voltage switching power supply, the resistive output stage comprising at least one resistor that discharges a load coupled with the output. In some embodiments, the resistive output stage may be configured to discharge over about 1 kilowatt of average power during each pulse cycle. In some embodiments, the output can produce a high voltage pulse having a voltage greater than 1 kV and with frequencies greater than 10 kHz with a pulse fall time less than about 400 ns.

26 Claims, 28 Drawing Sheets

Related U.S. Application Data continuation of application No. 16/250,765, filed on Jan. 17, 2019, now Pat. No. 10,483,089, which is a continuation-in-part of application No. 16/178,538, filed on Nov. 1, 2018, now Pat. No. 10,460,911, which is a continuation of application No. 15/941,731, filed on Mar. 30, 2018, now Pat. No. 10,460,910, said application No. 16/250,765 is a continuation-in-part of application No. 15/623,464, filed on Jun. 15, 2017, now Pat. No. 10,224,822, which is a continuation of application No. 14/635,991, filed on Mar. 2, 2015, now Pat. No. 9,706,630.

(60) Provisional application No. 62/480,115, filed on Mar. 31, 2017, provisional application No. 61/946,457, filed on Feb. 28, 2014.

(51) Int. Cl.
*H03K 3/021* (2006.01)
*H03K 3/53* (2006.01)

(52) U.S. Cl.
CPC ........ *H01J 37/32348* (2013.01); *H03K 3/021* (2013.01); *H03K 3/53* (2013.01); *H03K 3/57* (2013.01); *H01J 2237/2485* (2013.01)

(56) References Cited

U.S. PATENT DOCUMENTS

| | | |
|---|---|---|
| 4,504,895 A | 3/1985 | Steigerwald |
| 4,885,074 A | 12/1989 | Susko et al. |
| 4,924,191 A | 5/1990 | Erb et al. |
| 4,992,919 A | 2/1991 | Lee et al. |
| 5,072,191 A | 12/1991 | Nakajima et al. |
| 5,118,969 A | 6/1992 | Ikezi et al. |
| 5,140,510 A | 8/1992 | Myers |
| 5,313,481 A | 5/1994 | Cook et al. |
| 5,321,597 A | 6/1994 | Alacoque |
| 5,325,021 A | 6/1994 | Duckworth et al. |
| 5,392,043 A | 2/1995 | Ribner |
| 5,418,707 A | 5/1995 | Shimer et al. |
| 5,451,846 A | 9/1995 | Peterson et al. |
| 5,488,552 A | 1/1996 | Sakamoto et al. |
| 5,610,452 A | 3/1997 | Shimer et al. |
| 5,623,171 A | 4/1997 | Nakajima |
| 5,656,123 A | 8/1997 | Salimian et al. |
| 5,729,562 A | 3/1998 | Birx et al. |
| 5,796,598 A | 8/1998 | Nowak et al. |
| 5,808,504 A | 9/1998 | Chikai et al. |
| 5,905,646 A | 5/1999 | Crewson et al. |
| 5,930,125 A | 7/1999 | Hitchcock et al. |
| 5,933,335 A | 8/1999 | Hitchcock et al. |
| 5,968,377 A * | 10/1999 | Yuasa .............. H01J 37/32027 204/192.12 |
| 6,059,935 A | 5/2000 | Spence |
| 6,066,901 A | 5/2000 | Burkhart et al. |
| 6,087,871 A | 7/2000 | Kardo-Syssoev et al. |
| 6,205,074 B1 | 3/2001 | Van Buskirk et al. |
| 6,233,161 B1 | 5/2001 | Balakrishnan et al. |
| 6,238,387 B1 | 5/2001 | Miller, III |
| 6,253,704 B1 | 7/2001 | Savas |
| 6,359,542 B1 | 3/2002 | Widmayer et al. |
| 6,362,604 B1 | 3/2002 | Cravey |
| 6,392,187 B1 | 5/2002 | Johnson |
| 6,416,638 B1 | 7/2002 | Kuriyama et al. |
| 6,480,399 B2 | 11/2002 | Balakrishnan et al. |
| 6,483,731 B1 | 11/2002 | Isurin et al. |
| 6,496,047 B1 | 12/2002 | Iskander et al. |
| 6,577,135 B1 | 6/2003 | Matthews et al. |
| 6,741,120 B1 | 5/2004 | Tan |
| 6,741,484 B2 | 5/2004 | Crewson et al. |
| 6,831,377 B2 | 12/2004 | Yampolsky et al. |
| 6,897,574 B2 | 5/2005 | Vaysse |
| 6,947,300 B2 * | 9/2005 | Pai .................... H02M 7/493 363/71 |
| 7,061,230 B2 | 6/2006 | Kleine et al. |
| 7,180,082 B1 | 2/2007 | Hassanein et al. |
| 7,256,637 B2 | 8/2007 | Iskander et al. |
| 7,291,545 B2 | 11/2007 | Collins et al. |
| 7,307,375 B2 | 12/2007 | Smith et al. |
| 7,319,579 B2 | 1/2008 | Inoue et al. |
| 7,354,501 B2 | 4/2008 | Gondhalekar et al. |
| 7,396,746 B2 | 7/2008 | Walther et al. |
| 7,492,138 B2 | 2/2009 | Zhang et al. |
| 7,512,433 B2 | 3/2009 | Bernhart et al. |
| 7,521,370 B2 | 4/2009 | Hoffman |
| 7,601,619 B2 | 10/2009 | Okumura et al. |
| 7,605,385 B2 | 10/2009 | Bauer |
| 7,767,433 B2 | 8/2010 | Kuthi et al. |
| 7,901,930 B2 | 3/2011 | Kuthi et al. |
| 7,936,544 B2 | 5/2011 | Beland |
| 7,948,185 B2 | 5/2011 | Smith et al. |
| 7,989,987 B2 | 8/2011 | McDonald |
| 8,093,979 B2 | 1/2012 | Wilson |
| 8,115,343 B2 | 2/2012 | Sanders et al. |
| 8,129,653 B2 * | 3/2012 | Kirchmeier ............ G01R 21/06 219/121.36 |
| 8,143,790 B2 | 3/2012 | Smith et al. |
| 8,222,936 B2 | 7/2012 | Friedman et al. |
| 8,259,476 B2 | 9/2012 | Ben-Yaakov et al. |
| 8,410,889 B2 | 4/2013 | Garrity et al. |
| 8,436,602 B2 | 5/2013 | Sykes |
| 8,450,985 B2 | 5/2013 | Gray et al. |
| 8,575,843 B2 | 11/2013 | Moore et al. |
| 8,723,591 B2 | 5/2014 | Lee et al. |
| 8,773,184 B1 | 7/2014 | Petrov et al. |
| 8,828,254 B2 * | 9/2014 | Inoue .................. H01L 21/3065 438/692 |
| 8,847,433 B2 | 9/2014 | Vandermey |
| 8,963,377 B2 | 2/2015 | Ziemba et al. |
| 9,067,788 B1 | 6/2015 | Spielman et al. |
| 9,070,396 B1 | 6/2015 | Katchmart et al. |
| 9,084,334 B1 | 7/2015 | Gefter et al. |
| 9,122,350 B2 | 9/2015 | Kao et al. |
| 9,287,086 B2 | 3/2016 | Brouk et al. |
| 9,287,092 B2 | 3/2016 | Brouk et al. |
| 9,306,533 B1 * | 4/2016 | Mavretic .......... H01J 37/32183 |
| 9,329,256 B2 | 5/2016 | Dolce |
| 9,349,603 B2 * | 5/2016 | Inoue .................... H01L 22/26 |
| 9,417,739 B2 | 8/2016 | Cordeiro et al. |
| 9,435,029 B2 | 9/2016 | Brouk et al. |
| 9,493,765 B2 | 11/2016 | Krishnaswamy et al. |
| 9,601,283 B2 | 3/2017 | Ziemba et al. |
| 9,706,630 B2 * | 7/2017 | Miller ................ H02M 3/33523 |
| 9,767,988 B2 | 9/2017 | Brouk et al. |
| 9,960,763 B2 | 5/2018 | Miller et al. |
| 10,009,024 B2 | 6/2018 | Gan et al. |
| 10,020,800 B2 | 7/2018 | Prager et al. |
| 10,027,314 B2 * | 7/2018 | Prager ...................... H03K 5/12 |
| 10,044,278 B2 | 8/2018 | Kondo et al. |
| 10,224,822 B2 * | 3/2019 | Miller ................ H02M 3/33523 |
| 10,301,587 B2 | 5/2019 | Krishnaswamy et al. |
| 10,304,661 B2 | 5/2019 | Ziemba et al. |
| 10,373,755 B2 | 8/2019 | Prager et al. |
| 10,373,804 B2 | 8/2019 | Koh et al. |
| 10,382,022 B2 | 8/2019 | Prager et al. |
| 10,448,494 B1 * | 10/2019 | Dorf ........................ C23C 14/54 |
| 10,448,495 B1 * | 10/2019 | Dorf .................. H01J 37/32174 |
| 10,460,910 B2 | 10/2019 | Ziemba et al. |
| 10,460,911 B2 * | 10/2019 | Ziemba ................ H01J 37/3467 |
| 10,483,089 B2 * | 11/2019 | Ziemba .............. H01J 37/32146 |
| 10,555,412 B2 * | 2/2020 | Dorf ...................... H01J 37/08 |
| 10,600,619 B2 * | 3/2020 | Inoue .................... H01L 22/26 |
| 10,607,814 B2 | 3/2020 | Ziemba et al. |
| 10,659,019 B2 | 5/2020 | Slobodov et al. |
| 10,707,864 B2 | 7/2020 | Miller et al. |
| 10,734,906 B2 | 8/2020 | Miller et al. |
| 10,777,388 B2 | 9/2020 | Ziemba et al. |
| 10,791,617 B2 * | 9/2020 | Dorf ...................... C23C 16/505 |
| 10,796,887 B2 | 10/2020 | Prager et al. |
| 10,811,230 B2 | 10/2020 | Ziemba et al. |
| 10,892,140 B2 | 1/2021 | Ziemba et al. |

(56) References Cited

U.S. PATENT DOCUMENTS

| | | |
|---|---|---|
| 10,892,141 B2 | 1/2021 | Ziemba et al. |
| 10,978,955 B2 | 4/2021 | Ziemba et al. |
| 11,004,660 B2 | 5/2021 | Prager et al. |
| 11,171,568 B2 | 11/2021 | Miller et al. |
| 11,284,500 B2* | 3/2022 | Dorf ............... H01J 37/32174 |
| 2001/0008552 A1 | 7/2001 | Harada et al. |
| 2002/0016617 A1 | 2/2002 | Oldham |
| 2002/0140464 A1 | 10/2002 | Yampolsky et al. |
| 2002/0180276 A1 | 12/2002 | Sakuma et al. |
| 2002/0186577 A1 | 12/2002 | Kirbie |
| 2003/0021125 A1 | 1/2003 | Rufer et al. |
| 2003/0071035 A1 | 4/2003 | Brailove |
| 2003/0137791 A1 | 7/2003 | Arnet et al. |
| 2003/0169107 A1 | 9/2003 | LeChevalier |
| 2003/0227280 A1 | 12/2003 | Vinciarelli |
| 2004/0085784 A1 | 5/2004 | Salama et al. |
| 2004/0149217 A1 | 8/2004 | Collins et al. |
| 2005/0152159 A1* | 7/2005 | Isurin ............... H02M 3/33576 363/17 |
| 2005/0270096 A1 | 12/2005 | Coleman |
| 2006/0187607 A1 | 8/2006 | Mo |
| 2006/0192774 A1 | 8/2006 | Yasumura |
| 2006/0210020 A1 | 9/2006 | Takahashi et al. |
| 2006/0274887 A1 | 12/2006 | Sakamoto et al. |
| 2007/0018504 A1 | 1/2007 | Wiener et al. |
| 2007/0114981 A1 | 5/2007 | Vasquez et al. |
| 2007/0115705 A1 | 5/2007 | Gotzenberger et al. |
| 2007/0212811 A1 | 9/2007 | Hanawa et al. |
| 2008/0062733 A1 | 3/2008 | Gay |
| 2008/0106151 A1 | 5/2008 | Ryoo et al. |
| 2008/0143260 A1 | 6/2008 | Tuymer et al. |
| 2008/0198634 A1 | 8/2008 | Scheel et al. |
| 2008/0231337 A1 | 9/2008 | Krishnaswamy et al. |
| 2008/0252225 A1 | 10/2008 | Kurachi et al. |
| 2008/0272706 A1 | 11/2008 | Kwon et al. |
| 2009/0016549 A1 | 1/2009 | French et al. |
| 2009/0108759 A1 | 4/2009 | Tao et al. |
| 2009/0322307 A1 | 12/2009 | Ide |
| 2010/0007358 A1 | 1/2010 | Schaerrer et al. |
| 2010/0148847 A1 | 6/2010 | Schurack et al. |
| 2010/0284208 A1 | 11/2010 | Nguyen et al. |
| 2011/0001438 A1 | 1/2011 | Chemel et al. |
| 2011/0140607 A1 | 6/2011 | Moore et al. |
| 2012/0016282 A1 | 1/2012 | Van Brunt et al. |
| 2012/0052599 A1 | 3/2012 | Brouk et al. |
| 2012/0081350 A1 | 4/2012 | Sano et al. |
| 2012/0155613 A1 | 6/2012 | Caiafa et al. |
| 2013/0027848 A1 | 1/2013 | Said |
| 2013/0029492 A1* | 1/2013 | Inoue ............... H01J 37/3266 438/719 |
| 2013/0075390 A1 | 3/2013 | Ashida |
| 2013/0113650 A1 | 5/2013 | Behbahani et al. |
| 2013/0146443 A1 | 6/2013 | Papa et al. |
| 2013/0174105 A1 | 7/2013 | Nishio et al. |
| 2013/0175575 A1* | 7/2013 | Ziemba ............... H01L 29/7393 257/140 |
| 2013/0320953 A1 | 12/2013 | Cassel et al. |
| 2014/0009969 A1 | 1/2014 | Yuzurihara et al. |
| 2014/0021180 A1 | 1/2014 | Vogel |
| 2014/0077611 A1 | 3/2014 | Young et al. |
| 2014/0109886 A1 | 4/2014 | Singleton et al. |
| 2014/0118414 A1 | 5/2014 | Seo et al. |
| 2014/0146571 A1 | 5/2014 | Ryoo et al. |
| 2014/0268968 A1 | 9/2014 | Richardson |
| 2014/0349418 A1* | 11/2014 | Inoue ............... H01L 21/67069 438/5 |
| 2014/0354343 A1 | 12/2014 | Ziemba et al. |
| 2015/0028932 A1 | 1/2015 | Ziemba et al. |
| 2015/0076372 A1 | 3/2015 | Ziemba et al. |
| 2015/0084509 A1* | 3/2015 | Yuzurihara ............... H02M 1/08 315/111.21 |
| 2015/0130525 A1 | 5/2015 | Miller et al. |
| 2015/0155086 A1 | 6/2015 | Matsuura |
| 2015/0256086 A1* | 9/2015 | Miller ............... H02M 3/33523 363/21.01 |
| 2015/0303914 A1 | 10/2015 | Ziemba et al. |
| 2015/0311680 A1 | 10/2015 | Burrows et al. |
| 2015/0318846 A1* | 11/2015 | Prager ............... H03K 3/57 327/304 |
| 2016/0020072 A1* | 1/2016 | Brouk ............... H01J 37/32174 156/345.28 |
| 2016/0220670 A1 | 8/2016 | Kalghatgi et al. |
| 2016/0225587 A1* | 8/2016 | Inoue ............... H01L 21/32137 |
| 2016/0241234 A1* | 8/2016 | Mavretic ............... H03H 7/40 |
| 2016/0269195 A1 | 9/2016 | Coenen et al. |
| 2016/0327029 A1* | 11/2016 | Ziemba ............... F03H 1/0087 |
| 2016/0327089 A1 | 11/2016 | Adam et al. |
| 2017/0083810 A1 | 3/2017 | Ielmini et al. |
| 2017/0126049 A1 | 5/2017 | Pan et al. |
| 2017/0154726 A1 | 6/2017 | Prager et al. |
| 2017/0243731 A1* | 8/2017 | Ziemba ............... H01J 65/048 |
| 2017/0294842 A1* | 10/2017 | Miller ............... H02M 1/08 |
| 2017/0311431 A1* | 10/2017 | Park ............... H01J 37/3211 |
| 2017/0359886 A1 | 12/2017 | Binderbauer et al. |
| 2018/0226896 A1 | 8/2018 | Miller et al. |
| 2018/0286636 A1* | 10/2018 | Ziemba ............... H01J 37/32146 |
| 2018/0315581 A1 | 11/2018 | Hayami et al. |
| 2018/0315583 A1 | 11/2018 | Luere et al. |
| 2018/0374689 A1 | 12/2018 | Abraham et al. |
| 2019/0080884 A1* | 3/2019 | Ziemba ............... H01J 37/3467 |
| 2019/0088518 A1 | 3/2019 | Koh et al. |
| 2019/0131110 A1* | 5/2019 | Ziemba ............... H03K 7/08 |
| 2019/0157044 A1 | 5/2019 | Ziemba et al. |
| 2019/0172685 A1 | 6/2019 | Van Zyl et al. |
| 2019/0180982 A1 | 6/2019 | Brouk et al. |
| 2019/0228952 A1 | 7/2019 | Dorf et al. |
| 2019/0326092 A1 | 10/2019 | Ogasawara et al. |
| 2019/0348258 A1 | 11/2019 | Koh et al. |
| 2019/0350072 A1* | 11/2019 | Dorf ............... H01J 37/3467 |
| 2019/0393791 A1 | 12/2019 | Ziemba et al. |
| 2020/0035458 A1 | 1/2020 | Ziemba et al. |
| 2020/0043702 A1* | 2/2020 | Ziemba ............... H01J 37/32348 |
| 2020/0051786 A1 | 2/2020 | Ziemba et al. |
| 2020/0154556 A1* | 5/2020 | Dorf ............... H01J 37/08 |
| 2020/0161092 A1* | 5/2020 | Inoue ............... H01J 37/3266 |
| 2020/0168436 A1* | 5/2020 | Ziemba ............... H01J 37/32146 |
| 2020/0352017 A1* | 11/2020 | Dorf ............... C23C 14/54 |
| 2020/0378605 A1 | 12/2020 | Lacoste |
| 2020/0396820 A1 | 12/2020 | de Vries et al. |
| 2021/0152163 A1 | 5/2021 | Miller et al. |

FOREIGN PATENT DOCUMENTS

| | | |
|---|---|---|
| CN | 103458600 B | 7/2016 |
| CN | 106537776 A | 3/2017 |
| EP | 174164 A2 | 3/1986 |
| EP | 0947048 A1 | 10/1999 |
| EP | 1128557 A2 | 8/2001 |
| EP | 1515430 A1 | 3/2005 |
| JP | H09129621 A | 5/1997 |
| WO | 0193419 A1 | 12/2001 |
| WO | 2010069317 A1 | 6/2010 |
| WO | 2014036000 A1 | 3/2014 |
| WO | 2016171582 A1 | 10/2016 |
| WO | 2018186901 A1 | 10/2018 |

OTHER PUBLICATIONS

Non-Final Office Action dated Sep. 1, 2021 in U.S. Appl. No. 17/033,662, 17 pages.

Bland, M.J., et al., "A High Power RF Power Supply for High Energy Physics Applications," Proceedings of 2005 the Particle Accelerator Conference, IEEE pp. 4018-4020 (May 16-20, 2005).

Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).

Garwin, R., "Pulsed Power Peer Review Committee Report," Sandia National Laboratories Report, SAND2000-2515, pp. 3-38 (Oct. 2000).

(56) References Cited

OTHER PUBLICATIONS

Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).
Goodman, E. A., "Characteristics of sheet windings in transformers", IEEE Engineering, vol. 82, No. 11, pp. 673-676 (Nov. 1963) (Abstract).
In, Y., et al., "On the roles of direct feedback and error field correction in stabilizing resistive-wall modes," Nuclear 2 Fusion, vol. 50, No. 4, pp. 1-5 (2010).
Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).
Locher, R., "Introduction to Power MOSFETs and their Applications (Application Note 558)," Fairchild Semiconductor, 15 pages (Oct. 1998).
Locher, R.E., and Pathak, A.D., "Use of BiMOSFETs in Modern Radar Transmitters," IEEE International Conference on Power Electronics and Drive Systems, pp. 776-782 (2001).
Pokryvailo, A., et al., "A 1KW Pulsed Corona System for Pollution Control Applications," 14th IEEE International Pulsed Power Conference, Dallas, TX, USA (Jun. 15-18, 2003).
Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).
Quinley, M., et al., "High Voltage Nanosecond Pulser Operating at 30 kW and 400 kHz" APS-GEC-2018, 1 page (2018).
Rao, X., et al., "Combustion Dynamics of Plasma-Enhanced Premixed and Nonpremixed Flames," IEEE Transactions an Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modern Pulsed Power: Charlie Martin and Beyond," Proceedings of the IEEE, vol. 92, No. 7 , pp. 1014-1020 (Jul. 2004).
Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).
Starikovskiy, A. and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, pp. 045102-1-045102-4 (Apr. 2011).
International Search Report and Written Opinion as issued in connection with International Patent Application No. PCT/US2014/040929, dated Sep. 15, 2014, 10 pages.
International Search Report and Written Opinion as issued in connection with International Patent Application No. PCT/US2014/065832, dated Feb. 20, 2015, 13 pages.
International Search Report and Written Opinion as issued in connection with International Patent Application No. PCT/US2015/018349, dated Jul. 14, 2015, 15 pages.
International Search Report and Written Opinion as issued in connection with International Patent Application No. PCT/US2015/040204, dated Oct. 6, 2015, 12 pages.
U.S. Non-Final Office Action in U.S. Appl. No. 14/542,487 dated Nov. 23, 2015, 11 pages.
U.S. Non-Final Office Action in U.S. Appl. No. 14/798,154 dated Jan. 5, 2016, 13 pages.
U.S. Final Office Action in U.S. Appl. No. 14/542,487 dated Feb. 12, 2016, 11 pages.
U.S. Non-Final Office Action in U.S. Appl. No. 14/542,487 dated Apr. 8, 2016, 12 pages.
U.S. Non Final Office Action in U.S. Appl. No. 14/635,991, dated Jul. 29, 2016, 17 pages.
U.S. Final Office Action in U.S. Appl. No. 14/798,154 dated Oct. 6, 2016, 14 pages.
U.S. Final Office Action in U.S. Appl. No. 14/542,487 dated Dec. 12, 2016, 13 pages.
U.S. Final Office Action in U.S. Appl. No. 14/635,991, dated Jan. 23, 2017, 22 pages.
U.S. Notice of Allowance in U.S. Appl. No. 14/635,991, dated May 4, 2017, 07 pages.
U.S. Non-Final Office Action in U.S. Appl. No. 14/798,154 dated May 26, 2017, 16 pages.
U.S. Non-Final Office Action in U.S. Appl. No. 14/542,487 dated Jun. 5, 2017, 12 pages.
Partial Supplementary European Search Report dated Jul. 28, 2017 in related foreign application No. 14861818.4, 12 Pages.
U.S. Non Final Office Action in U.S. Appl. No. 15/623,464, dated Nov. 7, 2017, 18 pages.
U.S. Final Office Action in U.S. Appl. No. 14/542,487 dated Dec. 19, 2017, 07 pages.
U.S. Final Office Action in U.S. Appl. No. 14/798,154 dated Dec. 28, 2017, 06 pages.
U.S. Notice of Allowance in U.S. Appl. No. 14/542,487 dated Mar. 21, 2018, 05 pages.
U.S. Final Office Action in U.S. Appl. No. 15/623,464, dated Mar. 27, 2018, 18 pages.
International Search Report and Written Opinion as issued in connection with International Patent Application No. PCT/US2018/016993, dated Apr. 18, 2018, 11 pages.
U.S. Notice of Allowance in U.S. Appl. No. 14/798,154 dated Jun. 1, 2018, 05 pages.
International Search Report and Written Opinion as issued in connection with International Patent Application No. PCT/US2018/025440, dated Jun. 25, 2018, 25 pages.
U.S. Notice of Allowance in U.S. Appl. No. 15/623,464, dated Oct. 17, 2018, 7 pages.
U.S. Non Final Office Action in U.S. Appl. No. 15/941,731, dated Nov. 16, 2018, 17 pages.
U.S. Non-Final Office Action in U.S. Appl. No. 15/921,650 dated Nov. 28, 2018, 11 pages.
English translation of Office Action for Taiwan application No. 109100609 dated Dec. 16, 2021, 5 pages.
U.S. Non Final Office Action in U.S. Appl. No. 16/178,538, dated Jan. 11, 2019, 27 pages.
U.S. Non Final Office Action in U.S. Appl. No. 16/250,765, dated Mar. 29, 2019, 11 pages.
U.S. Notice of Allowance in U.S. Appl. No. 15/921,650 dated Apr. 4, 2019, 7 pages.
International Search Report and Written Opinion as issued in connection with International Patent Application No. PCT/US2019/043933, dated Oct. 25, 2019, 9 pages.
International Search Report and Written Opinion as issued in connection with International Patent Application No. PCT/US2019/043988, dated Dec. 10, 2019, 13 pages.
U.S. Non Final Office Action in U.S. Appl. No. 16/250,157 dated Dec. 19, 2019, 6 pages.

(56) References Cited

OTHER PUBLICATIONS

International Search Report and Written Opinion as issued in connection with International Patent Application No. PCT/US2020/016253, dated Apr. 29, 2020, 7 pages.
U.S. Notice of Allowance in U.S. Appl. No. 16/250,157 dated Apr. 13, 2020, 8 pages.
International Search Report and Written Opinion as issued in connection with International Patent Application No. PCT/US2020/012641, dated May 28, 2020, 15 pages.
U.S. Non Final Office Action in U.S. Appl. No. 16/537,513, dated Sep. 3, 2020, 13 pages.
U.S. Notice of Allowance in U.S. Appl. No. 16/555,948, dated Jan. 13, 2021, 7 pages.
U.S. Notice of Allowance in U.S. Appl. No. 16/457,791 dated Jan. 22, 2021, 7 pages.
International Search Report and written opinion received for PCT Patent Application No. PCT/US2020/60799, dated Feb. 5, 2021, 11 pages.
Extended European Search Report for Application No. 20195265.2 dated Mar. 17, 2021, 8 pages.
U.S. Notice of Allowance in U.S. Appl. No. 16/722,115, dated Apr. 1, 2021, 9 pages.
U.S. Notice of Allowance in U.S. Appl. No. 15/889,586 dated Apr. 14, 2021, 9 pages.
U.S. Non Final Office Action in U.S. Appl. No. 16/941,532, dated Apr. 14, 2021, 10 pages.
Extended European Search Report for Application No. 20200919.7 dated Apr. 30, 2021, 11 pages.
U.S. Non-Final Office Action in U.S. Appl. No. 16/722,115, dated May 3, 2021, 9 pages.
U.S. Non-Final Office Action in U.S. Appl. No. 15/889,586 dated Jun. 11, 2021, 11 pages.
Non-Final Office Action in U.S. Appl. No. 17/213,230 dated Dec. 14, 2021, 6 pages.
Prager, J.R. et al., "A High Voltage Nanosecond Pulser with Variable Pulse Width and Pulse Repetition Frequency control for Nonequilibrium Plasma Applications", 41st International Conference on Plasma Sciences held with 2014 IEEE International Conference on High-Power Particle Beams, May 25-29, 2014, 6, Washington, D.C. (Abstract).
Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).
U.S. Advisory Action in U.S. Appl. No. 14/542,487 dated Mar. 28, 2017, 03 pages.
U.S. Non-Final Office Action in U.S. Appl. No. 15/889,586 dated Sep. 12, 2018, 18 pages.
Final Office Action in U.S. Appl. No. 17/033,662 dated Dec. 8, 2021, 17 pages.
Notice of Allowance in U.S. Appl. No. 16/737,615 dated Nov. 24, 2021, 11 pages.
International Search Report and Written Opinion as issued in connection with International Patent Application No. PCT/US2018/48206, dated Nov. 1, 2018, 10 pages.
U.S. Non Final Office Action in U.S. Appl. No. 16/178,565, dated Apr. 4, 2019, 10 pages.
U.S. Final Office Action in U.S. Appl. No. 15/889,586 dated May 2, 2019, 19 pages.
U.S. Final Office Action in U.S. Appl. No. 15/941,731, dated May 3, 2019, 16 pages.
U.S. Final Office Action in U.S. Appl. No. 16/178,538 dated Jun. 7, 2019, 17 pages.
U.S. Notice of Allowance in U.S. Appl. No. 16/250,765, dated Jul. 10, 2019, 9 pages.
U.S. Final Office Action in U.S. Appl. No. 16/178,565, dated Jul. 12, 2019, 11 pages.
U.S. Notice of Allowance in U.S. Appl. No. 16/178,538 dated Jul. 17, 2019, 10 pages.
U.S. Notice of Allowance in U.S. Appl. No. 15/941,731, dated Jul. 17, 2019, 12 pages.
U.S. Non-Final Office Action in U.S. Appl. No. 15/889,586 dated Sep. 6, 2019, 17 pages.
U.S. Notice of Allowance in U.S. Appl. No. 16/178,565, dated Nov. 14, 2019, 5 pages.
U.S. Non Final Office Action in U.S. Appl. No. 15/945,722, dated Nov. 15, 2019, 13 pages.
International Search Report and Written Opinion as issued in connection with International Patent Application No. PCT/US2019/043932, dated Dec. 5, 2019, 16 pages.
U.S. Non-Final Office Action in U.S. Appl. No. 16/599,318, dated Jan. 16, 2020, 11 pages.
U.S. Non-Final Office Action in U.S. Appl. No. 16/722,085, dated Mar. 6, 2020, 5 pages.
U.S. Final Office Action in U.S. Appl. No. 15/889,586 dated Mar. 18, 2020, 18 pages.
U.S. Non-Final Office Action in U.S. Appl. No. 16/523,840, dated Mar. 19, 2020, 6 pages.
U.S. Notice of Allowance in U.S. Appl. No. 15/945,722, dated Apr. 3, 2020, 7 pages.
U.S. Notice of Allowance in U.S. Appl. No. 16/114,195, dated Apr. 3, 2019, 9 pages.
U.S. Non-Final Office Action in U.S. Appl. No. 16/736,971, dated Apr. 7, 2020, 14 pages.
U.S. Non-Final Office Action in U.S. Appl. No. 16/457,791 dated Apr. 15, 2020, 12 pages.
U.S. Final Office Action in U.S. Appl. No. 16/736,971, dated Apr. 17, 2020, 6 pages.
U.S. Advisory Action in U.S. Appl. No. 16/736,971, dated May 12, 2020, 5 pages.
U.S. Non-Final Office Action in U.S. Appl. No. 16/722,115, dated May 14, 2020, 6 pages.
U.S. Non-Final Office Action in U.S. Appl. No. 16/555,948, dated May 15, 2020, 8 pages.
Extended European Search Report for Application No. 18848041.2 dated Jun. 23, 2020, 9 pages.
U.S. Final Office Action in U.S. Appl. No. 16/523,840, dated Jun. 26, 2020, 5 pages.
U.S. Notice of Allowance in U.S. Appl. No. 16/736,971, dated Jun. 30, 2020, 14 pages.
U.S. Advisory Action in U.S. Appl. No. 15/889,586 dated Jul. 10, 2020, 4 pages.
U.S. Notice of Allowance in U.S. Appl. No. 16/722,085, dated Jul. 16, 2020, 8 pages.
U.S. Final Office Action in U.S. Appl. No. 16/599,318, dated Jul. 23, 2020, 14 pages.
U.S. Notice of Allowance in U.S. Appl. No. 16/599,318, dated Aug. 4, 2020, 8 pages.
U.S. Non-Final Office Action in U.S. Appl. No. 15/889,586 dated Sep. 18, 2020, 19 pages.
U.S. Notice of Allowance in U.S. Appl. No. 16/523,840, dated Sep. 30, 2020, 11 pages.
U.S. Non Final Office Action in U.S. Appl. No. 16/903,374, dated Nov. 25, 2020, 16 pages.
U.S. Final Office Action in U.S. Appl. No. 16/722,115, dated Dec. 2, 2020, 7 pages.
U.S. Notice of Allowance in U.S. Appl. No. 16/523,840, dated Dec. 4, 2020, 11 pages.

* cited by examiner

HIGH VOLTAGE RESISTIVE OUTPUT STAGE CIRCUIT

BACKGROUND

Producing high voltage pulses with fast rise times and/or fast fall times is challenging. For instance, to achieve a fast rise time and/or a fast fall time (e.g., less than about 50 ns) for a high voltage pulse (e.g., greater than about 5 kV), the slope of the pulse rise and/or fall must be incredibly steep (e.g., greater than $10^{-11}$ V/s). Such steep rise times and/or fall times are very difficult to produce especially in circuits driving a load with low capacitance. Such pulse may be especially difficult to produce using standard electrical components in a compact manner; and/or with pulses having variable pulse widths, voltages, and repetition rates; and/or within applications having capacitive loads such as, for example, a plasma.

SUMMARY

Some embodiments include a high voltage, high frequency switching circuit. The switching circuit may include a high voltage switching power supply that produces pulses having a voltage greater than 1 kV and with frequencies greater than 10 kHz and an output. The switching circuit may also include a resistive output stage electrically coupled in parallel with the output and between the output stage and the high voltage switching power supply, the resistive output stage comprising at least one resistor that discharges a load coupled with the output. In some embodiments, the resistive output stage may be configured to discharge over about 1 kilowatt of average power during each pulse cycle. In some embodiments, the output can produce a high voltage pulse having a voltage greater than 1 kV and with frequencies greater than 10 kHz with a pulse fall time less than about 400 ns.

In some embodiments, the high voltage switching power supply may comprise a power supply, at least one switch, and a step-up transformer.

In some embodiments, the resistive output stage may comprise an inductor.

In some embodiments, the resistance of the resistor in the resistive output stage may be less than 200 ohms.

In some embodiments, the resistor may comprise a plurality of resistors arranged in series or parallel having a combined capacitance less than about 200 pF.

In some embodiments, the resistive output stage includes an inductor and a resistor, and wherein the inductance L of the inductor and the resistance R of the resistor are set to satisfy L/R≈tp, where tp is the pulse width of the pulse.

In some embodiments, the resistor in the resistive output stage has a resistance R and the output is coupled with a load having a capacitance C such that R≈C/tf where tf is the pulse fall time.

In some embodiments, the resistor in the resistive output stage includes has a resistance R and the output is coupled with a load having a capacitance C such that R≈C/tr where tr is the pulse rise time.

In some embodiments, the resistive output stage includes a blocking diode.

In some embodiments, the output produces a high-voltage, negative bias voltage within a plasma when the high voltage switching power supply is not providing a high voltage pulse.

In some embodiments, the output can produce a high voltage pulse having a voltage greater than 1 kV and with frequencies greater than 10 kHz with a pulse fall time less than about 250 ns.

In some embodiments, the high voltage, high frequency switching circuit may be coupled with a load that is capacitive in nature with a capacitance less than 50 nF, wherein the load capacitance does not hold charges for times greater than 10 μs.

In some embodiments, the high voltage, high frequency switching circuit may be coupled with a load that is capacitive in nature and the high voltage, high frequency switching circuit rapidly charges the load capacitance and discharges the load capacitance Some embodiments may include high voltage, high frequency switching circuit that includes a high voltage switching power supply that produces pulses having a voltage greater than 1 kV and with frequencies greater than 10 kHz; an output; and a resistive output stage electrically coupled to, and in parallel with the output of the high voltage switching power supply, the resistive output stage comprising at least one resistor.

In some embodiments, the output can produce a high voltage pulse having a voltage greater than 1 kV with frequencies greater than 10 kHz and with pulse fall times less than about 400 ns, and wherein the output is electrically coupled to a plasma type load.

In some embodiments, the plasma type load can be modeled as having capacitive elements less than 20 nF in size.

In some embodiments, a potential is established to accelerate ions into a surface through the action of the high voltage high frequency switching power supply In some embodiments, the plasma type is largely capacitive in nature.

In some embodiments, the plasma type load includes a dielectric barrier discharge.

In some embodiments, the high voltage high frequency switching power supply delivers peak powers greater than 100 kW.

In some embodiments, the high voltage switching power supply comprises a power supply, at least one switch, and a step-up transformer.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

A pulse generator is disclosed that includes one or more of the following stages a driver stage, a transformer stage, a rectifier stage, and an output stage. The driver stage may include at least one of one or more solid state switches such as, for example, an insulated gate bipolar transistor (IGBT) or a metal-oxide-semiconductor field-effect transistor (MOSFET). The driver stage may also have a stray inductance less than 1,000 nH. The transformer stage may be coupled with the driver stage such as, for example, through a balance stage and may include one or more transformers. The rectifier stage may be coupled with the transformer stage and may have a stray inductance less than 1,000 nH. The output stage may be coupled with the rectifier stage. The output stage may output a signal pulse with a voltage greater than 2 kilovolts and a frequency greater than 5 kHz. In some embodiments, the output stage may be galvanically isolated from a reference potential.

A method is also disclosed that includes the following: generating a first input waveform having a first input frequency, a first input voltage, and a first input duration; outputting a first output pulse having a rise time less than 1,000 nanoseconds, a first output voltage greater than the first input voltage, and a pulse width substantially equal to the first input duration; turning off the first input waveform for a second input duration; generating a second input waveform having a second input frequency, a second input voltage, and a second input duration, wherein the second input duration is different than the first input duration; and outputting a second output pulse having a rise time less than 1,000 nanoseconds, a second output voltage greater than the second input voltage, and a pulse width substantially equal to the second input duration.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
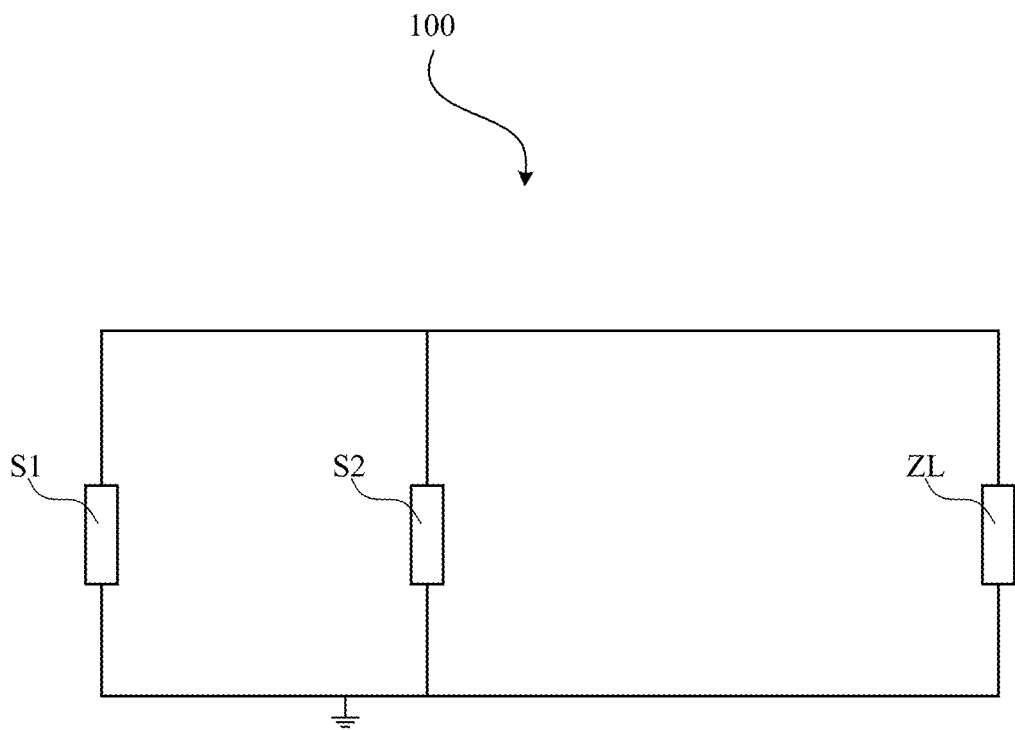
FIG. 1 is an example circuit that can be used to control the voltage on a load according to some embodiments.

In some embodiments, a resistive output stage is a collection of circuit elements that can be used to control the shape of a voltage waveform on a load. In some embodiments, a resistive output stage may include passive elements only (e.g., resistors, capacitors, inductors, etc.); and in other embodiments a resistive output stage may include active circuit elements (e.g., switches) as well as passive circuit elements. In some embodiments, a resistive output stage, for example, can be used to control the voltage rise time of a waveform and/or the voltage fall time of waveform. In the associated figures, examples of resistive output stages are shown and are represented by different symbols such as R, Zp, ZL, ZC, etc. These are examples and should not be viewed as to limit the varieties of resistive output stages covered in the various embodiments described in this document.

In some embodiments, a resistive output stage can discharge capacitive loads. For example, these capacitive loads may have small capacitance (e.g., about 10 pF, 100 pF, 500 pF, 1 nF, 10 nF, 100 nF, etc.). As another example, a rapid discharge is a pulse having a fall time that is shorter than about 1 ns, 10 ns, 50 ns, 100 ns, 250 ns, 500 ns, 1,000 ns, etc.

In some embodiments, a resistive output stage can be used in circuits with pulses having a high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

Indeed, as used throughout this disclosure, the term "high voltage" may include a voltage greater than 1 kV, 10 kV, 20 kV, 50 kV, 100 kV, etc.; the term "high frequency" may be a frequency greater than 1 kHz, 10 kHz, 100 kHz, 200 kHz, 500 kHz, 1 MHz, etc., the term "fast rise time" may include a rise time less than about 1 ns, 10 ns, 50 ns, 100 ns, 250 ns, 500 ns, 1,000 ns, etc.; the term "fast fall time" may include a fall time less than about 1 ns, 10 ns, 50 ns, 100 ns, 250 ns, 500 ns, 1,000 ns, etc.); and the term short pulse width may include pulse widths less than about 1 ns, 10 ns, 50 ns, 100 ns, 250 ns, 500 ns, 1,000 ns, etc.).

Additionally, the term 'rise time' may be understood to describe the application of voltage and/or charge/and/or energy and/or current to the circuit at the beginning of the pulse, irrespective of whether the pulse is positive going of negative going with respect to ground. Similarly, the term 'fall time' may be understood to describe the application of voltage and/or charge/and/or energy and/or current to the circuit at the end of the pulse, irrespective of whether the pulse is positive going of negative going with respect to ground.

FIG. 1 is an example circuit 100 that can be used to control the voltage on a load ZL, which may be the circuit/system load. The load ZL may be a capacitor, a capacitor in series with a resistor, a capacitor in series with an inductor, a dielectric barrier discharge, a plasma load, a semiconductor wafer processing load, and any arbitrary arrangement of capacitors, inductors, resistors, and/or other active and/or passive components, etc. In some embodiments, the load ZL may include any load that when voltage is applied, and charge is delivered, the charge/voltage may remain present for longer than desired (e.g., longer than the designed or desired fall time). For instance, this may often occur in high voltage switching applications.

In some embodiments, the switch S1 may be a single switch, a series stack of switches, a switching power supply, a pulser, a microsecond pulser, an arbitrary pulse generator, or any system that may be used to apply a high voltage, time varying power to the load ZL with the parameters noted above. In some embodiments, the switch S1 can deliver pulses to the load (e.g., charge or power to the load ZL and/or establish a voltage on the load ZL) at high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

In some embodiments, the switch S2 may be a single switch, a series stack of switches, or any other arrangement of active elements that can be used to remove charge from the load ZL and/or reduce the voltage across the load ZL. In some embodiments, the switch S2 may be used to remove charge from the load ZL when the switch S1 is open. In some embodiments, the switch S2 may be coupled with a resistor.

Figure 2:
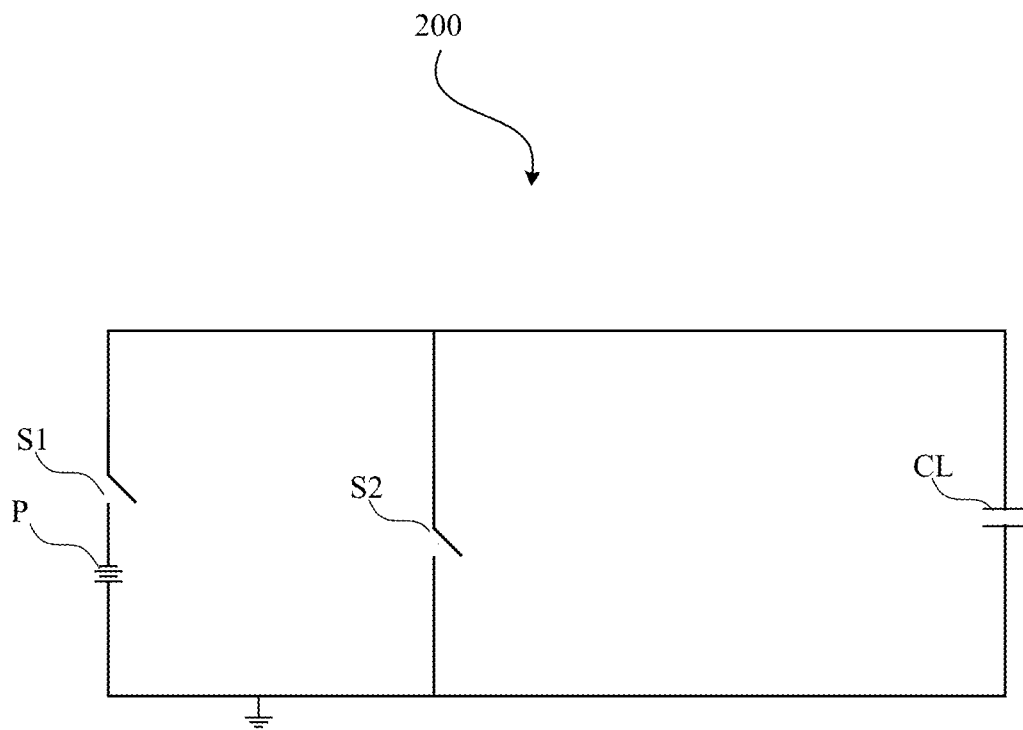
FIG. 2 is an example circuit that can be used to control the voltage on a load according to some embodiments.

FIG. 2 is another example circuit 200 according to some embodiments. In this example, the switch S1 may be in series with a DC power supply P and/or may include a transformer or other circuit elements. the switch S1, can include a solid-state switch such as, for example, an IGBT, GaN, MOSFET, etc. switch. the switch S2 may be a switch (e.g., a high voltage switch), and the load ZL may be represented as a capacitive load CL.

Pulses from the switch S1 and the power supply P may be delivered in the following manner. When the switch S1 is closed and switch S2 is open, charge is delivered to capacitive load CL and the voltage on the capacitive load CL increases to some value V, set by the power supply P. When the switch S1 is opened, the charge/voltage will remain on capacitive load CL until the switch S2 is closed and the voltage/charge is discharged from the capacitive load CL. The pulses from the switch S1 and the power supply P may include high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

In some embodiments, there may be an asymmetry between the switch S1 and the switch S2. For example, many different topologies can be used to create a voltage source (the switch S1) that has a high voltage output compared to the voltage hold off rating of the actual switches used. For example, the switch S1 may include a 600 V switch combined with a 10:1 Step up transformer that together produces an output voltage of 6 kV. In this example, the switch S2 would need to be a 6 kV rated switch. While a 600 V switch may be common, a 6 kV switch is uncommon. In this example, the switch S2 must hold off 6 kV until it is closed and removes the charge/voltage from the load CL. This asymmetry between the switch S1 and the switch S2 may be especially problematic with solid-state switches, for example IGBTs, GaN switches, MOSFETs, etc. It can be even more problematic when fast switching transition times are required, and/or high frequency operation is required, and/or high voltage operation is required, since often switches with the required propertied do not exist.

Figure 3:
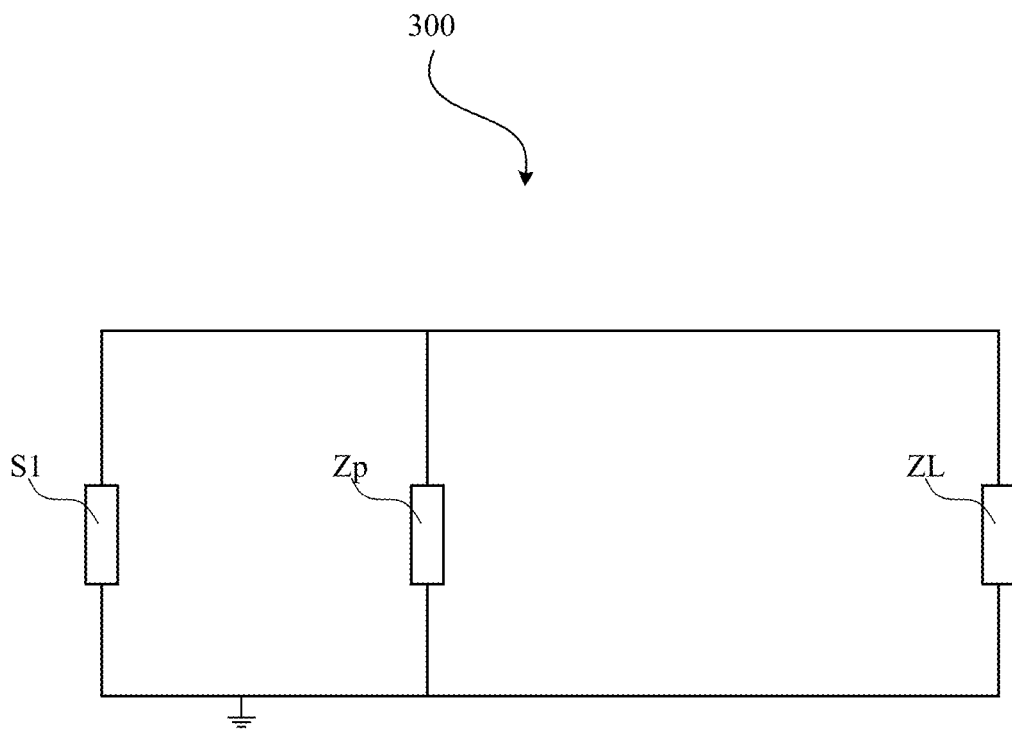
FIG. 3 is an example circuit that can be used to control the voltage on a load according to some embodiments.

FIG. 3 is a circuit 300, for example, that can be used to overcome the asymmetry between the switch S1 and the switch S2, and/or the challenges of operating the switch S2 at high frequency, high voltage, and/or with fast rise/fall times. The switch S1 may be a switch in series with a DC power supply (e.g., as shown in FIG. 2) and/or may include a transformer. The switch S1, for example, can include a solid-state switch such as, for example, an IGBT, GaN, MOSFET, etc. switch. The circuit element Zp may comprise a resistive output stage that may include a combination of resistors, capacitors, diodes, and/or inductors. In some embodiments, the circuit element Zp may include a series and/or parallel arrangement of passive elements (i.e. resistors, capacitors, inductors, diodes, etc.). In some embodiments, Zp may be purely resistive in nature. In some embodiments, the circuit element Zp may replace the functionality of the switch S2. For example, the circuit element Zp may allow charge and/or voltage to be removed from the load ZL at high frequency, high voltage, fast rise times, and/or fast fall times. In terms of voltage, frequency, rise time, and fall time, passive elements may have fewer constraints compared with solid state switches.

Figure 4:
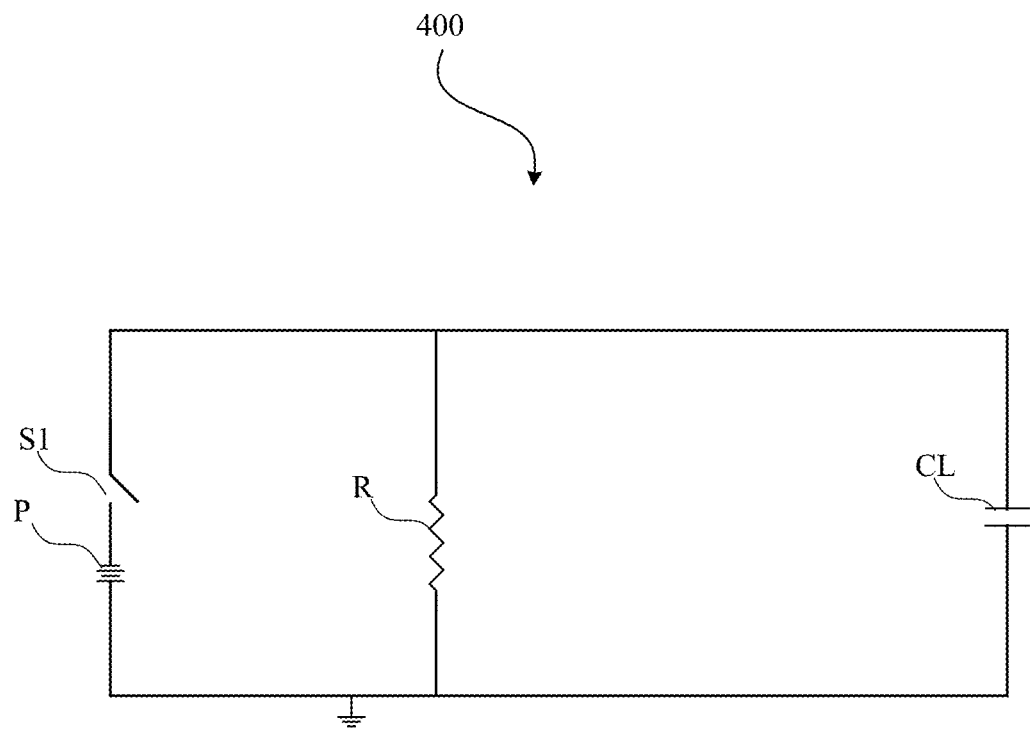
FIG. 4 is an example circuit with a resistive output stage according to some embodiments.

FIG. 4 is an example circuit 400 where circuit element Zp is represented as a resistor R. In this example, the switch S1 closes and establishes a voltage V across capacitive load CL that is set by the power supply P. While the switch S1 is closed, power supply P may maintain the voltage V across resistor R and load CL. Once the switch S1 opens, the charge/voltage on the capacitive load CL can be removed by the resistor R, on a timescale set by the product of (R) and (CL) which is commonly simply known as an RC timescale. If R was 100 Ohms and C was 1 nF than the characteristic voltage fall time given by RC would be 100 ns. The resistor R can operate in a high voltage, high frequency, fast rise time, and/or fast fall time parameter space within which few to no switches can operate.

For example, resistor R can remove charge/voltage from capacitive load CL at 6 kV, 100 kHz, and/or with a 100 ns fall time. Resistor R, for example, could be selected to remove charge at high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.). This set of voltages, frequencies, rise times, and/or fall times may cover a space not accessible by any existing solid-state switch.

In some embodiments, a resistive output stage can be useful for pulses with voltages greater than about 1.5 kV, frequencies greater than about 10 kHz, pulses widths less than about 100 µs, and/or rise and fall times shorter than about 1 µs. In some embodiments, a resistive output stage can be useful, for example, where the load ZL contains capacitances (e.g., including stray, equivalent, effective, etc., or things that would be modeled as capacitances) with values smaller than 1 µF. In some embodiments, a resistive output stage can be used with a high voltage pulser for the production of plasmas (which will typically have the plasma and/or electrode/grid scale size less than 1 m or an electrode grid scale less than about 1 square meter) or involve grids and plates with scale sizes less than 1 m.

Figure 5:
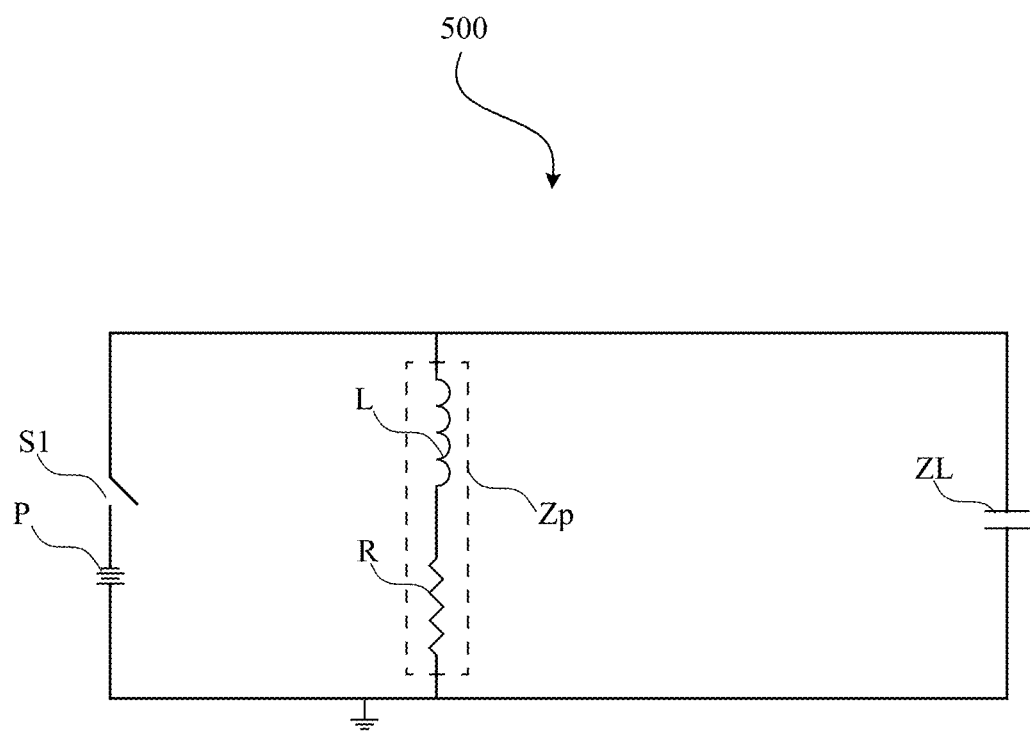
FIG. 5 is an example circuit with a resistive output stage according to some embodiments.

FIG. 5 is another example circuit 500. In circuit 500, circuit element Zp includes resistor R in series with inductor L. In this example, inductor L can be used to reduce the power that flows into resistor R while the switch S1 is closed on short time scales such as, for example, on time scales as can be determined by V=Ldi/dt (e.g., 1 ns, 10 ns, 50 ns, 100 ns, 250 ns, 500 ns, 1,000 ns, etc.). Inductor L, for example, can be selected to create a faster fall time and/or faster rise time than could be achieved for a given value of R.

In some embodiments, circuit element Zp can be used to remove voltage/charge from a load ZL in a parameter space not readily accessible to solid-state switches. This parameter space, for example, may include pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.). ZL may be largely capacitive in nature, and/or may contain capacitance, and/or may represent a capacitance of a wafer and/or plasma. ZL may represent any type of capacitive load.

In some embodiments, voltage waveforms can be produced with a single switch (or single group of switches) when other topologies might require two-switches (or two groups of switches) to achieve a similar result. For instance, in some embodiments, a single switch (or single group of switches) on the input can provide a solution to a problem that generally requires two-switches to solve.

The set of loads ZL where the circuit element Zp may be applicable may include loads that generally have a sufficiently high impedance that the load holds charge/voltage for a longer timescale than desired (e.g., where desired time scales are on the order of 1 ns, 10 ns, 50 ns, 100 ns, 250 ns, 500 ns, 1,000 ns, etc.). In some embodiments, circuit element Zp may allow for rapid removal of this charge/voltage to achieve fast fall times, high frequencies, and/or short pulses.

In some embodiments, a load (e.g., capacitive load CL or generalized load ZL) may include capacitive loads, electrodes, plasma loads, dielectric barriers, semiconductor fabrication plasmas, semiconductor loads, grids, medical loads, etc. Such loads may, for example, have a high impedance compared to the timescale on which charge/voltage needs to be removed from them, such that the load itself does not naturally produce the needed voltage/charge removal timescale.

In some embodiments, a load may have stray elements that have a high impedance compared to the timescale on which charge/voltage needs to be removed from them. For example, if the load ZL is non-capacitive, but the load ZL is associated with a parallel stray capacitance, then circuit element Zp can be used to remove charge/voltage from the stray capacitance, thus allowing the voltage on the load ZL to fall.

In circuits operating at low voltage, it is often common and easy to have pulse generators that both source and sink current, for example 'data pulsers'. Thus, it does not matter if the load has a high impedance compared to the timescale on which charge/voltage needs to be removed from it. The low voltage pulse generator naturally does this by both sourcing and sinking current, often through the use of two switches, where one delivers charge/voltage from a power supply, and the other sinks charge/voltage to ground. At high voltage, high frequency with short pulse widths and/or fast rise time and/or fall times, such sourcing and sinking power supplies often do not exist. A resistive output stage may, for example, allow for the sinking of current from the load, and when used in combination with a high voltage pulser that sources current, allows the equivalent low voltage sourcing and sinking power supply to be realized, but at high voltage, high frequency with short pulse widths and/or fast rise times and/or fast fall times.

The use of a resistive output stage to achieve high voltage pulses at high frequencies that have fast rise/fall times, and short pulse widths may constrain the selection of the circuit elements in the resistive output sage. The resistive output stage may be selected to handle high average power, high peak power, fast rise times and/or fast fall times. For example, the average power rating might be greater than about 0.5 kW, 1.0 kW, 10 kW, 25 kW, etc., the peak power rating might be greater than about 1 kW, 10 kW, 100 kW, 1 MW, etc., and/or the rise and fall times might be less than 1000 ns, 100 ns, 10 ns, or 1 ns.

The high average power and/or peak power requirement may arise both from the need to dissipate stored energy in the load rapidly, and/or the need to do so at high frequency. For example, if the load is capacitive in nature, with a 1 nF capacitance that needs discharging in 20 ns, and if the resistive output stage may be purely resistive, the resistive output stage may have a resistance value of about 20 Ohms. If the high voltage pulse applied to the load is 100 ns long at 20 kV, then each pulse will dissipate about 2 J during the 100 ns pulse width (e.g., $E=t_p V^2/R$) and an additional 0.2 J draining the stored energy from the 1 nF capacitive load (e.g., $E=\frac{1}{2}t_p C V^2$), where $t_p$ is the pulse width, V is the pulse voltage, R is the resistance of the resistive output stage, C is the capacitance of the load, and E is the energy. If operated at 10 kHz, the total per pulse energy dissipation of 2.2 J may result in an average power dissipation of 22 kW into the resistive output stage. The peak power dissipation in the resistive output stage during the pulse may be about 20 MW, and may be calculated from Power=$V^2/R$.

The high frequency and high voltage operation, combined with the need for the resistance in the resistive output stage to be small, for example, may lead to examples with either or both high peak power and high average power dissipation within the resistive output stage. Standard pulldown resistors that are used in TTL type electrical circuits and/or data acquisition type circuits (e.g., around 5 volts) usually operate far below 1 W for both average and peak power dissipation.

In some embodiments, the ratio of the power the resistive output stage dissipates compared to the total power dissipated by the load may be 10%, 20% 30% or greater, for example. In standard low voltage electronic circuits, pull down resistors dissipate less than 1% of the power consumed, and typically much less.

The fast rise time and/or fast fall time requirements may constrain both the allowable stray inductance and/or stray capacitance within the resistive output stage. In the above example, for the 1 nF capacitive load to be discharged in around 20 ns, the series stray inductance in the resistive output stage may be less than around 300 nH. For the resistive output stage to not waste significant additional energy due to its stray capacitance, for example, less than 10% of the capacitive energy stored in the load capacitance, then the stray capacitance of the resistive output stage may be less than 100 pF. Since the resistive output stage may tend to be physically large due to its high power dissipation requirements, realizing both this low stray inductance and stray capacitance can be challenging. The design generally requires significant parallel and series operation using numerous discrete components (e.g., resistors), with the components tightly grouped together, and/or spaced far from any grounded surfaces that could significantly increase the stray capacitance.

In some embodiments, a resistive output stage circuit can be used in a dielectric barrier discharge device being driven with a high voltage pulser. The load in a dielectric barrier discharge can be dominantly capacitive. In some embodiments, the load may be modeled as a purely capacitive load CL, for example, like a dielectric barrier discharge. For example, when the power supply P is switched on, capacitive load CL may be charged, when power supply P is not switched on, the charge on capacitive load CL may be drained through resistor R. In addition, due to high voltages and/or high frequencies and/or fast fall time requirements a resistive output stage may need to discharge a significant amount of charge from the capacitive load CL quickly, which may not be the case with low voltage applications (e.g., standard 5 V logic levels and or low voltage data pulsers).

For example, a typical dielectric barrier discharge device might have a capacitance of about 10 pF and/or may be driven to about 20 kV with about a 20 ns rise time and/or about a 20 ns fall time. In some embodiments, the desired pulse width might be 80 ns long. For the fall time to match the rise time, a circuit element Zp of about 2 kOhms can be used to create the desired fall time. Various other values for the circuit element Zp may be used depending on the load and/or the other circuit elements and/or the requirements rise time, fall time, and/or pulse width, etc.

In some embodiments, for a capacitive like load, or a load that has an effective capacitance C (e.g., the capacitance C can be due to the load ZL itself or to additional stray elements), the characteristic pulse fall time can be designated as $t_f$ and the pulse rise time can be designated by $t_r$. In some embodiments, the rise time $t_r$ can be set by the specifics of the driving power supply. In some embodiments, the pulse fall time $t_f$ can be approximately matched to the pulse rise time $t_r$ by selecting the circuit element Zp as a resistor R, where circuit element $Zp=R=t_r/C$. In some embodiments, the circuit element Zp can be specifically selected to provide a specific relation between the pulse rise time $t_r$ and the pulse fall time $t_f$. This is different from the concept of a pull down resistor, where in general, a pull down resistor is selected to carry/dissipate voltage/charge on some longer time scale, and at much lower power levels. Circuit element Zp, in some embodiments, can be specifically used as an alternative to a pull down switch, to establish a specific relation between the pulse rise time $t_r$ and the pulse fall time $t_f$.

In some embodiments, if the circuit element Zp is a resistor R, then the power dissipated in circuit element Zp during a pulse having a pulse width $t_p$ and a drive voltage V can be found from $P=V^2/R$. Because fall time $t_f$ is directly proportional to resistance R (e.g., $R=t_f/C$), as the requirement for fall time $t_f$ decreases then the requirement for the resistance R also decreases, and the power P dissipated in circuit element Zp increases according to $P=V^2C/t_f$. Thus, circuit element Zp may be designed to ensure the proper fall time $t_f$ yet be capable of handling high power such as, for example, power greater than about 1.0 kW, or 100 kW. In some embodiments the resistor may handle the average power requirements as well as peak power requirements. The need for fast fall time $t_f$ resulting in low resistance values and the resulting high power dissipation are challenges that can make resistive output stages undesirable as a way to quickly remove charge from a capacitive load CL. In some embodiments, a resistor R can include a resistor with low resistance and yet have a high average power rating and peak power rating. In some embodiments, the resistor R may include a parallel stack of resistors that collectively have the required resistance and power rating. In some embodiments, the resistor R may include a resistor have a resistance less than about 2000 ohms, 500 ohms, 250 ohms, 100 ohms, 50 ohms, 25 ohms, 10 ohms, 1 ohm, 0.5 ohms, 0.25 ohms, etc., and have an average power rating greater than about 0.5 kW, 1.0 kW, 10 kW, 25 kW, etc., and have a peak power rating greater than about 1 kW, 10 kW, 100 kW, 1 MW, etc.

Using the example above, with tp=80 ns, V=20 kV, and circuit element Zp set to 2 kOhms, each pulse applied to the load may dissipate 16 mJ once the capacitance in the load is fully charged. Once the pulse is turned off, charge from the load is dissipated by Zp. If operated at 100 kHz, then circuit element Zp may dissipate 1.6 kW. If circuit element Zp had been selected to create a 10 ns $t_f$, then the power dissipated in circuit element Zp would be 3.2 kW. In some embodiments, a high voltage pulse width may extend to 500 ns. At 500 ns with $t_f$=20 ns, circuit element Zp would dissipate 10 kW.

In some embodiments, the power dissipated in the circuit element Zp can be considered large if it exceeds 10% or 20% of the power consumed by the load ZL.

When fast fall times $t_f$ are needed, then the power dissipation can be large such as, for example, about one third the total power consumed. If circuit element Zp, for example, includes a resistor R in series with an inductor L, then inductor L can, for example, reduce the power flow into the resistor R while the voltage V is present and/or hasten the fall time beyond that set by an RC decay.

For example, the time constant L/R can be set to approximately the pulse width $t_p$, for example, $L/R \approx t_p$. This, for example, may reduce energy dissipation and/or shorten the fall time $t_f$ (e.g., decreases $t_f$). In some embodiments, $R \approx C/t_f \approx C/t_r$, assuming one wanted to match $t_f$ to $t_r$. In this application, disclosure, and/or claims, the symbol "≈" means within a factor of ten.

As another example, a load ZL can include a circuit that controls the ion energy in a plasma chamber of a semiconductor wafer fabrication device. FIG. 6, FIG. 7, FIG. 9, and FIG. 11 and FIG. 13 each represent introducing high voltage pulses into a plasma. Some of these example circuits, apply high voltage pulses in a manner that controls the ion energy within the plasma, and specifically that controls the energy the ions have as they exit the plasma and impact, for example, a wafer or other substrate that bounds the plasma.

Figure 6:
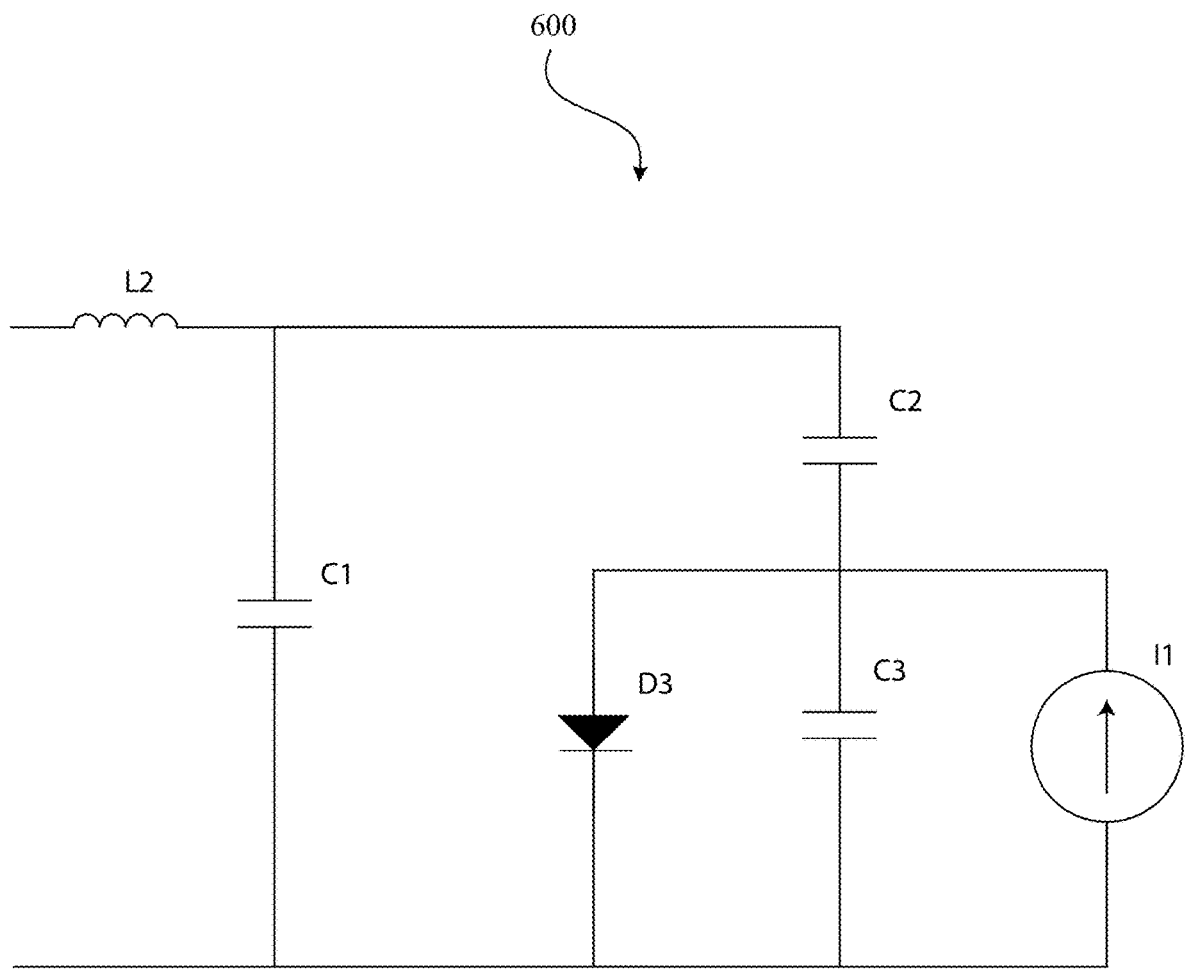
FIG. 6 is an example circuit representation of a circuit used to set the ion energy in a plasma according to some embodiments.

FIG. 6 is one example of a circuit 600 representing a circuit used to set the ion energy in a plasma chamber of a semiconductor wafer fabrication device. The driving waveform may include high voltage and high frequency short pulses with a high duty cycle and fast rise times and fall times. The pulses create a negative bias within the plasma that accelerates ions to the desired potential, prior to their impact with a wafer. An example of such a waveform is shown as waveform 810 in FIG. 8. In waveform 810, a steady negative bias of approximately −4 kV is realized, through the use of short positive going pulses shown by waveform 805. The driving waveform to the plasma may include any circuit described in this document where the plasma is the load.

The capacitor C2 represents the capacitance of the dielectric material upon which a semiconductor wafer sits during fabrication. The capacitor C3 represents the sheath capacitance between a semiconductor surface and a plasma. The current source I1 represents the current of positive ions moving from the plasma toward the surface of the wafer. In this example, a portion of the plasma is electrically connected to ground. Thus, a negative electric potential in the plasma between ground and the surface of the wafer will induce positive ions to flow and impact the surface of the wafer. The capacitor C1 represents the capacitance of leads running into the chamber, as well as other stray capacitive elements. In some embodiments, capacitor C1 may have a capacitance of about 40-4,000 pF (e.g., 400 pF), capacitor C2 may have a capacitance of about 0.7-70 nF (e.g., 7 nF), capacitor C3 may have a capacitance of about 10-1,000 pF (e.g., 100 pF), and current source I1 may produce current of about 300 mA-30 A (e.g., 3 A). Various other values may be used. Component values within an order of magnitude or so of these element values given may also be used.

In some embodiments, the capacitance of the capacitor C1 is almost the same size as the capacitance of the capacitor C3; and the capacitance of the capacitor C2 is large in comparison with the capacitance of the capacitor C3.

Figure 7:
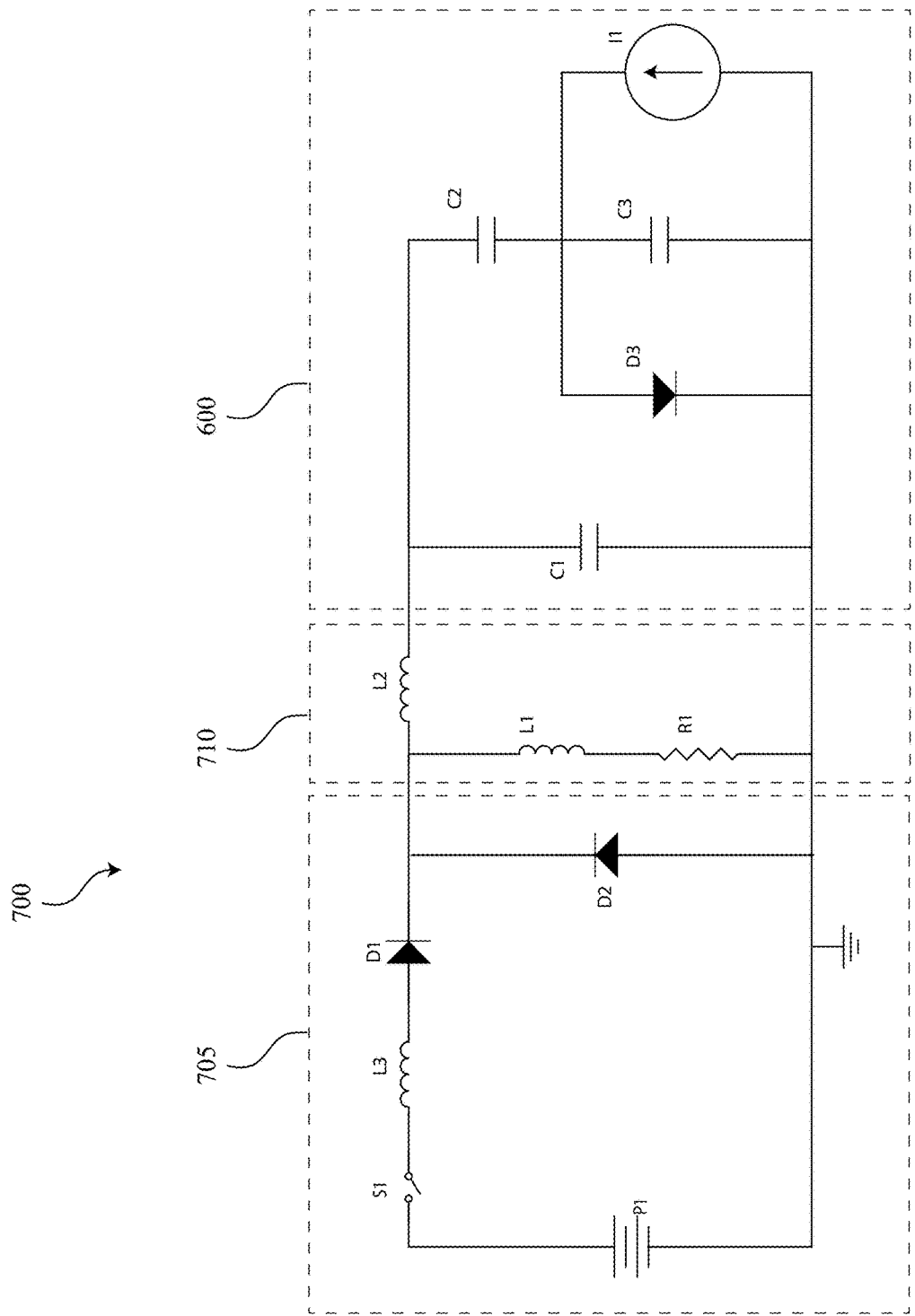
FIG. 7 is a single switch configuration that may be used instead of the two-switch configuration, to set the ion energy in a plasma, according to some embodiments.

FIG. 7 is a circuit diagram of circuit 700 that includes a pulser 705, a resistive output stage 710, that produces high voltage pluses in a plasma represented by circuit 600. In this example, the resistive output stage 710 includes inductor L1 and resistor R1. The circuit elements to the left of inductor L1 and resistor R1 comprise one representation of a high voltage pulser 705. In this example, the high voltage pulser 705 can produce a plurality of high voltage pulses with a high frequency and fast rise times and fall times. In all of the circuits shown, the high voltage pulser may comprise a nanosecond pulser.

The various values of the circuit elements in circuit 700 and/or the circuit 600 may vary. For example, the value of capacitor C3 may be about 150 pF, the value of capacitor C1 may be about 400 pF, the value of capacitor C2 may be about 8 nF, the value of inductor L2 may be about 300 nH, the value of resistor R1 may be about 150 Ohms, the value of inductor L1 may be about 6 uH, the value of DC power supply V1 may be about 5 kV, and/or the value of current source I1 may be about 2 A. Values within an order of magnitude or so of these values may also be used.

Figure 8:
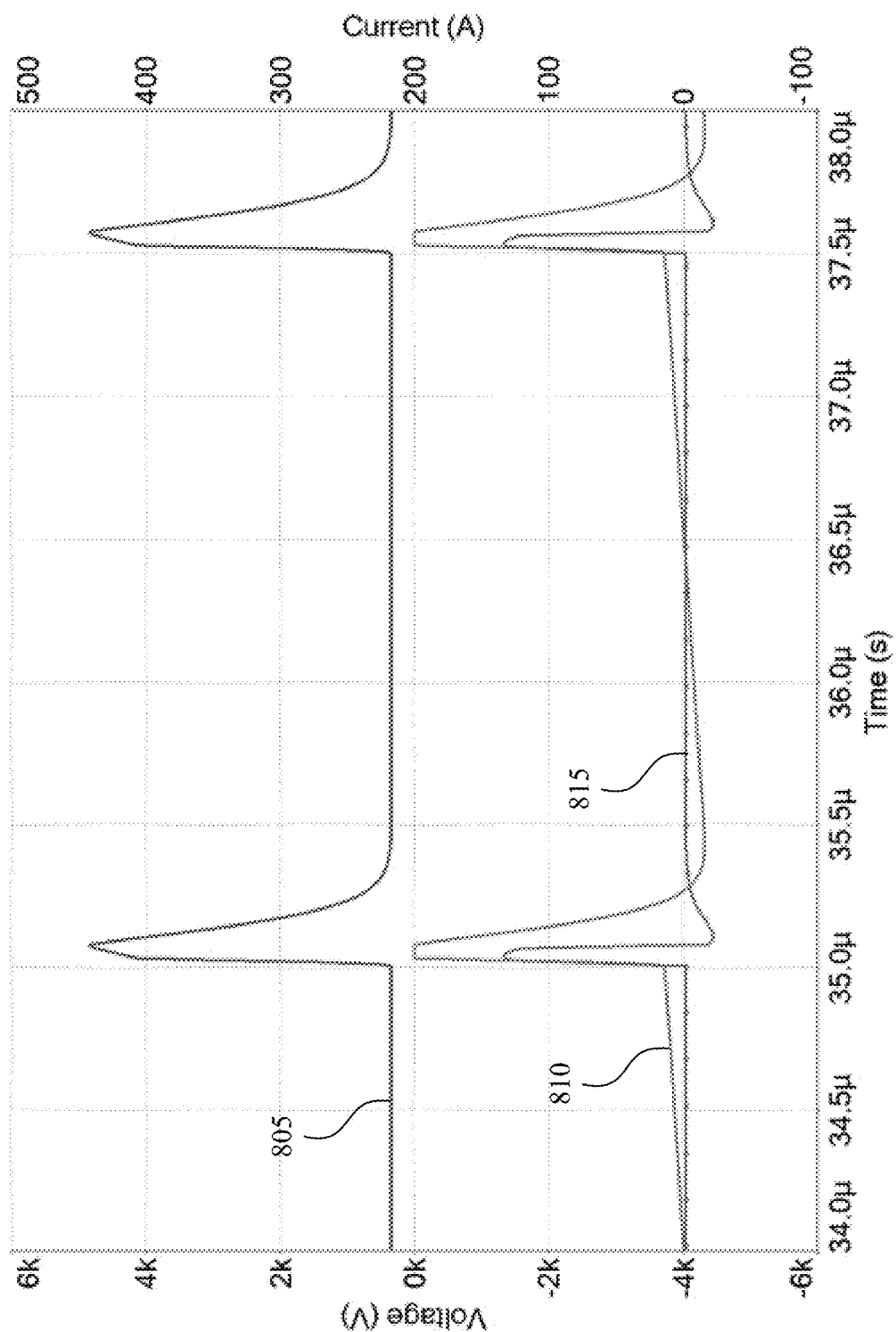
FIG. 8 shows some example waveforms of the voltage and current within a high voltage switching application according to some embodiments.

FIG. 8 shows example waveforms produced in circuit 700. In this example, the pulse waveform 805 may represent the voltage provided by the pulser stage 705. As shown, the pulse waveform 805 produces a pulse with the following qualities: high voltage (e.g., greater than about 4 kV as shown in the waveform), a fast rise time (e.g., less than about 200 ns as shown in the waveform), a fast fall time (e.g., less than about 200 ns as shown in the waveform), and short pulse width (e.g., less than about 300 ns as shown in the waveform). The waveform 810 may represent the voltage at the surface of a wafer represented in circuit 700 by the point between capacitor C2 and capacitor C3 or the voltage across capacitor C3. The pulse waveform 815 represent the current flowing from the pulser 705 to the plasma. The circuit 700 may or may not include either or both diodes D1 or D2.

During the transient state (e.g., during an initial number of pulses not shown in the figure), the high voltage pulses from the pulser 705 charge the capacitor C2. Because the capacitance of capacitor C2 is large compared to the capacitance of capacitor C3 and/or capacitor C1, and and/or because of the short pulse widths of the pulses, the capacitor C2 may take a number of pulses from the high voltage pulser to fully charge. Once the capacitor C2 is charged the circuit reaches a steady state, as shown by the waveforms in FIG. 8.

In steady state and when the switch S1 is open, the capacitor C2 is charged and slowly dissipates through the resistive output stage 710, as shown by the slightly rising slope of waveform 810. Once the capacitor C2 is charged and while the switch S1 is open, the voltage at the surface of the waver (the point between capacitor C2 and capacitor C3) is negative. This negative voltage may be the negative value of the voltage of the pulses provided by the pulser 705. For the example waveform shown in FIG. 8, the voltage of each pulse is about 4 kV; and the steady state voltage at the wafer is about −4 kV. This results in a negative potential across the plasma (e.g., across capacitor C3) that accelerates positive ions from the plasma to the surface of the wafer. While the switch S1 is open, the charge on capacitor C2 slowly dissipates through the resistive output stage.

When the switch S1 is closed, the voltage across the capacitor C2 may flip (the pulse from the pulser is high as shown in waveform 805) as the capacitor C2 is charged. In addition, the voltage at the point between capacitor C2 and capacitor C3 (e.g., at the surface of the wafer) changes to about zero as the capacitor C2 charges, as shown in waveform 810. Thus, the pulses from the high voltage pulser produce a plasma potential (e.g., a potential in a plasma) that rise from a negative high voltage to zero and returns to the negative high voltage at high frequencies, with fast rise times, fast fall times, and/or short pulse widths.

In some embodiments, the action of the resistive output stage, elements represented by block 710, that may rapidly discharge the stray capacitance C1, and may allow the voltage at the point between capacitor C2 and capacitor C3 to rapidly return to its steady negative value of about −4 kV as shown by waveform 810. The resistive output stage may allow the voltage at the point between capacitor C2 and capacitor C3 to exists for about 90% of the time, and thus maximizes the time which ions are accelerated into the wafer. In some embodiments, the components contained within the resistive output stage may be specifically selected to optimize the time during which the ions are accelerated into the wafer, and to hold the voltage during this time approximately constant. Thus, for example, a short pulse with fast rise time and a fast fall time may be useful, so there can be a long period of fairly uniform negative potential.

Figure 9:
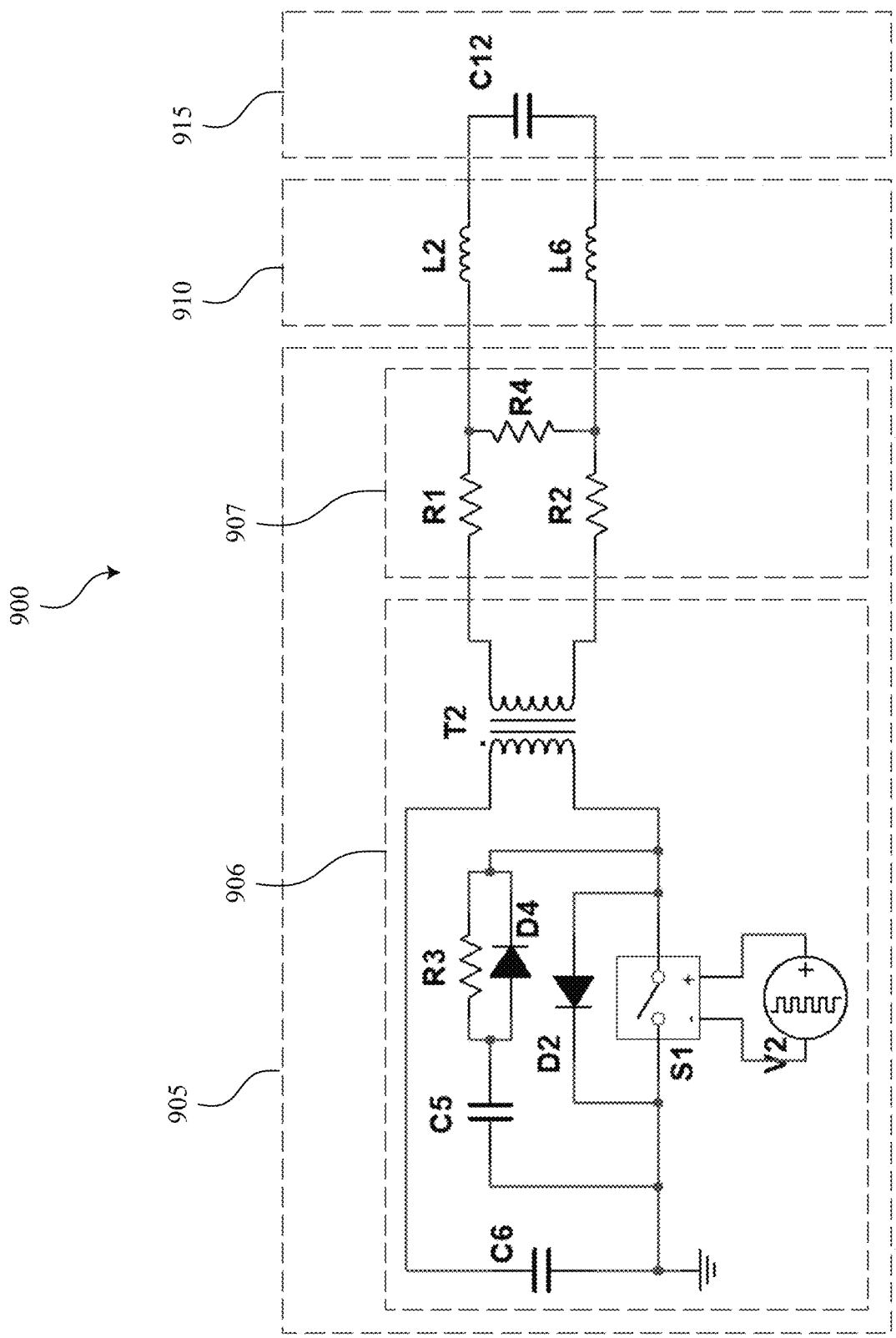
FIG. 9 is a circuit diagram of a circuit with a resistive output stage according to some embodiments.

FIG. 9 shows another example circuit 900 according to some embodiments. The circuit 900 can be generalized into three stages (these stages could be broken down into other stages or generalized into fewer stages). The circuit 900 includes pulser stage 905, a lead stage 910, and a load stage 915. The pulser stage 905 may include pulser and transformer stage 906 and a resistive output stage 907.

In some embodiments, the load stage 915 may include a capacitive load C12. The capacitance of the capacitive load C12 may be on the order of about 10 pF. Some examples of a capacitive load may include a dielectric barrier discharge, a semiconductor fabrication device, a capacitive device, a photoconductive switch, a dielectric barrier discharge device, etc. In some embodiments, C12 may be a high voltage grid for ion beams, neutral beams, or any other accelerator or grid for producing rapidly changing electric fields. In some embodiments, the capacitor C12 may be a stripline kicker.

The pulser stage 905 may include a pulser and transformer stage 906. The pulser and transformer stage 906 may produce pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

In this example, the resistive output stage 907 includes three resistors: resistor R1, resistor R2, and resistor R4. In some embodiments, resistor R1 and resistor R2 may have the same resistance values. In some embodiments, resistor R1 and resistor R2 can be selected for a number of purposes. For example, resistor R1 and resistor R2 can have resistance levels selected to limit the current flowing from the pulser stage 905 to the load stage 915. As another example, resistor R1 and resistor R2 can have resistance levels selected to determine the rise time tr and the fall time $t_f$, which may also depend on the inductance in the lead stage 910 (e.g., inductor L2 and inductor L6) and/or the capacitance of the load stage (e.g., capacitance C12). In some embodiments, the resistance values of resistor R1 and resistor R2 can be set based on a specific application. In some embodiments, resistor R1 and resistor R2 can be used to protect against load shorts such that all the current from the pulse and transformer circuit 906 can be dissipated in resistor R1 and resistor R2. In some embodiments, resistor R2 and/or inductor L6 may be set to approximately zero, such that their side of C12 can be ground referenced.

A pulse from the pulser and transformer stage 905 may charge the capacitive load C12 in the load stage 915. While the pulse is charging the capacitive load C12, most of the current may charge the capacitive load C12, and some current may flow through resistor R4. Once the capacitive load C12 is fully charged, most if not all the current flows through resistor R4. Because of the high voltages applied by the pulser and transformer stage 905 and noting that the power dissipated through resistor R4 is inversely proportional to the resistance of resistor R4, resistor R4 may have a high power rating (e.g., both average power and peak power). In some embodiments, the resistance value of R4 can be selected in conjunction with the value of the load capacitance C12 so that the fall time $t_f$ can be fast e.g., less than 1 ns, 10 ns, 50 ns, 100 ns, 250 ns, 500 ns, 1,000 ns, etc.

Figure 10:
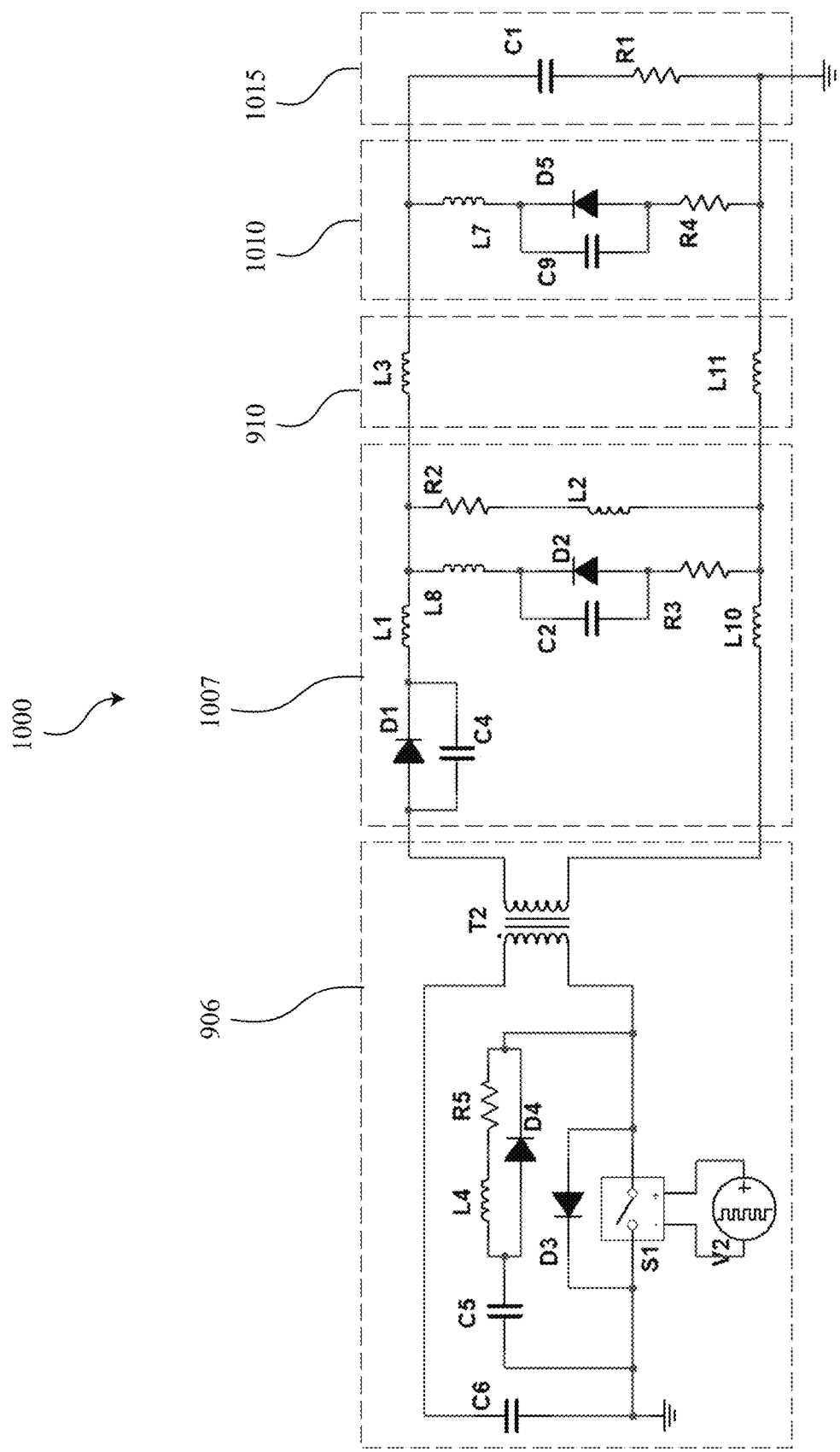
FIG. 10 is an example circuit with a resistive output stage according to some embodiments.

FIG. 10 is another example circuit 1000 according to some embodiments. The circuit 1000 can be generalized into five stages (these stages could be broken down into other stages or generalized into fewer stages). The circuit 1000 includes pulser and transformer stage 906, a resistive output stage 1007, a lead stage 910, load crowbar stage 1010, and a load stage 1015.

The pulser and transformer stage 906 are as described in FIG. 9.

In this example, the resistive output stage 1007 may include a blocking diode D1 that can ensure that current from the load stage 1015 (or from anywhere else) does not flow back into the pulser and transformer stage 906. The capacitor C4 may represent the stray capacitance of the blocking diode D1.

In some embodiments, the resistive output stage 1007 may include one or more inductive elements represented by inductor L1, inductor L2, inductor L8, and/or inductor L10. These inductive elements may, for example, limit current flow from the capacitive load in the load stage 1015. In some embodiments, the resistor R2 may dissipate charge from the capacitive load C1 in the load stage 1015, for example, on fast time scales (e.g., 1 ns, 10 ns, 50 ns, 100 ns, 250 ns, 500 ns, 1,000 ns, etc. time scales). The resistance of resistor R2 may be low to ensure the pulse across the load stage 1015 has a fast fall time t, for example a fall time less than 1 ns, 10 ns, 100 ns, or 1000 ns. The inductive elements, for example, inductor L2 may limit the current flow through resistor R2, and may increase the overall circuit efficiency.

In this example, the load crowbar stage 1010, includes a diode D5 which may ensure that the current to the load stage 1015 does not reverse polarity. In some embodiments, the stray inductance of the crowbar stage 1010 is represented by L7 and the stray capacitance of the diode D5 is represented by C9. In some embodiments, stray resistance of the crowbar stage 1010 may be represented by resistor R4. Resistance R4 may be intentionally added to create voltage waveforms of a particular desired shape across load 1015.

In this example, the load stage 1015 may include either or both resistive and capacitance elements represented by resistor R1 and capacitor C1. The capacitance of capacitor C1 may, for example, be on the order of about 10 nF. Some examples of a capacitive and resistive load may include a charging a capacitor for energy storage purposes in a photoconductive switch which may be used to produce high power microwaves. In such circuits, it is important that the load capacitance only be charged for short periods of time, and the resistive output stage provides a path to rapidly remove (sink) charge from the load should it not otherwise be removed by the action of other circuit elements that are not shown in this figure. The resistive output stage may also ensure that the voltage across C1 is constant at the start of every charge cycle, assuming the charge repetition rate is slow compared to the discharge rate of C1 through the resistive output stage. In this example, the resistive output stage rapidly returns the potential across C1 to zero.

Figure 11:
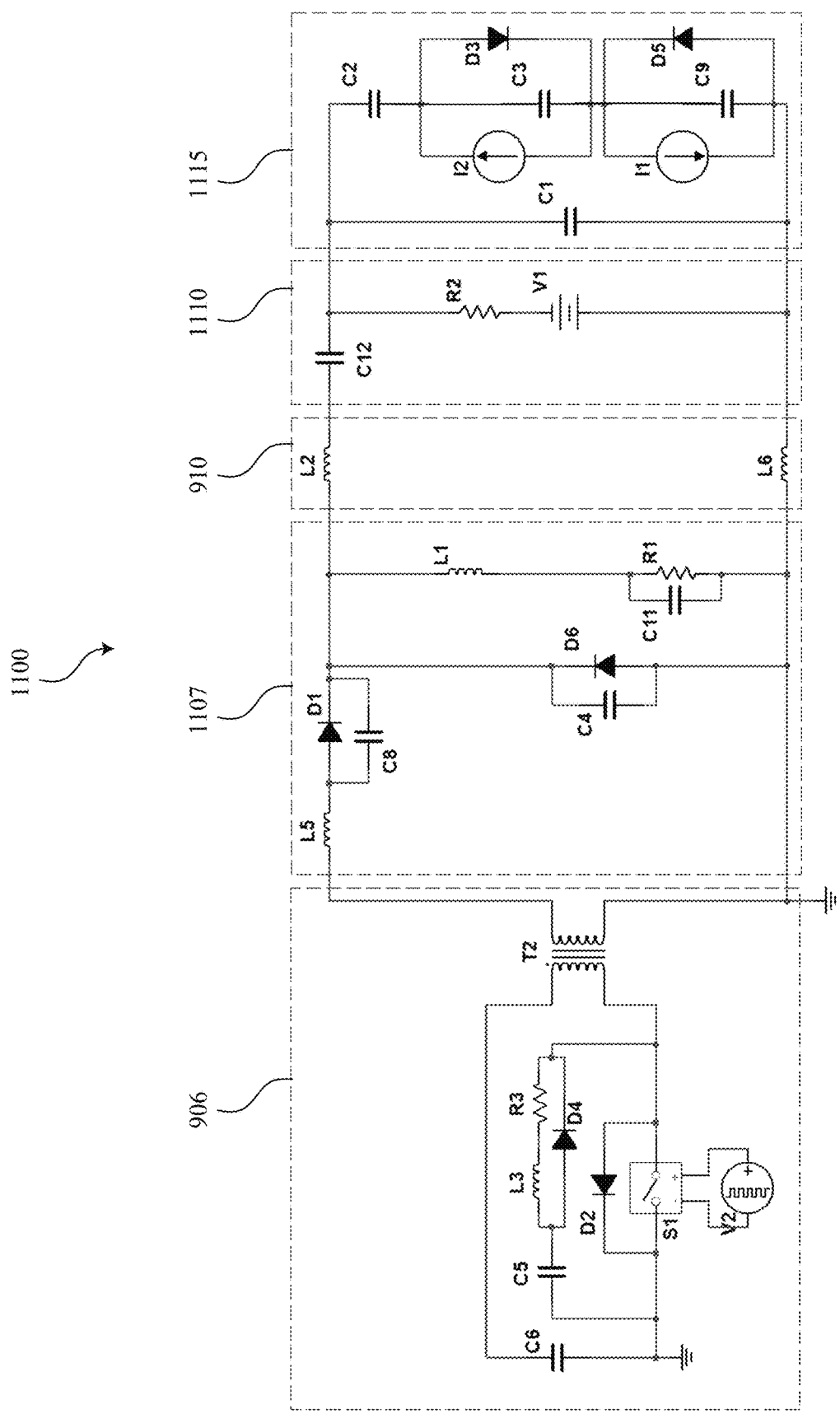
FIG. 11 is an example circuit with a resistive output stage according to some embodiments.

FIG. 11 shows another example circuit 1100 according to some embodiments. The circuit 1100 can be generalized into five stages (these stages could be broken down into other stages or generalized into fewer stages). The circuit 1100 includes pulser and transformer stage 906, a resistive output stage 1107, a lead stage 910, a DC bias power supply stage 1110, and a load stage 1115.

In this example, the load stage 1115 may represent an effective circuit for a plasma deposition system, plasma etch system, or plasma sputtering system. The capacitance C2 may represent the capacitance of the dielectric material upon which a wafer may sit. The capacitor C3 may represent the sheath capacitance of the plasma to the wafer. The capacitor C9 may represent capacitance within the plasma between a chamber wall and the top surface of the wafer. The current source I2 and the current source I1 may represent the ion current through the sheath.

In this example, the resistive output stage 1107 may include one or more inductive elements represented by inductor L1 and/or inductor L5. The inductor L5, for example, may represent the stray inductance of the leads in the resistive output stage 1107. Inductor L1 may be set to minimize the power that flows directly from the high voltage supply 906 into resistor R1.

In some embodiments, the resistor R1 may dissipate charge from the load stage 1115, for example, on fast time scales (e.g., 1 ns, 10 ns, 50 ns, 100 ns, 250 ns, 500 ns, 1,000 ns, etc. time scales). The resistance of resistor R1 may be low to ensure the pulse across the load stage 1115 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, a plurality of pulser and transformer stages 906 can be ganged up in parallel and coupled with the resistive output stage 1107 across the inductor L1 and/or the resistor R1. Each of the plurality of pulser and transformer stages 906 may each also include diode D1 and/or diode D6.

In some embodiments, the capacitor C8 may represent the stray capacitance of the blocking diode D1. In some embodiments, the capacitor C4 may represent the stray capacitance of the diode D6.

In some embodiments, the DC bias power supply stage 1110 may include DC a voltage source V1 that can be used to bias the output voltage either positively or negatively. In some embodiments, the capacitor C12 isolates/separates the DC bias voltage from the resistive output stage and other circuit elements. It allows for a potential shift from one portion of the circuit to another. In some applications the potential shift it establishes is used to hold a wafer in place. Resistance R2 may protect/isolate the DC bias supply from the high voltage pulsed output from circuit component group 906

Figure 12:
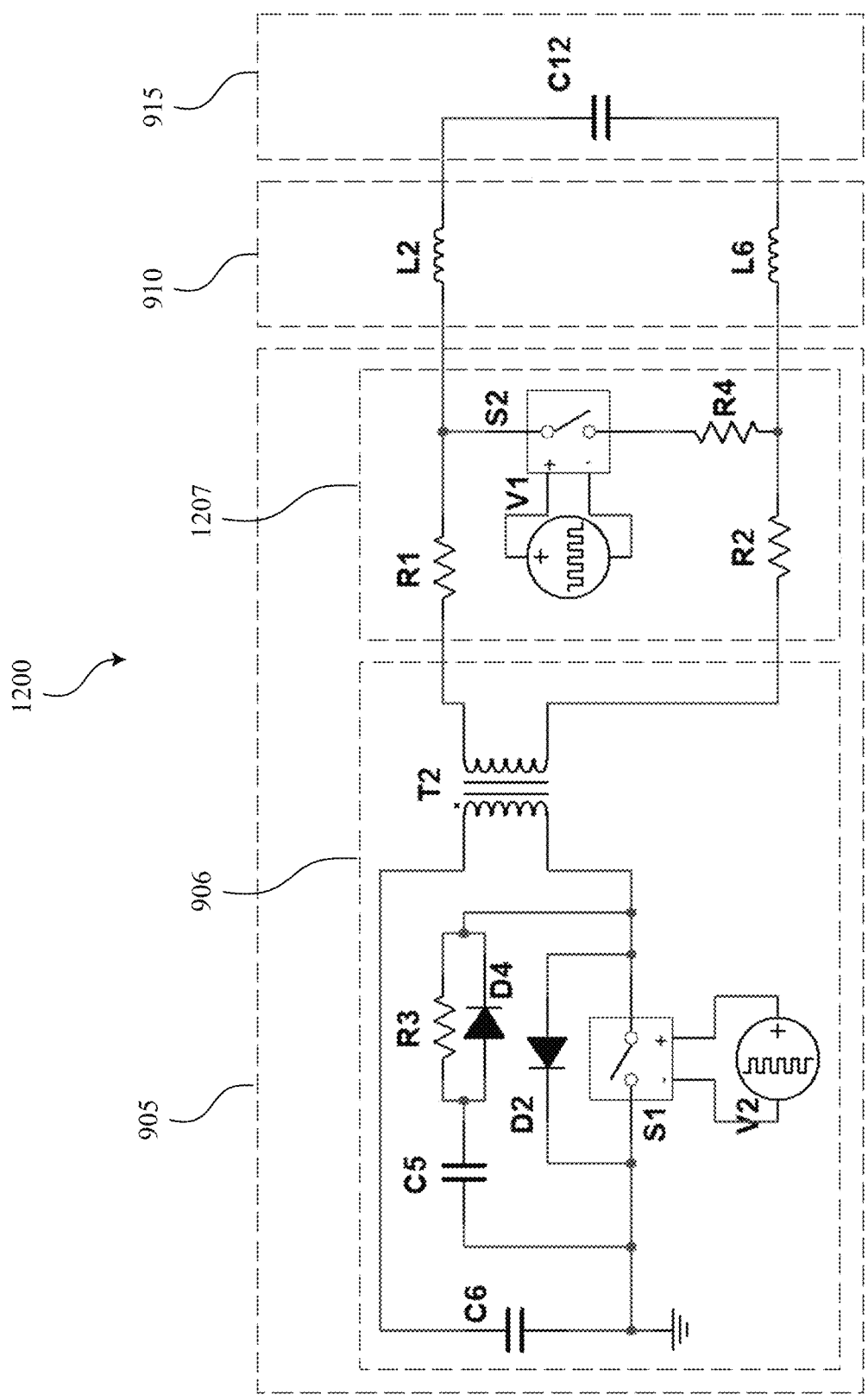
FIG. 12 is an example circuit with a resistive output stage according to some embodiments.

FIG. 12 shows another example circuit 1200 according to some embodiments. Circuit 1200 is similar to circuit 900 shown in FIG. 9. Resistive output stage 1207, in this example, however, includes switch S2, which may open and close based on a signal from voltage supply V1. The switch S2, for example, may be open while the load stage 915 is being charged by a signal from the pulser and transformer stage 906 such as, for example, when the switch(s) S1 in pulser and transformer stage 906 is closed. The switch S2, for example, may be closed to discharge any charge in the load stage 915 such as, for example, when the switch(s) S1 in pulser and transformer stage 906 is open. Because of the high voltages applied to the load stage 915, the voltages applied across the switch S2 will be large requiring a switch that is rated for high voltages. In addition, to allow for fast rise times and fast fall times at the load stage 915, the switch S2 may be required to switch quickly. Resistor R1 and resistor R2 may be small, and may represent stray resistance contained within conductors and cables. Resistor R4 may be selected to set a particular fall time for the energy/voltage dissipation from the load.

In another example, resistor R2 and inductor L6 may be about zero. This may allow the low side to be ground referenced, and may effectively create a single sided circuit topology instead of the differential output topology shown.

Figure 13:
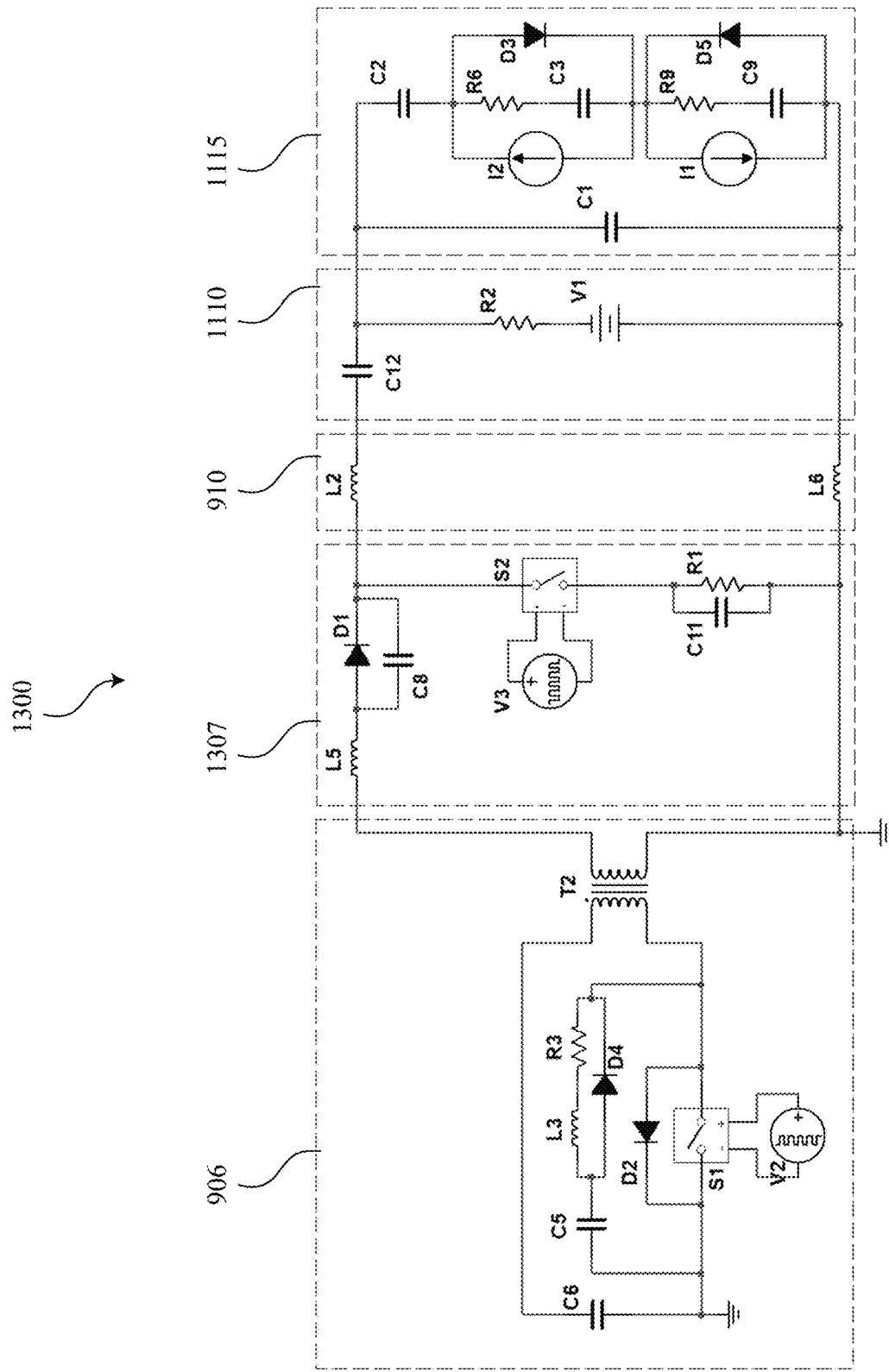
FIG. 13 is an example circuit with a resistive output stage according to some embodiments.

FIG. 13 shows another example circuit 1300. Circuit 1300 is similar to circuit 1100 shown in FIG. 11. Resistive output stage 1307, in this example, however, includes switch S2, which may open and close based on a signal from voltage supply V1. The switch S2, for example, may be open while the load stage 1115 is being charged by a signal from the pulser and transformer stage 906 such as, for example, when the switch(s) S1 in pulser and transformer stage 906 is closed. The switch S2, for example, may be closed to discharge any charge in the load stage 1115 such as, for example, when the switch(s) S1 in pulser and transformer stage 906 is open. Because of the high voltages applied to the load stage 1015, the voltages applied across the switch S2 will be large requiring a switch that is rated for high voltages. In addition, to allow for fast rise times and fast fall times at the load stage 1015, the switch S2 may be required to switch quickly. The resistor R1 may be selected to realize particular circuit rise times and/or fall times.

In some embodiments, the switch S2 described in FIG. 12 and/or FIG. 13 may include a high voltage switch. A high voltage switch may include a plurality of solid-state switches arranged in series.

Some embodiments include a high voltage switching power supply (e.g., switch S1 in FIG. 1 and FIG. 3, switch S1 and power supply P1 in FIG. 2, FIG. 4, and FIG. 5, FIG. 7, FIG., switch S2 and power supply V2 in FIGS. 9-13). Any type of high voltage switching power supply may be used that can produce high voltages at high frequencies with fast rise times and fast fall times. One example of a high voltage switching power supply includes nanosecond pulsers described in U.S. patent application Ser. Nos. 14/542,487, 14/635,991, and 14/798,154, which are incorporated into this document in their entirety for all purposes. Other examples of high voltage switching power supplies are described below.

Systems and methods are disclosed to provide high voltage and/or high power output waveforms with programmable control from Direct Current (DC) to greater than 100 kHz pulses with controllable duty cycles from 0 to 100%. In some embodiments, a system can include a pulse generator that is galvanically isolated.

There are number of potential challenges that must be overcome when designing a high voltage pulse generator. For example, slow rise times can be detrimental to a high voltage pulse generator especially when switching at high frequencies. For example, a high frequency pulse generator may not be able to switch quickly enough if the rise time is longer than the pulse period because the pulse may not reach the peak voltage before being switched off again.

As another example, a high voltage pulse generator may also smooth a high frequency input signal to generate a high voltage output signal that has a voltage higher than the input signal. In order to accomplish such smoothing, may require that the input signal include at least one of a high frequency, fast rise times, and fast fall times. In some embodiments, the high frequency of the input signal may be five to ten times greater than the output signal. Moreover, the higher the input frequency of the input signal, the smoother the output signal.

In some embodiments, the pulse generator may generate high voltage pulses with fast rise times of various types such as, for example, square waves, sinusoidal waves, triangular waves, arbitrary waves, long single pulses, multiple pulses, etc.

In some embodiments, a pulse generator may generate high voltage pulses having an arbitrary waveform that has a fast rise time (e.g., less than 1 µs). In some embodiments, a pulse generator may generate a high voltage pulses that have a variable duty cycle or user controlled duty cycle.

In some embodiments, a pulse generator can output high voltage greater than 0.5 kV, 1.0 kV, 2.0 kV, 5.0 kV, 10 kV, 15 kV, 20 kV, 25 kV, 50 kV, 100 kV, or 1,000 kV.

In some embodiments, the input signal may be greater than about 50 kHz or 100 kHz.

Embodiments described within this document do not include, for example, DC-DC converters, despite that some embodiments may be capable of generating a DC output. For example, a pulse generator does not simply convert a source of direct current (DC) from one voltage level to another. Indeed, embodiments described within this document are different than other pulse generators and/or different than DC-DC converters. For example, embodiments described within this document are not optimized for converting direct current from one voltage to another level. As another example, a pulse generator may produce pulses with long pulse widths, fast rise times, and/or fast fall times, but does not in general produce a DC output signal. Instead, some embodiments described within this document may produce high voltage pulses with fast rise times and/or fast fall times. Some embodiments described within this document may produce high voltage pulses having a long high voltage pulse or with a long pulse width that have a fast rise time and/or a fast fall time. Some embodiments described within this document may produce high frequency and high voltage pulses with any waveform shape. As another example, embodiments described within this document may produce one or more waveforms and/or signals with specifically designated very low frequency components as well as waveforms with specifically designated very high frequency components. Moreover, in some embodiments, a pulse generator may produce waveforms that are galvanically isolated from a reference potential (e.g., ground).

Figure 14:
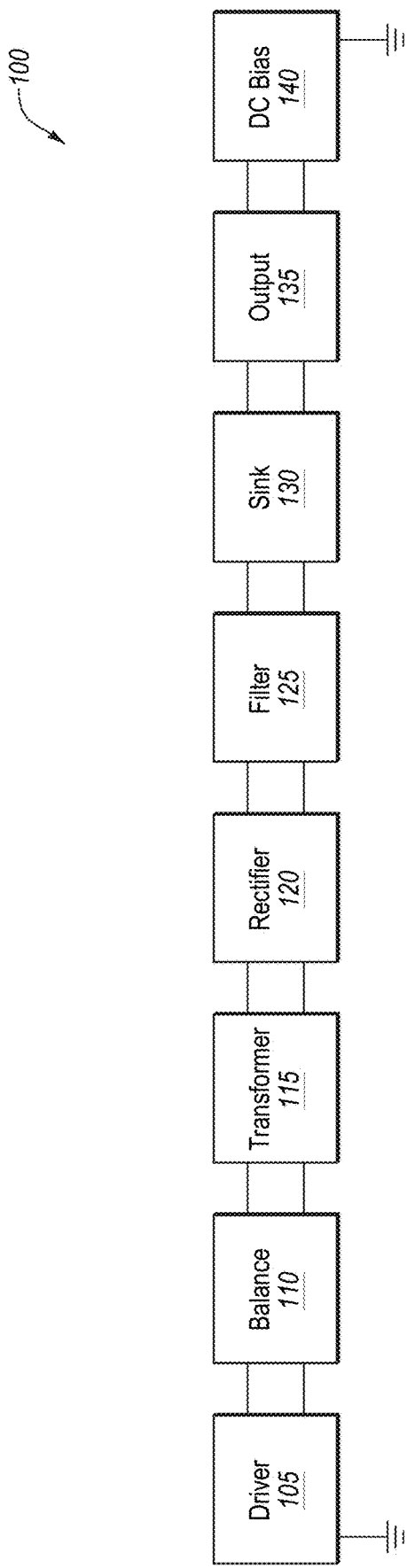
FIG. 14 is an example block diagram of a pulse generator according to some embodiments.

FIG. 14 is an example block diagram of a pulse generator 100 according to some embodiments. The pulse generator 100 may include one or more stages or blocks as shown in the figure. One or more of these stages may be removed, replaced with another stage, and/or combined with another stage. A driver stage 105 that includes any components or devices that may push or pull current. The driver stage 105 is coupled with a balance stage 110. The balance stage 110 can be used, for example, to keep a transformer stage 115 from saturating due to imbalanced current. The driver stage may include one or more energy sources, switches, bridges, etc. The one or more switches may include, for example, one or more IGBTs, switches, solid state switches, MOSFET, may be used to switch the energy source. As another example, the driver stage may include a waveform generator that may be used to produce an input waveform. In some embodiments, a waveform that is to be amplified may be provided to the driver from an external source. In some embodiments, an IGBT circuit(s) may be used with the driver stage 105 such as, for example, the IGBT circuit discussed in U.S. patent application Ser. No. 13/345,906, entitled Efficient IGBT Switching the entirety of which is incorporated by reference in its entirety.

Figure 17:
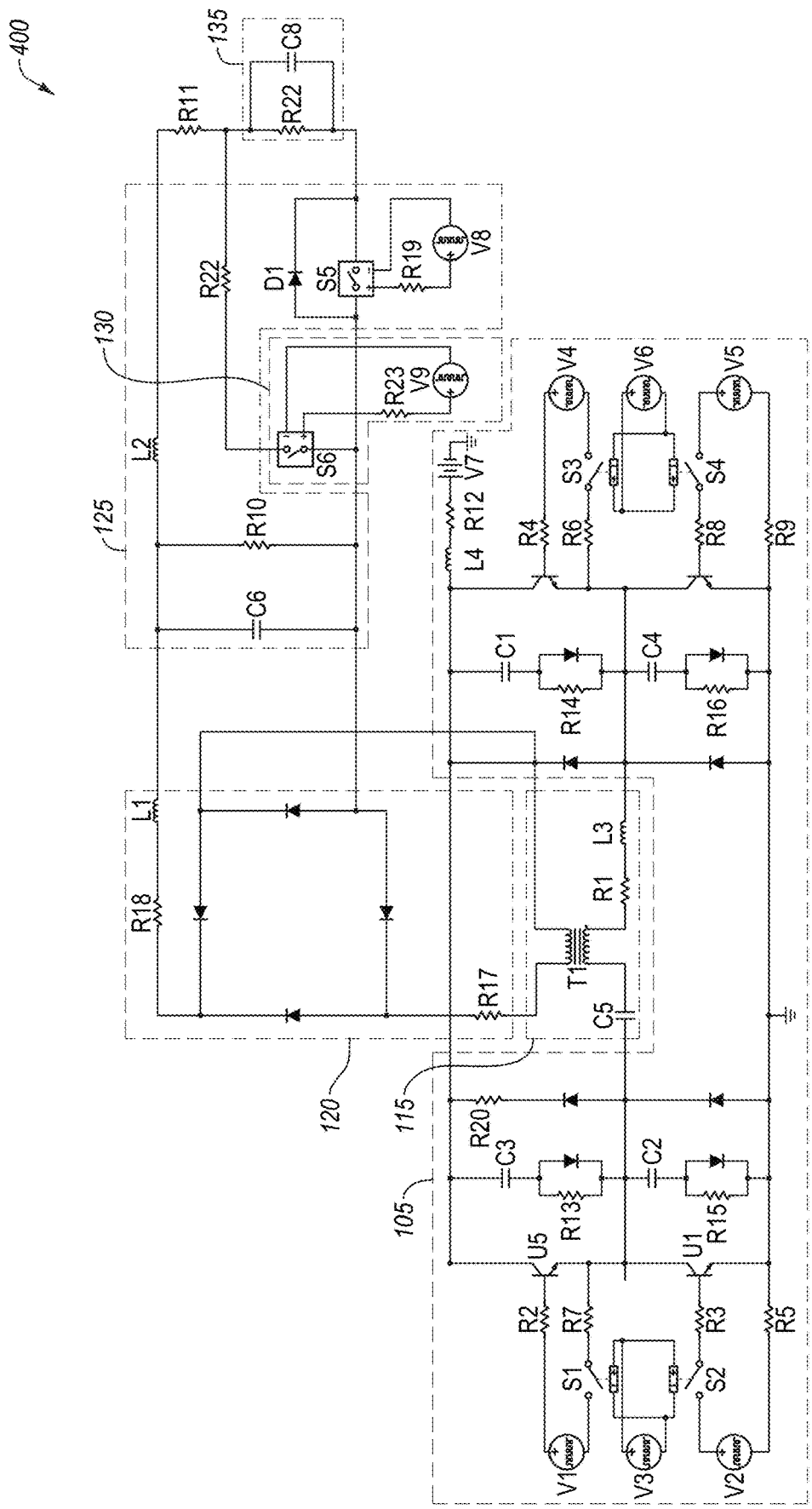
FIG. 17 is an example circuit diagram that may comprise all or part of a pulse generator according to some embodiments described in this document.

In some embodiments, the driver stage 105 may include an H-bridge, a half bridge, or a full bridge. An example of a full bridge configuration is shown in FIG. 17. Any number of configurations of input sources may be used without limitation. Various other configurations or circuits may be included such as, for example, resonant topologies and push-pull topologies.

At fixed voltage, the time rate of change of current through a given circuit may be inversely proportional to the inductance of the circuit. Thus, in some embodiments, in order to produce fast rise times, the driver stage 105, for example, may have a low total inductance. In some embodiments, the driver stage 105 may have a total inductance below 1,000 nH. In some embodiments, the inductance of all components, circuits, elements, etc. prior to a transformer or transformers of a transformer stage may have a total inductance less than 1,000 nH. In some embodiments, the inductance of all components, circuits, elements, etc. including the primary winding of one of more transformers of the transformer stage 115 may have an inductance less than 1,000 nH. In some embodiments, the inductance of all components, circuits, elements, etc. om the driver stage 105 and the balance stage 110 may have a total inductance less than 1,000 nH.

In some specific embodiments, the driver stage 105 may have a total inductance below 1,000 nH. In some specific embodiments, the inductance of all components, circuits, elements, etc. prior to a transformer or transformers of a transformer stage may have a total inductance less than 1,000 nH. In some specific embodiments, the inductance of all components, circuits, elements, etc. including the primary winding of one of more transformers of the transformer stage 115 may have an inductance less than 1,000 nH. In some specific embodiments, the inductance of all components, circuits, elements, etc. om the driver stage 105 and the balance stage 110 may have a total inductance less than 1,000 nH.

The balance stage 110 may also be coupled with the transformer stage 115 that may include one or more transformers each having any number of coils. The transformer stage 115 may also increase the voltage from the driver stage 105 and/or the balance stage 110 depending on the number of winds on either side of the transformer stage 115. The transformer stage 115 may provide, for example, galvanic isolation between the driver stage 105 and the output stage 135. The transformer stage 115 may also provide, for example, step up from the input voltage provided by the driver stage 105 to an increased voltage output.

The transformer stage 115 may be coupled with a rectifier stage 120. The filter stage 125 may be coupled with the rectifier stage 120. The filter stage 125 may include any number of components such as, for example, active components (e.g., switches, diodes, etc.) and/or passive components (e.g., inductors, capacitors, resistors, etc.)

The transformer stage may include a transformer that transforms an input signal into a high voltage output signal. The high voltage output signal may have a voltage of 500 volts, 1,000 volts, 2000 volts, 10,000 volts and/or 100,000 volts, or higher.

The sink stage 130 may be placed after the filter stage 125 as shown in FIG. 14 or placed before the filter stage 125. The sink stage 130 may, for example, dump energy, sink current, and/or rapidly reverse current flow of any energy stored in the filter stage 125 and/or the output stage 135.

The output stage 135 may be coupled with the sink stage 130 as shown in FIG. 14 or may be coupled with the filter stage 125 and/or the rectifier stage 120. The output stage 135 may include the load and/or the device to which the output signal is sent. The output stage 135 may be galvanically isolated form a reference signal, from ground, and/or from the driver stage 105. In some embodiments, the output stage can be floating or biased to any potential desired (e.g., with the DC bias stage 140). In some embodiments, the output stage 135 may output a signal with a rise time of less than 100 ns and/or a fall time of less than 100 ns.

The DC bias stage 140 may be coupled with the output stage 135 and may include any voltage source and/or power source. The DC bias stage 140, for example, may be connected with a reference signal, ground, and/or the driver stage. In some embodiments, the DC bias stage 140 may reference the potential of the output stage 135 to the potential of the driver stage 105 of the pulse generator 100. The DC bias stage 140, for example, may be coupled to the rectifier stage 120, the filter stage 125, the sink stage 130, and/or the output stage 135. The DC bias stage 140, for example, may be of any polarity and/or may include any voltage. In some embodiments, the DC bias stage 140 may provide a DC bias signal, for example, having a voltage greater than 0.01 kV, 0.1 kV, 1 kV, 3 kV, 10 kV, 30 kV, or 100 kV. In some specific embodiments, the DC bias voltage may be greater than 0.1 kV or 1 kV.

Figure 15A:
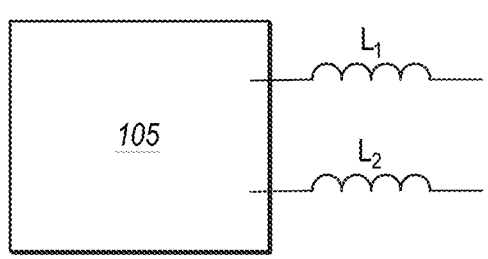
FIG. 15A is an example driver stage according to some embodiments described in this document.

FIG. 15A is an example driver stage 105 according to some embodiments described in this document. The driver stage 105, for example, may include any device or components that may push or pull current in the pulse generator 100. The driver stage 105, for example, may include one or more high voltage power supplies or voltage sources that may provide an input voltage of 50 volts, 100 volts, 200 volts, 300 volts, 400 volts, 500 volts, 600 volts, 700 volts, 800 volts, 900 volts, etc. to over 4500 volts. The driver stage 105, for example, may include one or more solid state switches such as, for example, one or more IGBTs and/or one or more MOSFETs that can be used to the switch the high voltage power supply. In some embodiments, the solid state switches may operate at voltages up to 2 kV or up to 4.5 kV.

In some embodiments, the driver stage 105 may include one or more H-bridge circuits and/or half-bridge circuits operated in parallel. Each H-bridge circuit may include, for example, one or more solid state switches. Moreover, the driver stage 105, for example, may or may not be coupled with a reference signal and/or with ground potential. The one or more solid state switches, for example, may switch at a frequency of 0.1 kHz, 1 kHz, 10 kHz, 100 kHz, 1,000 kHz, 10,000 kHz, etc.

In FIG. 15A, the stray inductance, L1 and L2, of the driver stage 105 singularly or in combination may be less than 1 nH, 10 nH, 100 nH, 1,000 nH, 10,000 nH, etc. In some specific embodiments, the stray inductance L1 and/or L2 may be less than 100 nH or 1,000 nH. In some specific embodiments, the stray inductance, L1 and L2, may represent and/or include all inductance such as, for example, stray inductance in the circuit, inductors, inductance in components, etc.

In some embodiments, the driver stage 105 may include one or more power sources that may provide voltage at 50 volts, 100 volts, 200 volts, 300 volts, 400 volts, 500 volts, 600 volts, 700 volts, 800 volts, 900 volts, etc. to over 4500 volts. In some specific embodiments, the voltage provided by the one or more power sources in the driver stage 105 may be greater than 100 V or 500 V.

Figure 15B:
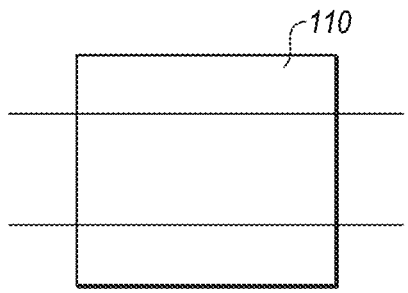
FIG. 15B is an example balance stage according to some embodiments described in this document.

FIG. 15B is an example balance stage 110 according to some embodiments described in this document. In FIG. 15B, the balance stage 110 is not used and/or may not include, for example, any active or passive components except, possibly, a connection between the driver stage 105 and the transformer stage.

Figure 15C:
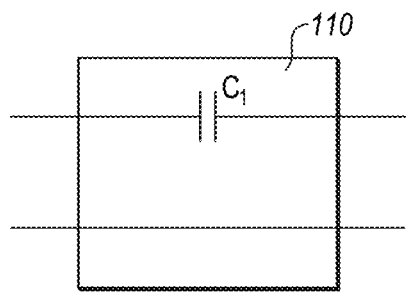
FIG. 15C is an example balance stage according to some embodiments described in this document.

FIG. 15C is another example balance stage 110 according to some embodiments described in this document. In this example, the balance stage 110 includes blocking capacitor C1, which may keep the transformer stage 115 from saturating due to imbalanced current from the driver stage 105.

The blocking capacitor C1 may have a capacitance value of greater than 1 µF, 10 µF, 100 µF, 1,000 µF, 10,000 µF, etc.

Figure 15D:
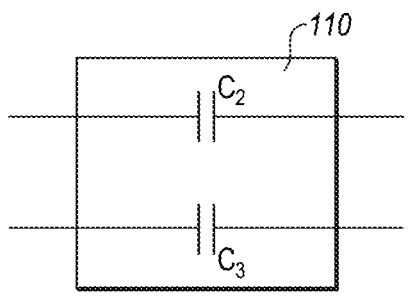
FIG. 15D is an example balance stage according to some embodiments described in this document.

FIG. 15D is another example balance stage 110 according to some embodiments described in this document. In this example, the balance stage 110 includes blocking capacitor C2 and blocking capacitor C3, which may keep the transformer stage 115 from saturating due to imbalanced current from the driver stage 105. The blocking capacitor C2, for example, may have a capacitance value of greater than 1 µF, 10 µF, 100 µF, 1,000 µF, 10,000 µF, etc. The blocking capacitor C3 may have a capacitance value of greater than 1 µF, 10 µF, 100 µF, 1,000 µF, 10,000 µF, etc.

Figure 15E:
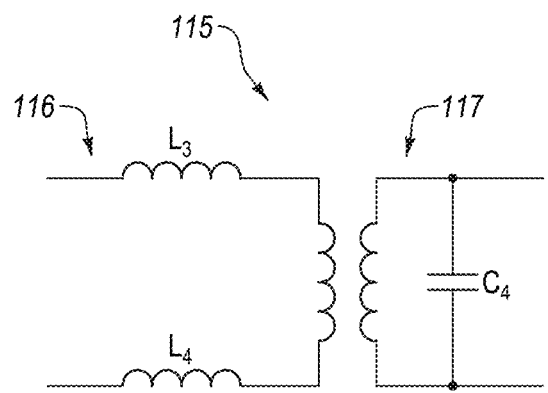
FIG. 15E is an example transformer stage according to some embodiments described in this document.

FIG. 15E is an example transformer stage 115 according to some embodiments described in this document. The transformer stage 115, for example, may include one or more transformers. A transformer of the transformer stage 115, for example, may step up the voltage provided by the driver stage 105 to a higher voltage such as for example, over 500 volts, 1500 volts, 2500 volts, 50,000 volts, 250,000 volts, etc.

The transformer, for example, may include a primary side 116 and a secondary side 117. The primary side 116 may have a total effective series stray inductance L3 and L4 that may have an inductance singularly or in combination of less than 10 nH, 100 nH, 1,000 nH, or 10,000 nH. In some specific embodiments, the total effective series stray inductance L3 and L4 may be less than 1,000 nH. In some specific embodiments, the secondary side 117 may have a total effective parallel stray capacitance C4 of less than 1 pF, 10 pF, 100 pF, 1,000 pF, 10,000 pF, etc. In some specific embodiments, the total effective parallel stray capacitance C4 may be less than 100 pF or 1,000 pF.

The transformer stage 115 may comprise any type of transformer. In some embodiments, the transformer may include primary windings on the primary side 116 and secondary windings on the secondary side 117 that are both wrapped around a magnetic core such as, for example, a ferrite core. The ratio ($N_s/N_p$) of the number secondary windings ($N_s$) to the number of primary windings ($N_p$) may be greater than 2, 4, 5, 5.5, 8, 10, 150, 600, etc.

In some embodiments, the transformer stage 115 may include one or more transformers arranged in parallel with each other.

In some embodiments, the transformer stage 115 may output a voltage greater than 1 kV, 2 kV, 5 kV, 10 kV, 30 kV, 100 kV, 300 kV, or 1,000 kV.

Figure 15F:
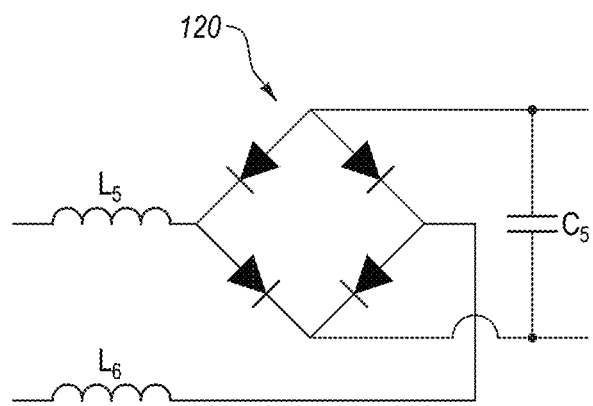
FIG. 15F is an example rectifier stage according to some embodiments described in this document.

FIG. 15F is an example rectifier stage 120 according to some embodiments described in this document. The rectifier stage 120 may include, for example, total effective series stray inductance L5 and L6 singularly or in combination of less than 10 nH, 100 nH, 1,000 nH, 10,000 nH, etc. In some specific embodiments, the effective series stray inductance L5 and L6 singularly or in combination may be less than 1,000 nH. In some other specific embodiments, the effective series stray inductance L5 and L6 singularly or in combination may be less than 100 nH. In some embodiments, the rectifier stage 120 may include total effective parallel stray capacitance C5 of less than 1 pF, 10 pF, 100 pF, 1,000 pF, 10,000 pF, etc. In some specific embodiments, the capacitance of the total effective parallel stray capacitance C5 may be less than 1,000 pF. In some specific embodiments, the capacitance of the total effective parallel stray capacitance C5 may be less than 200 pF. The rectifier stage 120 may also include a plurality of diodes, that may be used in series and/or parallel configurations that are designed and have specifications sufficient for high voltage and/or high power applications.

The rectifier stage 120 may include any type of rectifier such as, for example, a single phase rectifier, a single phase half wave rectifier, a single phase full wave rectifier, a full wave rectifier, a three-phase rectifier, a three-phase half wave circuit, a three-phase bridge rectifier, a two pulse bridge, a twelve pulse bridge, etc. In some embodiments, more than one rectifier may be used in series and/or parallel.

Figure 16A:
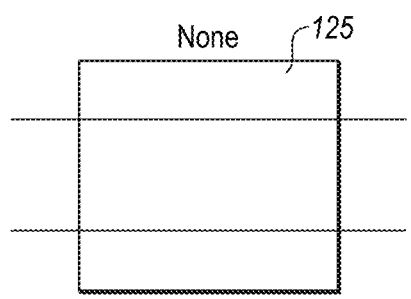
FIG. 16A is an example filter stage according to some embodiments described in this document.
Figure 16B:
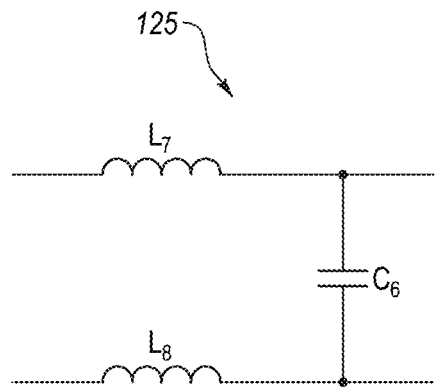
FIG. 16B is an example filter stage according to some embodiments described in this document.
Figure 16C:
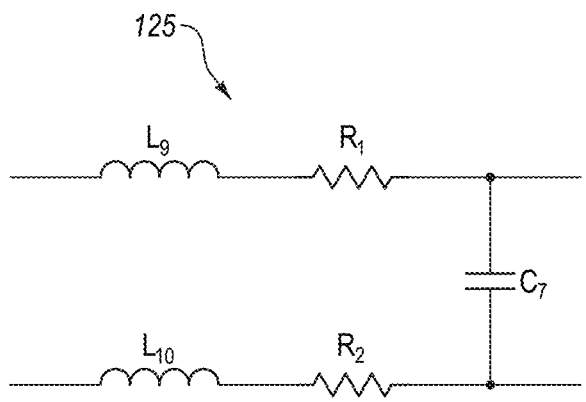
FIG. 16C is an example filter stage according to some embodiments described in this document.

The filter stage 125 may include a number of different configurations depending on the type of specification and/or application. Three examples are shown in FIG. 16A, FIG. 16B, and FIG. 16C. In some embodiments, the filter may include only passive elements such as, for example, inductors, capacitors, resistors, etc. Various other configurations may be used.

FIG. 16A is an example filter stage 125 according to some embodiments described in this document. In this configuration, the filter stage 125 does not include any components. In this configuration, the output of the rectifier stage 120 may be tied directly with the output stage 135 and/or the load. This filter stage may be used to produce an output signal that includes at least one of fast rise times, fast fall times, and high frequencies, etc.

FIG. 16B is an example filter stage 125 according to some embodiments described in this document. In this configuration, the filter stage 125 may include total effective series inductance L7 and L8 singularly or in combination of less than 0.1 µH, 1 µH, 10 µH, 100 µH, 1,000 µH, 10,000 µH, etc. In some specific embodiments, the total effective series inductance L7 and L8 singularly or in combination may be less than 30 µH. The filter stage 125 may include total effective parallel capacitance C6 of less than 0.01 nF, 0.1 nF, 1 nF, 10 nF, 100 nF, 1,000 nF, etc. In some specific embodiments, the total effective parallel capacitance C6 may be less than 300 µF or 30 µF. This configuration, for example, may be used to smooth an input waveform provided by the driver stage 105 and/or allow for an arbitrary waveform.

FIG. 16C is an example filter stage 125 according to some embodiments described in this document. In this configuration, the filter stage 125 may include total effective series inductance L9 and L10 singularly or in combination of less than 0.1 µH, 1 µH, 10 µH, 100 µH, 1,000 µH, 10,000 µH, etc. In specific embodiments, the total effective series inductance L9 and L10 singularly or in combination may be less than 30 µH.

In some embodiments, the filter stage 125 may include total effective parallel capacitance C7 of less than 0.01 nF, 0.1 nF, 1 nF, 10 nF, 100 nF, 1,000 nF, etc. In some specific embodiments, the total effective parallel capacitance C7 may be less than 300 µH or 30 µH. The filter stage 125 may include, for example, total effective parallel resistance R1 and R2 singularly or in combination of less than 0.1 Ohms, 1 Ohms, 10 Ohms, or 100 Ohms. In some specific embodiments, the total effective parallel resistance R1 and R2 singularly or in combination may be less than 10 Ohms or less than 1 Ohm. This configuration, for example, may be used to smooth an input waveform provided by the driver stage 105 and/or allow for an arbitrary waveform.

Various other configurations of filter stage 125 may be used.

Figure 16D:
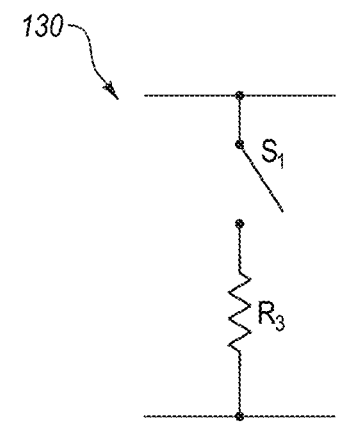
FIG. 16D is an example sink stage according to some embodiments described in this document.

FIG. 16D is an example sink stage 130 according to some embodiments described in this document. Sink stage 130 may include a switch S1 and a resistance R3. The resistance R3 may include stray resistance and/or a resistor that may be used to limit the current flowing through switch S1. When the switch S1 is closed, the sink stage 130 may rapidly dump energy that may be stored in the filter stage 125 and/or the output stage 135 such as, for example, any energy stored in a capacitor in the filter stage 125 and/or the output stage 135. In some embodiments, the sink stage 130 may be located between the filter stage 125 and the rectifier stage 120. In other embodiments the sink stage 130 may be disposed between the filter stage 125 and the output stage 135.

FIG. 17 is an example circuit diagram 400 that may comprise all or part of a pulse generator according to some embodiments described in this document. The circuit diagram 400 includes driver stage 105, transformer stage 115, rectifier stage 120, filter stage 125, sink stage 130, and output stage 135.

In some embodiments, the output stage 135 can be galvanically isolated from ground, from the driver stage, and/or from any reference potential.

In this embodiment, the filter stage 125 includes a switch S5. The output of the rectifier stage 120 can then be directly switched by the switch S5.

The sink stage 130 may include switch S6. In some embodiments, switch S5 and switch S6 may be fast switches that open and close within 1 µs or faster. In some embodiments, the switch S5 and/or the switch S6 are switches that may operate at high frequencies.

Figure 18A:
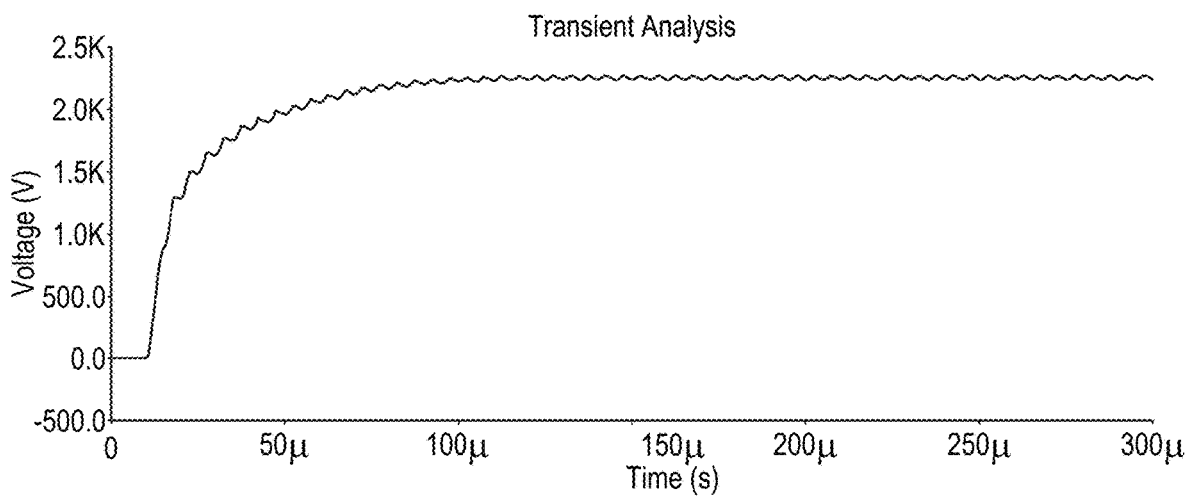
FIGS. 18A, 18B and 18C are example graphs of an output pulse according to some embodiments described in this document.
Figure 18B:
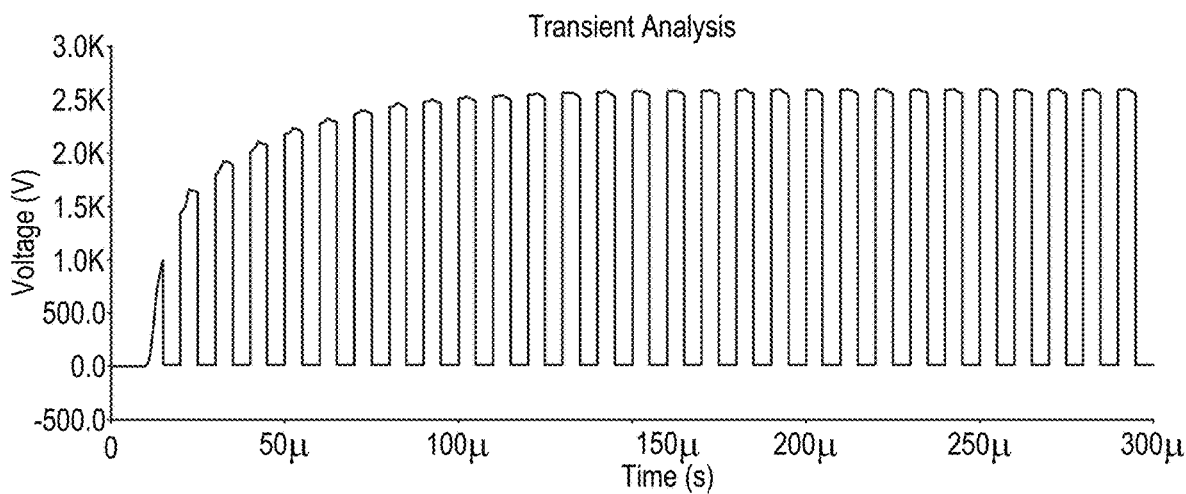
Figure 18C:
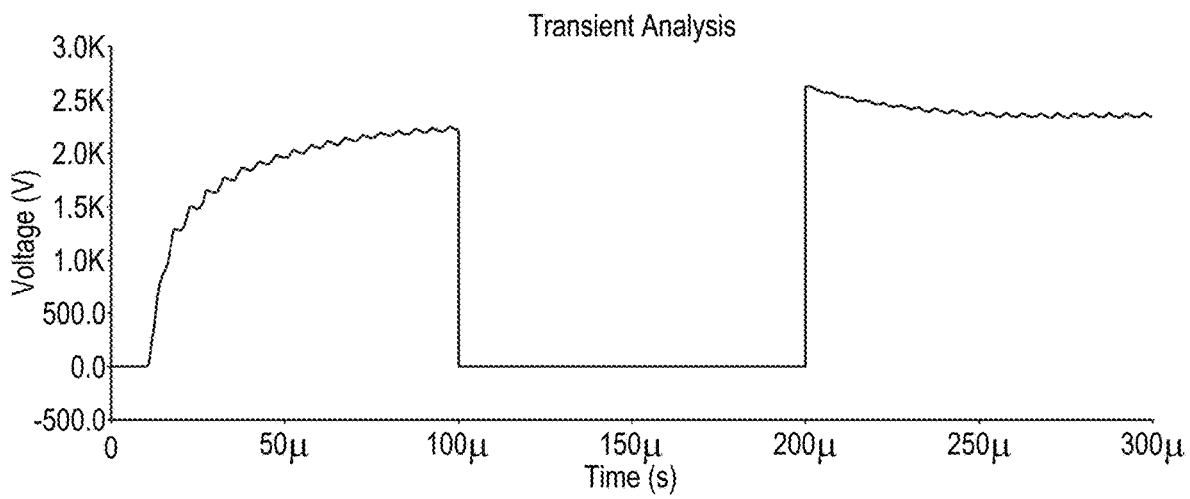

When the switch S5 is closed DC power can be sourced to the output stage 135 (or the load R22 and/or R11). A graph of the voltage over time at the output stage 135 is shown in FIG. 18A. If switch S5 is switched on and off, then a pulsed waveform can be sourced to the output stage 135 as shown in FIG. 18B and FIG. 18C. Switch S6 can be opened when switch S5 closes and closed when switch S5 opens. When switch S6 is closed, capacitance can be drained from the load capacitance represented as C8. The switches used by switch S5 and/or switch S6 may operate at high power, high frequency, with variable duty cycle, at variable pulse widths, etc.

Switch S5 and/or switch S6 may include one or more solid state switches such as, for example, one or more MOSFETs and/or one or more IGBTs. Moreover, in some embodiments, switch S5 and/or switch S6 may also include one or more switches stacked, arranged in parallel, and/or arranged in series.

In some embodiments, a controller may be included that controls the operation and/or timing of switch S5 and/or switch S6 as the duty cycle, pulse width, and/or frequency are changed and to ensure that switch S5 is closed when switch S6 is open and vice-versa. These switches may include solid state switches and/or IGBT circuits discussed in U.S. patent application Ser. No. 13/345,906, entitled Efficient IGBT Switching the entirety of which is incorporated into this document by reference in its entirety.

In some embodiments, the emitter of switch S5 and/or switch S6 may not be referenced back to ground. That is, the emitter of switch S5 and/or switch S6 may be galvanically isolated from all or part of the circuit. Moreover, the gate of switch S5 and/or switch S6 may be isolated using a fiber optic receiver and/or a fiber optic device.

In some embodiments, the size, shape, frequency, and/or duty cycle of pulses produced by the pulse generator may be controllable (or varied by user input). For example, the pulses can vary from a DC output to a 10 MHz output with duty cycles from 0% to 100%. In some embodiments, the galvanic isolation allows the output waveform potential to be set to arbitrary potential levels with respect to other system potentials. In some embodiments galvanic isolation may be 500 V, 1 kV, 2 kV, 3 kV, 5 kV, 10 kV, 20 kV, 100 kV, etc. with respect to other potentials. Some embodiments include a combination of two or more output stages to both provide and to sink high power and/or currents to and from the load. The combination of output stages may allow for precise control of arbitrary pulses to be delivered to both resistive and capacitive loads.

FIGS. 18A, 18B and 18C illustrate the variability of the output from a pulse generator. FIG. 18A is an example graph of a DC output pulse of over 2 kV. FIG. 18B is an example graph of an output pulse of over 2 kV pulsing at 100 kHz. And FIG. 18C is an example graph of an output pulse of over 2 kV pulsing at 5 kHz. Various other frequencies and/or amplitudes may be output using embodiments described in this document.

Figure 19:
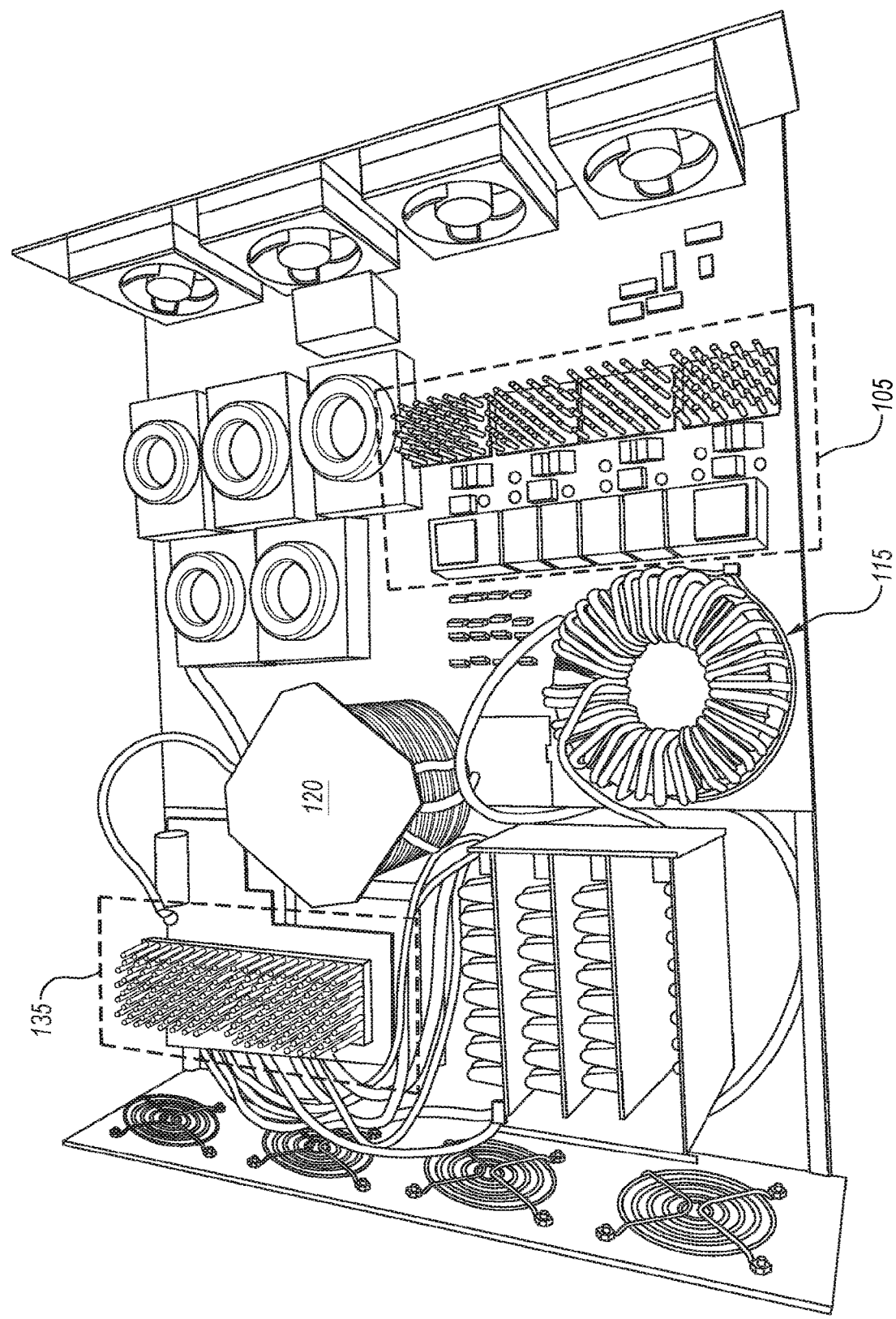
FIG. 19 is an example pulse generator according to some embodiments described in this document.

FIG. 19 is an example pulse generator according to some embodiments described in this document. The pulse generator includes an output stage 135, a rectifier stage 120, a transformer stage 115, and a driver stage 105.

Figure 20A:
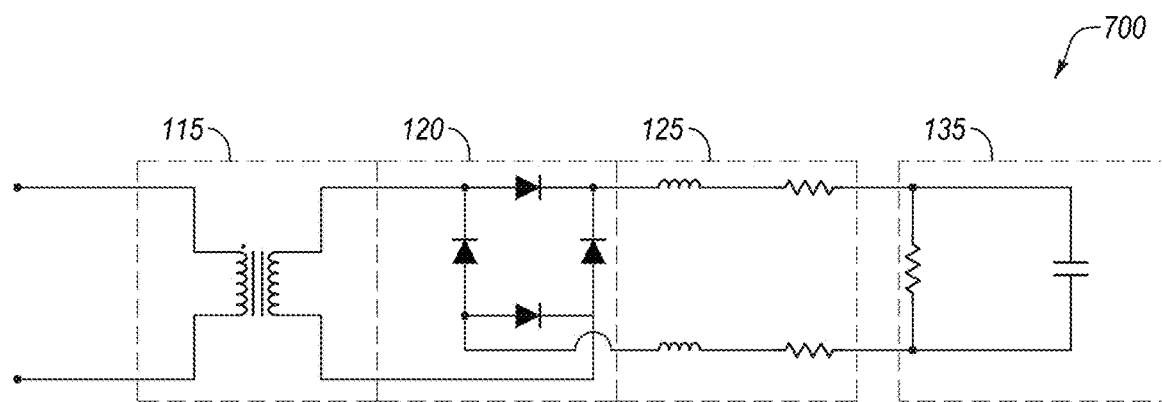
FIG. 20A is an example circuit diagram of a portion of a pulse generator according to some embodiments described in this document.

FIG. 20A is an example circuit diagram 700 of a portion of a pulse generator according to some embodiments described in this document. The circuit diagram 700 shows a transformer stage 115 that includes a 1:5.5 transformer. The circuit diagram 700 also shows a rectifier stage 120, a filter stage 125, and an output stage 135. The filter stage 125 in this example includes circuit elements that include two 125 µH inductors and two 10 ohm resistors. While this example shows specific circuit elements with specific values, various other elements may be included. The output stage 135 includes a 250 Ohm load with 2 nF capacitance.

Figure 20B:
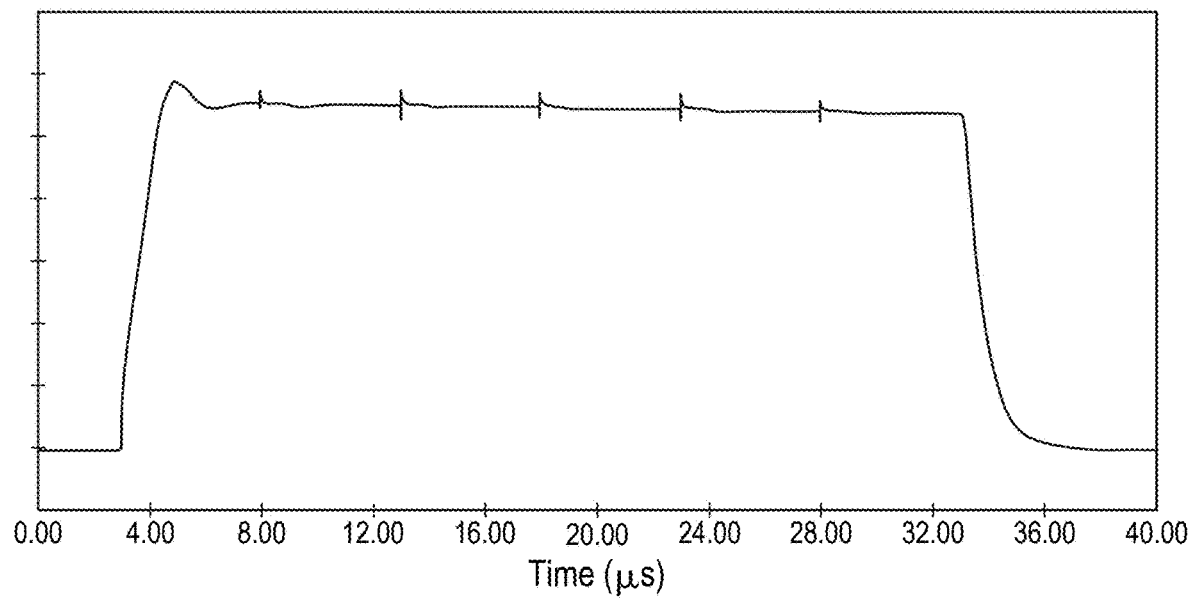
FIG. 20B is an example of an output waveform produced from the pulse generator shown in FIG. 20A.

FIG. 20B is an example of an output waveform produced from the portion of a pulse generator shown in FIG. 20A. The input waveform may include a low voltage (e.g., less than 200 V) input square waveform that may be provided via $V_{CH}$ and/or the driver stage 105. The input square waveform in this example was square wave with 5 µs pulse widths such as, for example, the waveform shown in FIG. 24A. As shown, the output waveform has an approximately 2 µs rise time and/or a very clean pulse.

Figure 21A:
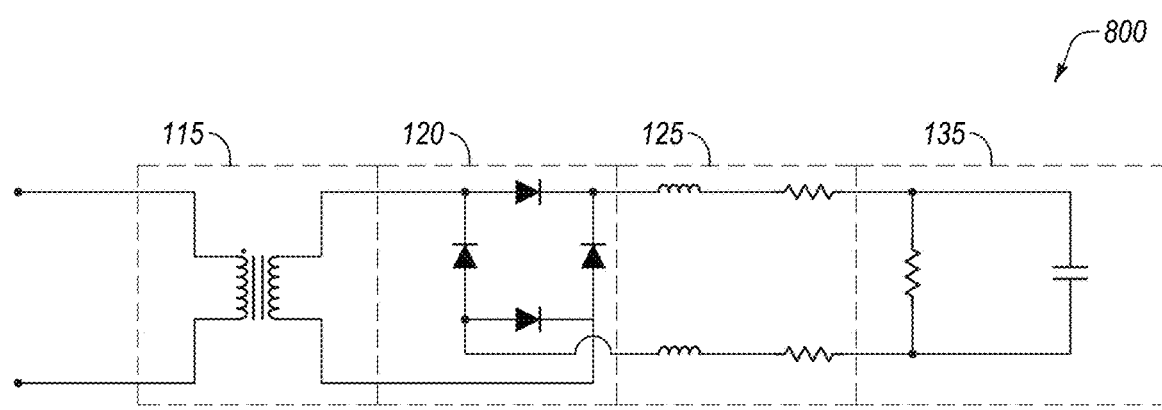
FIG. 21A is an example circuit diagram of a portion of a pulse generator according to some embodiments described in this document.

FIG. 21A is an example circuit diagram 800 of a portion of a pulse generator according to some embodiments described in this document. The circuit diagram 800 shows a transformer stage 115 that includes a 1:5.5 transformer. The circuit diagram 800 also shows a rectifier stage 120, a filter stage 125, and an output stage 135. The filter stage 125 in this example includes circuit elements that include two 480 µH inductors and two 10 ohm resistors. While this example shows specific circuit elements with specific values, various other elements may be included. The output stage 135 includes a 1 kOhm load with 470 pF capacitance.

Figure 21B:
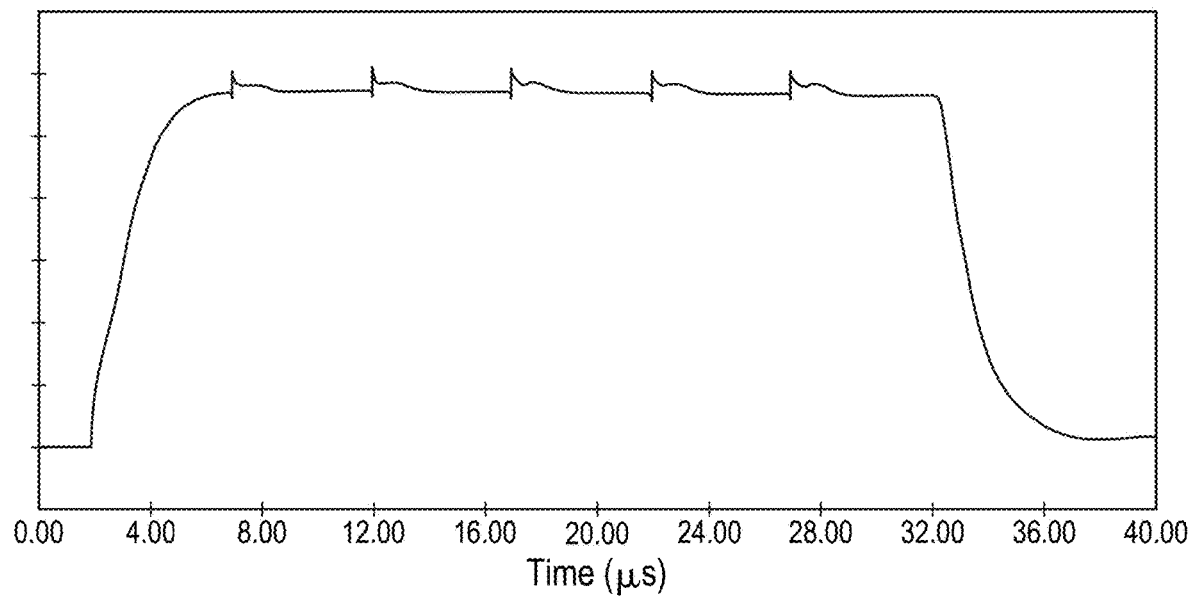
FIG. 21B is an example of an output waveform produced from the pulse generator shown in FIG. 21A.

FIG. 21B is an example of an output waveform produced from the pulse generator shown in FIG. 21A. The input waveform may include a low voltage (e.g., less than 200 V) input square waveform that may be provided via $V_{CH}$ and/or the driver stage 105. The input square waveform in this example was square wave with 5 µs pulse widths such as, for example, the waveform shown in FIG. 24A. As shown, the output waveform has an approximately 2 µs rise time and/or a relatively clean pulse.

Figure 22A:
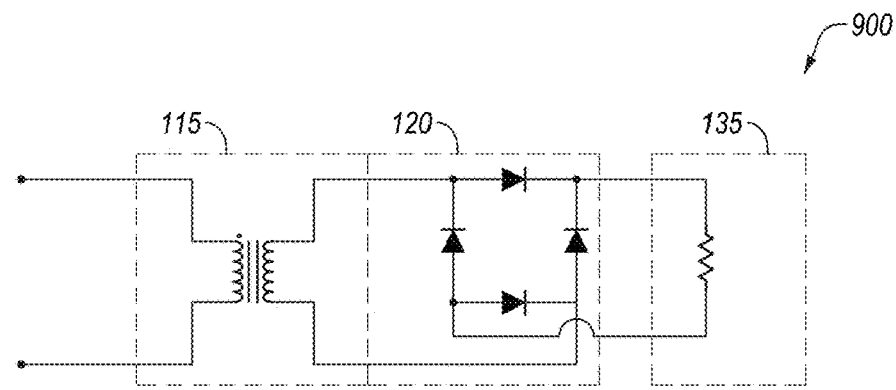
FIG. 22A is an example circuit diagram of a portion of a pulse generator according to some embodiments described in this document.

FIG. 22A is an example circuit diagram 900 of a portion of a pulse generator according to some embodiments described in this document. The circuit diagram 900 shows a transformer stage 115 that includes a 1:5.5 transformer. The circuit diagram 900 also shows a rectifier stage 120 and an output stage 135, but no filter stage 125. The output stage 135 includes a 250 Ohm load.

Figure 22B:
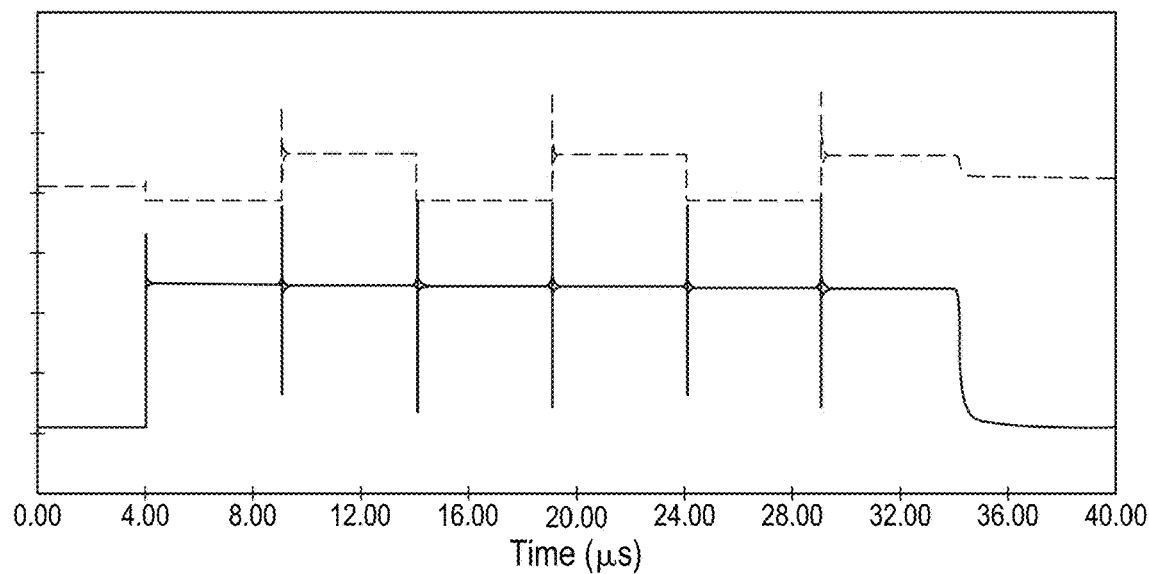
FIG. 22B is an example of an output waveform produced from the pulse generator shown in FIG. 22A.

FIG. 22B is an example of an output waveform produced from the pulse generator shown in FIG. 22A compared with the input waveform. A 200 V input square wave (dashed) was provided via $V_{CH}$. As shown, the output waveform (solid) has a very sharp rise time and maintains a relatively clean flat top with some slight ripple.

Figure 22C:
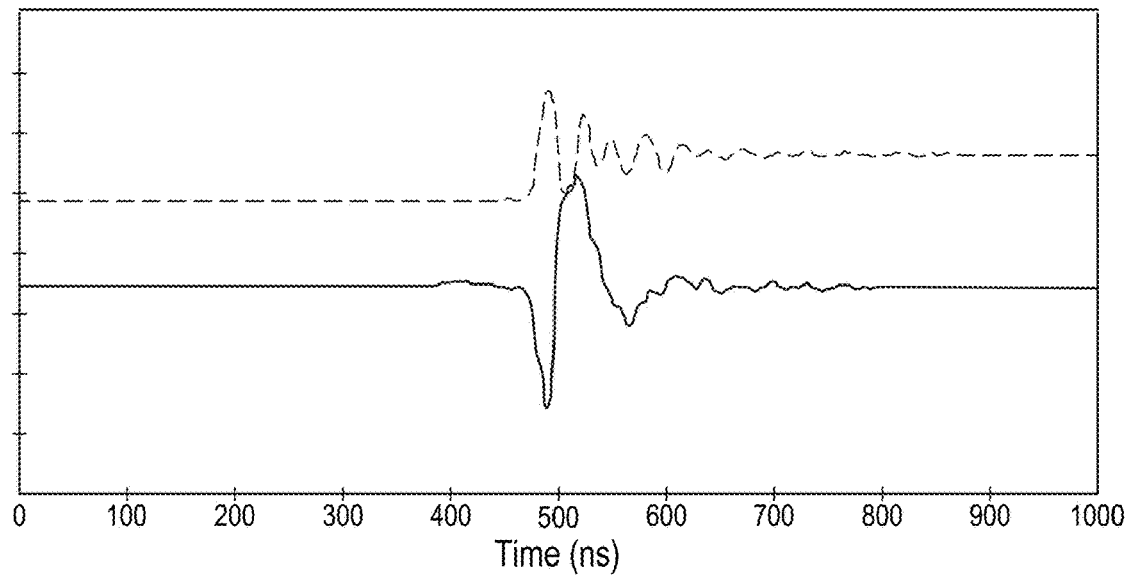
FIG. 22C is another example of an output waveform produced from the pulse generator shown in FIG. 22A.

FIG. 22C is an example of an output waveform produced from the pulse generator shown in FIG. 22A compared with the input waveform into the transformer stage 115. The input waveform may include a low voltage (e.g., less than 200 V) input square waveform that may be provided via $V_{CH}$. As shown, the output waveform has a very sharp rise time and maintains a relatively clean flat top with some slight ripple.

Figure 23A:
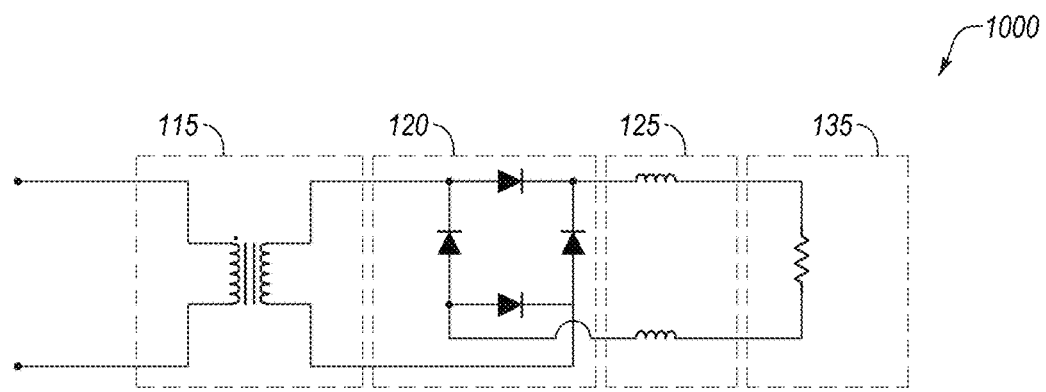
FIG. 23A is an example circuit diagram of a portion of a pulse generator according to some embodiments described in this document.

FIG. 23A is an example circuit diagram 1,000 of a portion of a pulse generator according to some embodiments described in this document. The circuit diagram 1,000 shows a transformer stage 115 that includes a 1:5.5 transformer. The circuit diagram 1,000 also shows a rectifier stage 120, a filter stage 125, and an output stage 135. The filter stage 125 in this example includes circuit elements that include two 450 µH inductors. While this example shows specific circuit elements with specific values, various other elements may be included. The output stage 135 includes a 250 Ohm load.

Figure 23B:
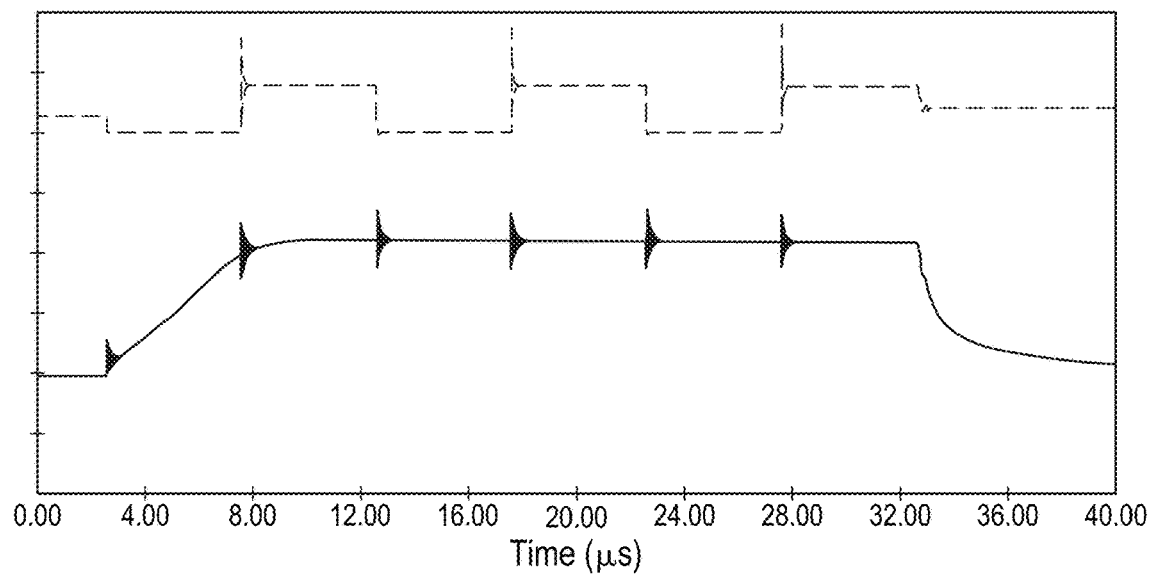
FIG. 23B is an example of an output waveform produced from the pulse generator shown in FIG. 23A compared with the input waveform.

FIG. 23B is an example of an output waveform produced from the pulse generator shown in FIG. 23A compared with the input waveform. A 200 V input square wave (dashed) was provided via $V_{CH}$. As shown, the output waveform (solid) has a sharp rise time and maintains a clean flat top with some slight ripple.

Figure 23C:
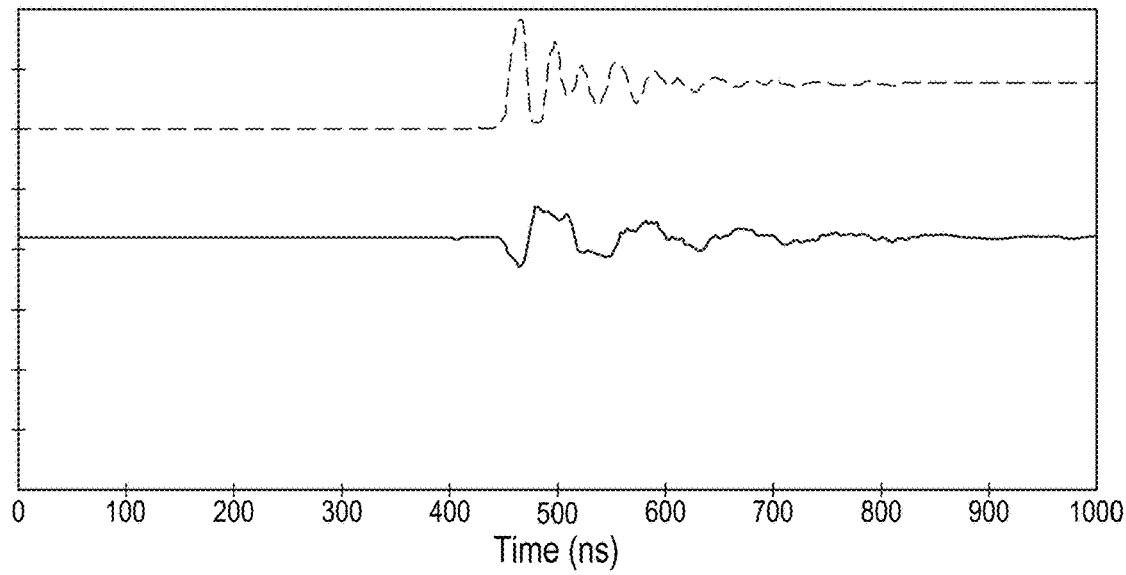
FIG. 23C is an example of an output waveform produced from the pulse generator shown in FIG. 23A compared with the input waveform.

FIG. 23C is an example of an output waveform produced from the pulse generator shown in FIG. 23A compared with the input waveform. A 200 V input wave (dashed) with an arbitrary shape was provided via $V_{CH}$. As shown, the output waveform has a very sharp rise time and maintains a relatively clean flat top with some slight ripple.

Figure 24A:
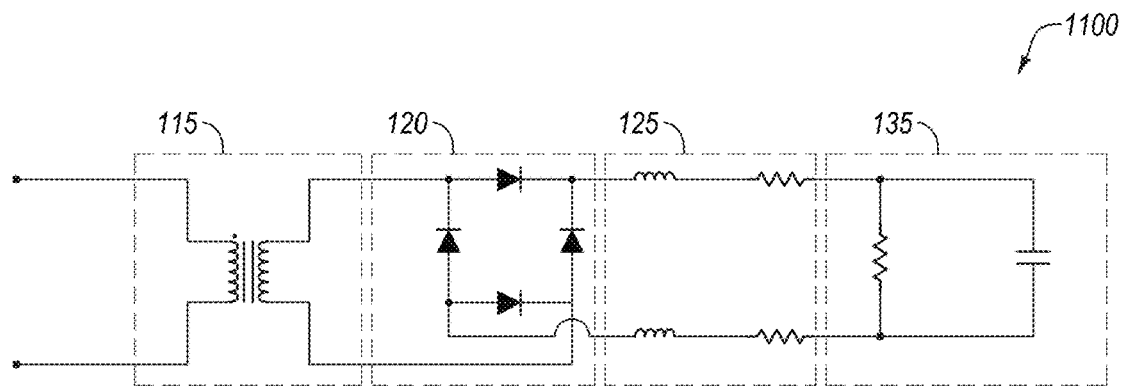
FIG. 24A is an example circuit diagram of a portion of a pulse generator according to some embodiments described in this document.

FIG. 24A is an example circuit diagram 1100 of a portion of a pulse generator according to some embodiments described in this document. The circuit diagram 1100 shows a transformer stage 115 that includes a 1:5.5 transformer. The circuit diagram 1100 also shows a rectifier stage 120, a filter stage 125, and an output stage 135. The filter stage 125 in this example includes circuit elements that include two 125 µH inductors and two 10 ohm resistors. While this example shows specific circuit elements with specific values, various other elements may be included. The output stage 135 includes a 250 Ohm load with 2 nF capacitance.

Figure 24B:
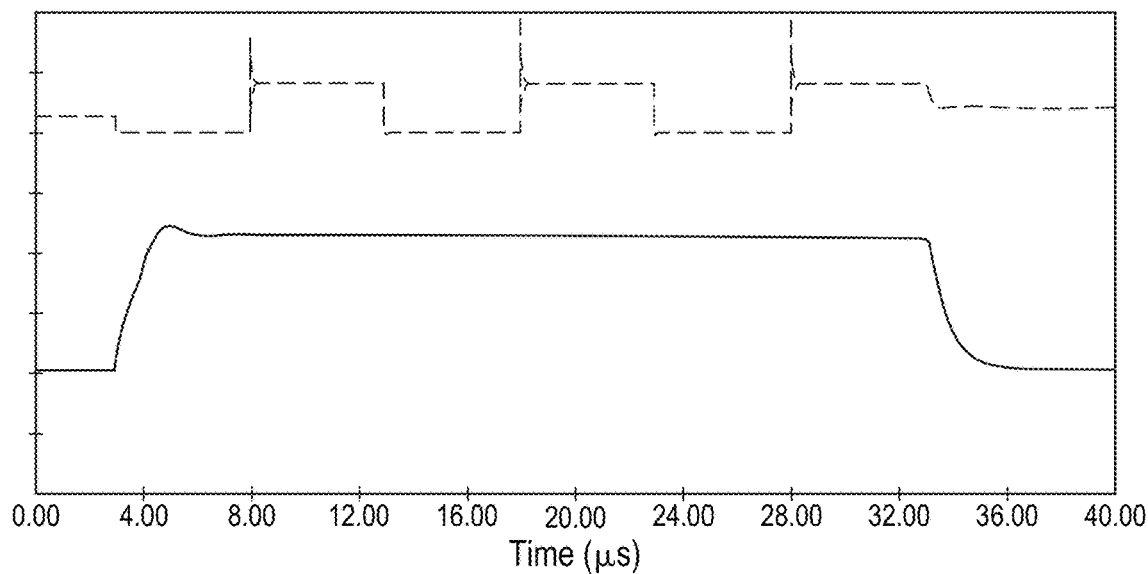
FIG. 24B is an example of an output waveform produced from the pulse generator shown in FIG. 24A compared with the input waveform.

FIG. 24B is an example of an output waveform produced from the pulse generator shown in FIG. 24A compared with the input waveform. A 200 V input square wave (dashed) was provided via $V_{CH}$. As shown, the output waveform (solid) has a sharp rise time and maintains a clean flat top with very little ripple.

Figure 24C:
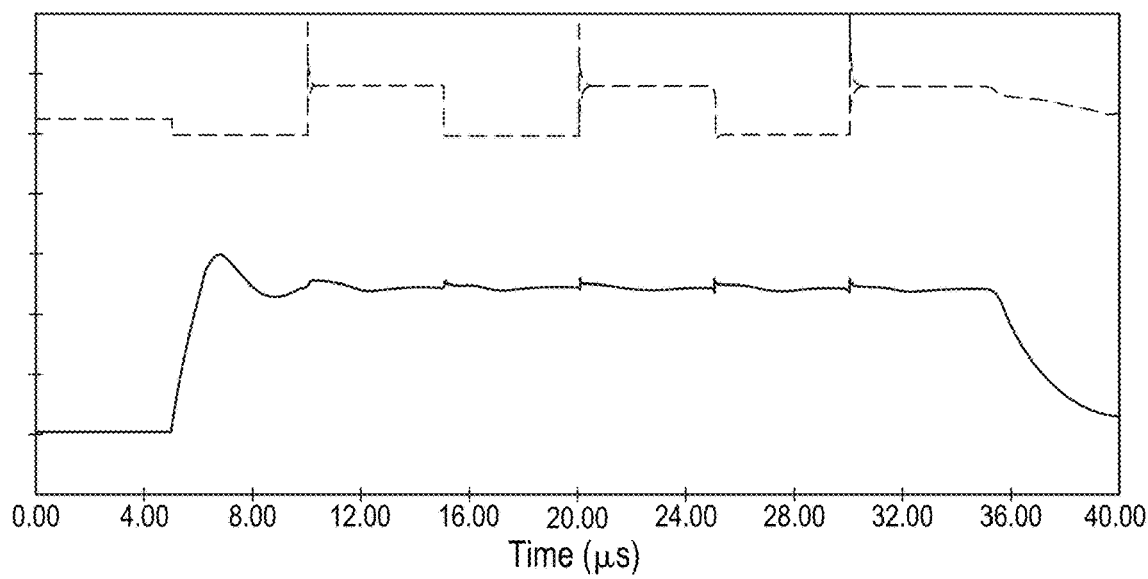
FIG. 24C is an example of an output waveform produced from the pulse generator shown in FIG. 24A compared with the input waveform.

FIG. 24C is an example of an output waveform produced from the pulse generator shown in FIG. 24A compared with the input waveform with the load resistor, $R_L$, replaced with a 1 kOhm resistor. In this example, the output waveform is substantially similar yet with the waveform in FIG. 24B but with a higher overshoot and with more ringing.

Figure 25A:
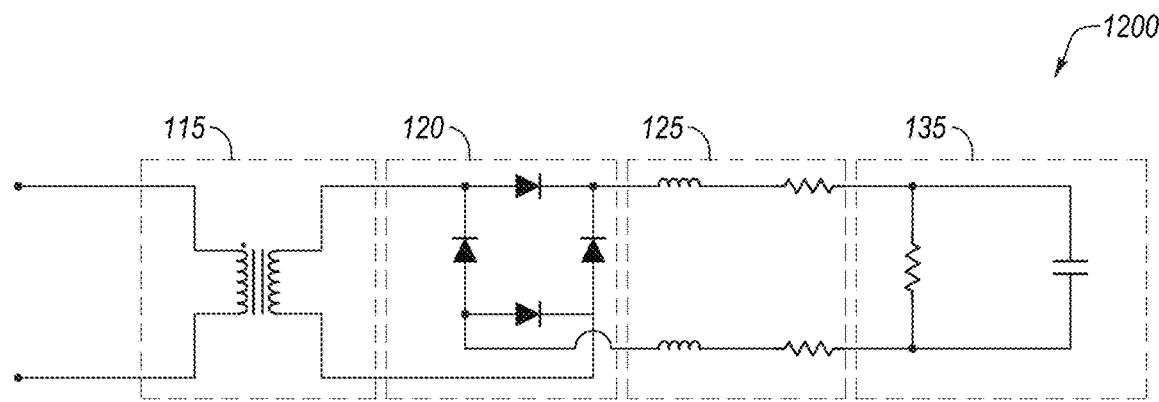
FIG. 25A is an example circuit diagram 1200 of a portion pulse generator according to some embodiments described in this document.

FIG. 25A is an example circuit diagram 1200 of a portion of a pulse generator according to some embodiments described in this document. The circuit diagram 1200 shows a transformer stage 115 that includes a 1:5.5 transformer. The circuit diagram 1200 also shows a rectifier stage 120, a filter stage 125, and an output stage 135. The filter stage 125 in this example includes circuit elements that include a single 125 µH inductor and a single 10 ohm resistor. While this example shows specific circuit elements with specific values, various other elements may be included. The output stage 135 includes a 250 Ohm load with 2 nF capacitance.

Figure 25B:
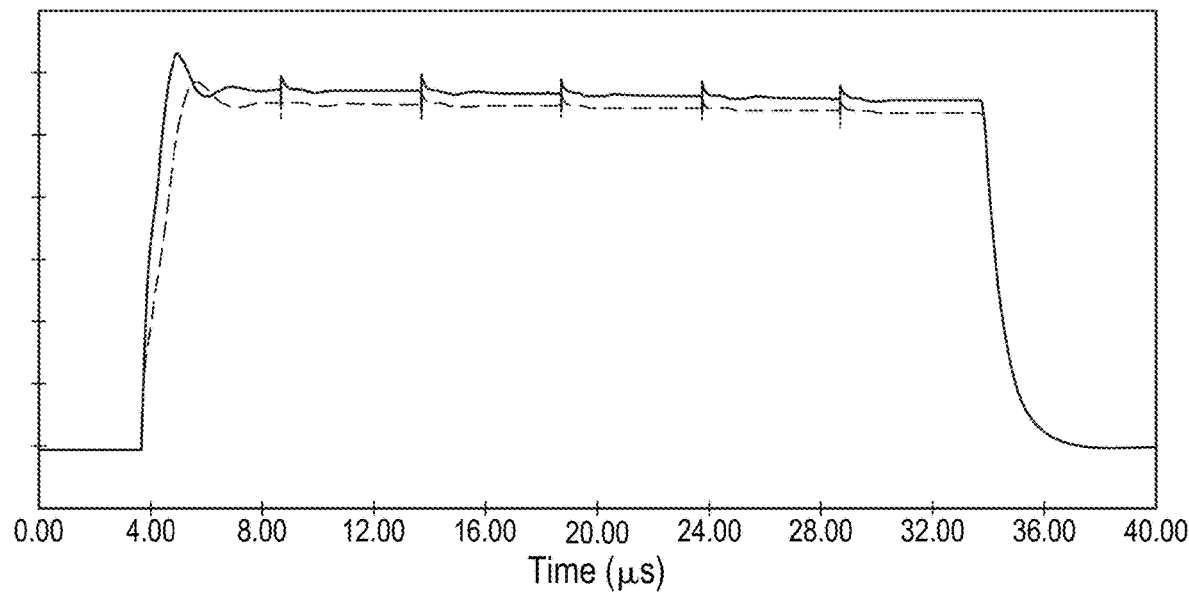
FIG. 25B is an example of an output waveform produced from the pulse generator shown in FIG. 25A compared with the output waveform produced from the pulse generator shown in FIG. 24A.

FIG. 25B is an example of an output waveform produced from the pulse generator shown in FIG. 25A compared with the output waveform produced from the pulse generator shown in FIG. 24A. The removal of one inductor and one resistor can provide for a faster rise time and/or a higher output voltage.

Some embodiments include a pulse generator that produces a square wave with one or more of the following waveform specifications: a frequency range of 0.1 Hz to 10 MHz, a pulse width range of 10 ns to 10 s, a rise time (and/or a fall time) of 1 ns to 100 µs, a duty cycle between 0 and 100%, a flat top ripple range between 0 and 200%, and an output voltage of more than 1 kV, 2 kV, 5 kV, 10 kV, 30 kV, 100 kV, 300 kV, 1,000 kV.

Embodiments described within this document may include a pulse generator that produces an arbitrary and/or variable waveform with one or more of the following waveform specifications: a frequency range of 0.1 Hz to 10 MHz, a pulse width range of 10 ns to 10 s, a rise time and/or a fall time of 1 ns to 100 µs, a duty cycle between 0 and 100%, a dI/dt between 10 A/s to 1,000 kA/µs and an output voltage of more than 1 kV, 2 kV, 5 kV, 10 kV, 30 kV, 100 kV, 300 kV, 1,000 kV.

Embodiments described within this document may include a pulse generator that produces both high frequency pulses (e.g., pulses with a frequency greater than 10 kHz) and low frequency pulses (e.g., pulses with a frequency less than 1 Hz or a DC pulse). Such a pulse generator may also output voltages above 2 kV.

Embodiments described within this document may include a pulse generator that produces a high voltage DC pulse with a rise time of less than 10 µs (or a rise time less than 1 µs), an output voltage greater than 1 kV, and/or a ripple between 2% and 50%.

Figure 26A:
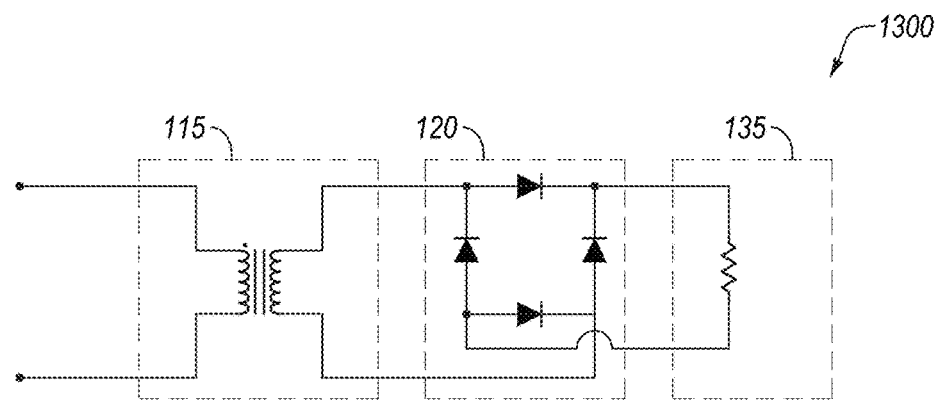
FIG. 26A is an example circuit diagram of a portion of a pulse generator according to some embodiments described in this document.

FIG. 26A is an example circuit diagram 1300 of a portion of a pulse generator according to some embodiments described in this document. The circuit diagram 1300 shows a transformer stage 115 that includes a 1:5.5 transformer. The circuit diagram 1300 also shows a rectifier stage 120 and an output stage 135, but no filter stage 125. The output stage 135 includes a 250 Ohm load.

Figure 26B:
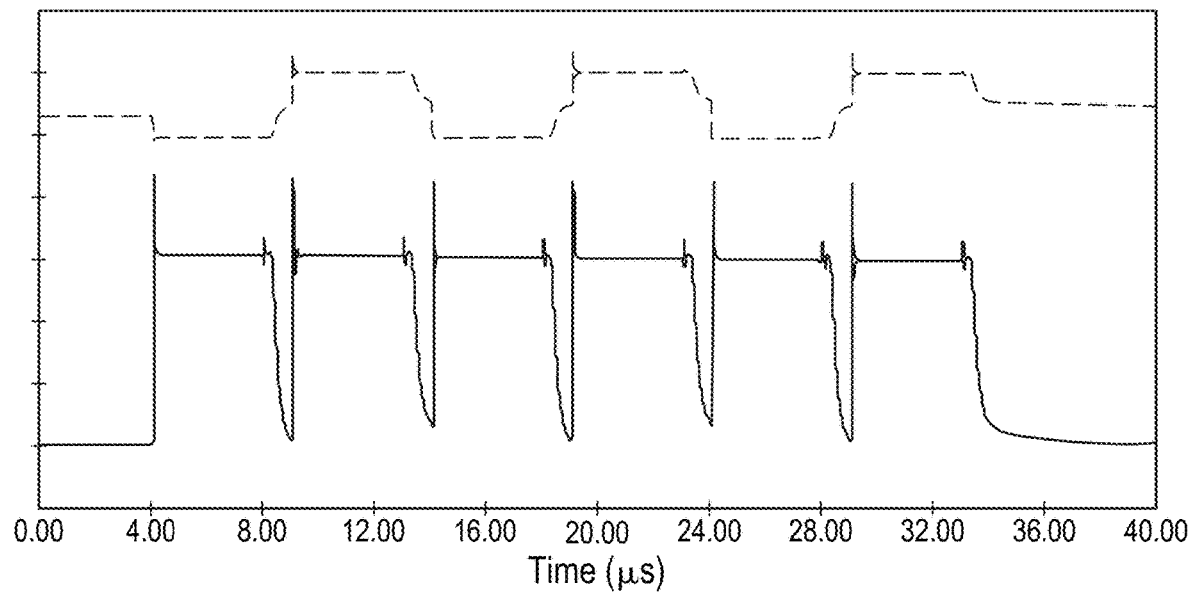
FIG. 26B is an example of an output waveform produced from the pulse generator shown in FIG. 26A.

FIG. 26B is an example of an output waveform compared with the input waveform. A 50 V input square wave (dashed) was provided via $V_{CH}$. As shown, the output waveform (solid) has a very sharp rise time (e.g., about 50 ns) and has a high duty cycle (e.g., about 70%). Various other duty cycles may be used such as, for example, duty cycles of any percentage between 0% and 100%. In some embodiments, the duty cycle may change over time.

Figure 27A:
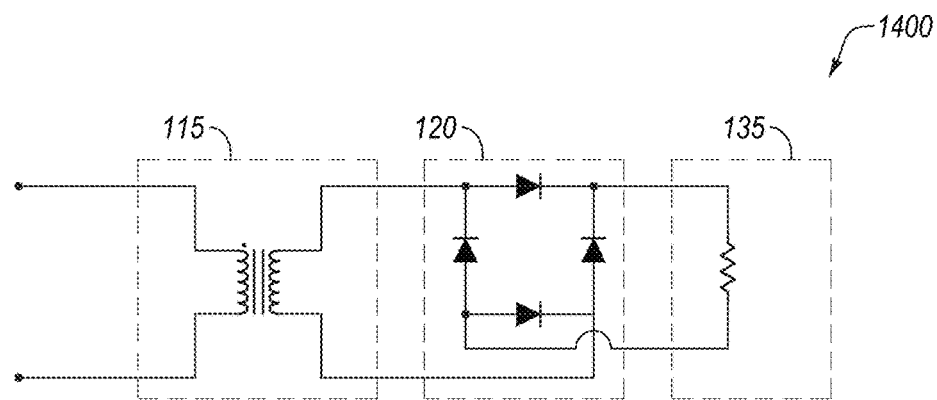
FIG. 27A is an example circuit diagram of a portion of a pulse generator according to some embodiments described in this document.

FIG. 27A is an example circuit diagram 1400 of a portion of a pulse generator according to some embodiments described in this document. The circuit diagram 1400 shows a transformer stage 115 that includes a 1:5.5 transformer. The circuit diagram 1400 also shows a rectifier stage 120 and an output stage 145, but no filter stage 125. The output stage 145 includes a 250 Ohm load.

Figure 27B:
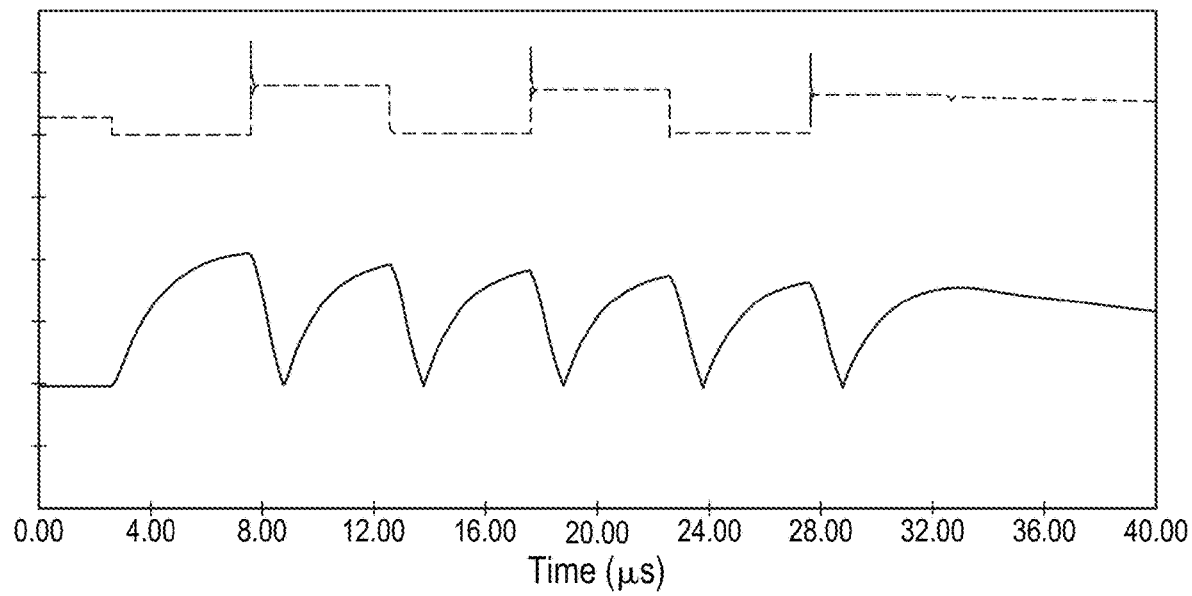
FIG. 27B is an example of an output waveform produced from the pulse generator shown in FIG. 27A.

FIG. 27B is an example of an output triangular wave waveform compared with the square wave input waveform. A 200 V input square wave (dashed) was provided via $V_{CH}$. As shown, the triangular wave output waveform (solid) has a gradual rise time (e.g., about 4 µs) and a gradual fall time, which creates the triangular wave shape. The output waveform has an amplitude of 1,000 volts.

In some embodiments, a pulse generator may produce a plurality of pulses at high frequency (e.g., greater than 2 kHz) and high voltage (e.g., greater than 2 kV) for a period of time, pause for a period of time, and then begin pulsing at another frequency or the same frequency and high voltage for another period of time. The pulse generator may repeat this process over and over again. In some embodiments, the frequency and/or voltage of each set of pulses may vary.

In some embodiments, the various pulse generators described in this document may generate high voltage pulses (greater than 2 kV), with fast rise times (e.g., less than 100 ns) as well as with long and/or variable pulse widths and/or variable duty cycles. Pulse generators often cannot generate pulses that are a combination of fast features (e.g., fast rise times) and slow features (e.g., long pulses). Some embodiments described in this document can combine fast features with slow features.

Figure 28:
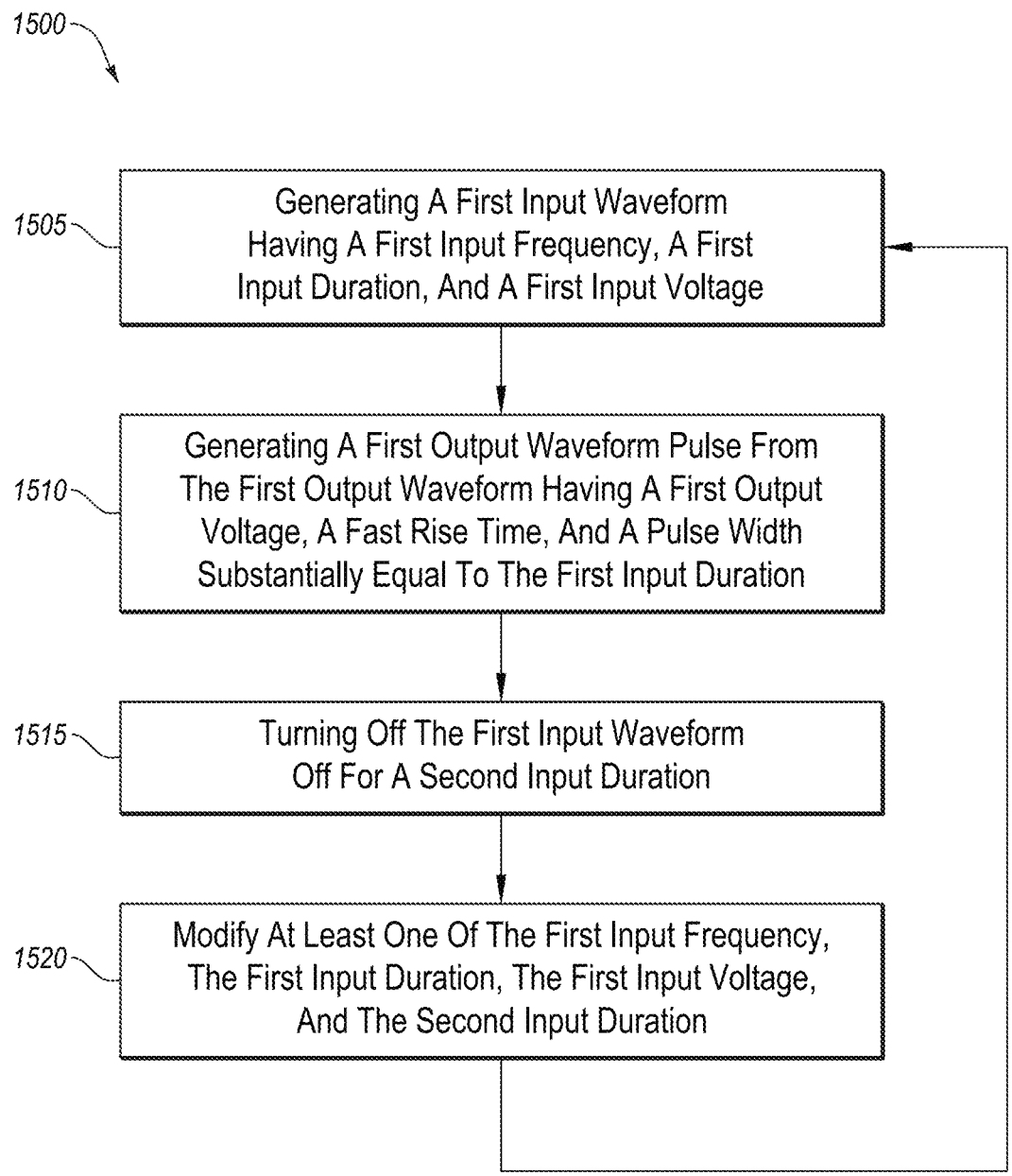
FIG. 28 is a flowchart of a process for producing an arbitrary pulse width output signal according to some embodiments described in this document.

FIG. 28 is a flowchart of a process 1500 for producing an arbitrary pulse width output signal according to some embodiments described in this document. Process 1500 begins at block 1505 where a first input waveform is generated that has a first input frequency, a first input duration, and a first input voltage. In some embodiments, the first input waveform may be generated from the driver stage 105. For example, the first input waveform may have a voltage of 200 volts to 2,000 volts and/or has a frequency greater than 10 kHz. The first duration may include any period of time. In some embodiments, the first duration may be longer than two periods of the first input frequency. In some embodiments, the first duration may be between 10 us and 10 seconds.

At block 1510 a first output waveform is generated from the first output waveform having at least one of a first output voltage, a fast rise time, and/or a pulse width substantially equal to the first input duration. In some embodiments, the first output voltage may be directly proportional with the first input voltage. In some embodiments, the first output voltage may be greater than 2 kV. In some embodiments, the fast rise time may include a rise time less than about 5 μs or less than about 100 ns. Various other fast rise times and/or output voltages may be used.

At block 1515 the first input waveform may be turned off for a second input duration. The first input waveform may be considered turned off when the waveform produces zero volts or a voltage at a DC bias voltage level. The second input duration, for example, may include any period of time. For example, the second input duration may be longer than the rise time and/or the first input duration. As another example, the second input duration may be less than one period of the first input frequency. The second input duration may include any period of time.

At block 1520, at least one of the first input frequency, the first input duration, the first input voltage, and the second input duration may be modified so a subsequent pulse may have a different output voltage, a different output duration, and/or a different period of time when the pulse produces zero volts or a voltage at a DC bias level.

After block 1520, the process 1500 may be repeated any number of times without limitation. In some embodiments, during at least one cycle of process 1500 none of the first input duration, the first input voltage, and the second input duration may be modified in block 1520.

The fast switching found in the driver stage 105 and the low inductance in various stages of a pulse generator may allow for fast rise times and/or variable pulse widths. Embodiments described within this document may also produce, for example, high voltage pulses with variable duty cycle and/or variable frequency.

In some embodiments, more than one pulse generator may be combined in any combination such as, for example, in serial and/or in parallel. In some embodiments, two pulse generators may be used with opposite polarities and configured substantially identically to create a square wave.

The term "substantially" and/or "about" means within 10% or 20% of the value referred to or within manufacturing tolerances.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A method of processing of a substrate, comprising:
generating a plasma within a plasma chamber; and
biasing the plasma with a bias generator that is electrically coupled to the plasma chamber, the bias generator establishes a pulsed voltage waveform, and the pulsed voltage waveform comprises a series of repeating cycles, wherein a waveform within each cycle of the series of repeating cycles has a first portion that occurs during a first time interval and a second portion that occurs during a second time interval, wherein a voltage pulse is only present during the first time interval,
wherein the bias generator comprises:
a pulse generator that is electrically coupled to the plasma chamber; and
a current-return output stage, wherein a first end of the current-return output stage is electrically coupled with the plasma chamber and the pulse generator, and a second end of the current-return output stage is electrically coupled to the ground, wherein a current flows from the plasma chamber to ground through the current-return output stage during at least a portion of the second time interval.

2. The method of claim 1, wherein the first portion of the waveform further comprises a positive voltage pulse resulting in restoration of a sheath voltage drop, wherein a sheath is formed over a plasma facing surface of the substrate at the end of the first time interval.

3. The method of claim 1, wherein the first time interval has a time duration of between about 200 ns and about 400 ns.

4. The method of claim 1, wherein the cycle of the series of repeating cycles has a time duration of between about 2 microseconds and about 3 microseconds.

5. The method of claim 1, wherein the voltage pulse is between about 0.1 kilovolts and about 10 kilovolts.

6. The method of claim 1, further comprising: applying a DC voltage to the plasma chamber using a chucking power supply that is electrically coupled to the bias generator.

7. A processing chamber, comprising:
a plasma chamber; and
a bias generator that is electrically coupled to the plasma chamber, wherein the bias generator comprises:
a pulse generator; and
a current-return output stage, wherein a first end of the current-return output stage is electrically coupled to the pulse generator and the plasma chamber.

8. The processing chamber of claim 7, further comprising: an inductively coupled plasma source or a capacitively coupled plasma source that is configured to generate a plasma within the plasma chamber.

9. The processing chamber of claim 7, further comprising: a DC bias power supply that is electrically coupled to the plasma chamber.

10. A processing chamber, comprising:
a substrate support assembly comprising a biasing electrode that is separated from a substrate supporting surface of the substrate support assembly by a layer of a dielectric material; and
a bias generator that is electrically coupled to a generator end of an electrical conductor using a generator coupling assembly, and an electrode end of the electrical conductor is electrically coupled to the biasing electrode using an electrode coupling assembly,
wherein the bias generator comprises:
a pulse generator that is electrically coupled to the generator end of the electrical conductor; and
a current-return output stage, wherein a first end of the current-return output stage is electrically coupled to the electrical conductor, and a second end of the current-return output stage is electrically coupled to the ground.

11. The processing chamber of claim 10, wherein the positive voltage pulse results in restoration of a sheath voltage drop formed over a plasma facing surface of the substrate at the end of the first time interval, and a current flows from the biasing electrode to ground through the current-return output stage during at least a portion of the second time interval.

12. The processing chamber of claim 10, wherein first time interval has a duration of between about 200 ns and about 400 ns.

13. The processing chamber of claim 10, wherein the first time interval is less than about 20% of a time duration of a cycle of the series of repeating cycles.

14. The processing chamber of claim 10, wherein the cycle of the series of repeating cycles has a period that has a duration of between about 2 μs and about 3 μs.

15. The processing chamber of claim 10, wherein a first end of the pulse generator is electrically coupled to the generator end of the electrical conductor, and a second end of the pulse generator is electrically coupled to ground.

16. The processing chamber of claim 10, wherein the generator coupling assembly comprises one of the components selected from the group consisting of a capacitor, a capacitor and an electrical conductor in series, an inductor, and an inductor and an electrical conductor in series.

17. A processing chamber, comprising:
a pulsed DC biasing system, comprising:
a plasma chamber for producing a plasma for semiconductor processing;
a bias generator electrically coupled with the plasma chamber that establishes a pulsed voltage waveform, the bias generator comprising:
a pulse generator; and
a current-return output stage, wherein a first end of the current-return output stage is electrically coupled with the pulse generator, and a second end of the current-return output stage is electrically coupled to ground; and
a blocking capacitor disposed between the bias generator and the plasma chamber.

18. The processing chamber of claim 17, wherein the plasma chamber includes layer of dielectric material.

19. The processing chamber of claim 17, wherein a high-voltage DC supply is electrically coupled with the plasma chamber at a connection point disposed between the plasma chamber and the blocking capacitor.

20. The processing chamber of claim 17, further comprising a resistor disposed between the high-voltage DC supply and the connection point.

21. The processing chamber of claim 17, further comprising a high-voltage DC supply electrically coupled between ground and the plasma chamber, wherein the high-voltage DC supply applies a voltage to the plasma chamber relative to the ground.

22. A method of processing a substrate, comprising:
generating a plasma within a plasma chamber;
establishing a pulsed voltage waveform at the biasing electrode using a bias generator that is electrically coupled with the plasma chamber through a blocking capacitor and one or more electrical conductors; and
delivering a chucking voltage from a high-voltage power supply to the plasma chamber through one of the one or more electrical conductors, wherein the blocking capacitor is disposed between the high-voltage module and the bias generator.

23. The method of claim 22, wherein the pulsed voltage waveform comprises a series of repeating cycles, a waveform within each cycle of the series of repeating cycles has a first portion that occurs during a first time interval and a second portion that occurs during a second time interval, and a positive voltage pulse is only present during the first time interval.

24. The method of claim 22, wherein the bias generator comprises: a current-return output stage, wherein a first end of the current-return output stage is electrically coupled with the pulse generator and the plasma chamber.

25. The method of claim 22, wherein a current flows from the biasing electrode to ground through the current-return output stage during at least a portion of the second time interval.

26. The method of claim 22, wherein the high-voltage power supply is electrically coupled between ground and the pulse generator or, and the chucking voltage is applied to the first electrical conductor relative to the ground.

* * * * *